(12) United States Patent
Sakaguchi et al.

(10) Patent No.: US 6,254,794 B1
(45) Date of Patent: *Jul. 3, 2001

(54) ETCHING SOLUTION FOR ETCHING POROUS SILICON, ETCHING METHOD USING THE ETCHING SOLUTION AND METHOD OF PREPARING SEMICONDUCTOR MEMBER USING THE ETCHING SOLUTION

(75) Inventors: Kiyofumi Sakaguchi; Takao Yonehara; Nobuhiko Sato, all of Atsugi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/298,054

(22) Filed: Apr. 22, 1999

Related U.S. Application Data

(62) Division of application No. 08/472,270, filed on Jun. 7, 1995, which is a division of application No. 07/835,381, filed on Feb. 14, 1992, now Pat. No. 5,767,020.

(30) Foreign Application Priority Data

| Feb. 15, 1991 | (JP) | 3-042212 |
| Feb. 15, 1991 | (JP) | 3-042213 |
| Feb. 28, 1991 | (JP) | 3-055601 |
| Feb. 28, 1991 | (JP) | 3-055602 |
| Feb. 28, 1991 | (JP) | 3-055603 |
| Feb. 28, 1991 | (JP) | 3-055604 |
| Feb. 28, 1991 | (JP) | 3-055605 |
| Feb. 28, 1991 | (JP) | 3-055606 |
| Feb. 28, 1991 | (JP) | 3-055607 |
| Feb. 28, 1991 | (JP) | 3-055608 |
| Feb. 28, 1991 | (JP) | 3-055609 |
| Feb. 28, 1991 | (JP) | 3-055610 |
| Feb. 28, 1991 | (JP) | 3-055611 |
| Feb. 28, 1991 | (JP) | 3-055612 |
| Feb. 28, 1991 | (JP) | 3-055613 |
| Feb. 28, 1991 | (JP) | 3-055614 |
| Mar. 27, 1991 | (JP) | 3-085755 |
| May 24, 1991 | (JP) | 3-148160 |
| May 24, 1991 | (JP) | 3-148161 |
| May 24, 1991 | (JP) | 3-148163 |
| May 24, 1991 | (JP) | 3-148164 |
| May 27, 1991 | (JP) | 3-149297 |
| May 27, 1991 | (JP) | 3-149298 |
| May 27, 1991 | (JP) | 3-149299 |
| May 27, 1991 | (JP) | 3-149300 |
| May 27, 1991 | (JP) | 3-149301 |
| May 27, 1991 | (JP) | 3-149302 |
| May 27, 1991 | (JP) | 3-149306 |
| May 27, 1991 | (JP) | 3-149307 |
| May 27, 1991 | (JP) | 3-149308 |
| May 27, 1991 | (JP) | 3-149309 |
| May 27, 1991 | (JP) | 3-149310 |
| May 27, 1991 | (JP) | 3-149311 |
| May 28, 1991 | (JP) | 3-150980 |
| May 28, 1991 | (JP) | 3-150981 |
| May 28, 1991 | (JP) | 3-150982 |
| May 28, 1991 | (JP) | 3-150983 |
| May 28, 1991 | (JP) | 3-150984 |
| May 28, 1991 | (JP) | 3-150985 |
| May 28, 1991 | (JP) | 3-150989 |
| May 28, 1991 | (JP) | 3-150990 |
| May 28, 1991 | (JP) | 3-150991 |
| May 28, 1991 | (JP) | 3-150992 |
| May 28, 1991 | (JP) | 3-150993 |
| May 28, 1991 | (JP) | 3-150994 |
| May 29, 1991 | (JP) | 3-152248 |
| May 29, 1991 | (JP) | 3-152249 |
| May 29, 1991 | (JP) | 3-152250 |
| May 29, 1991 | (JP) | 3-152251 |

(51) Int. Cl.$^7$ ................................................ H01L 21/302
(52) U.S. Cl. ................... 216/56; 216/20; 216/36; 216/87; 216/95; 216/99
(58) Field of Search ............................ 216/56, 20, 24, 216/33, 36, 87, 95, 99

(56) References Cited

U.S. PATENT DOCUMENTS

| 3,962,052 | 6/1976 | Abbas ..................... 204/129.3 |
| 4,171,242 | 10/1979 | Liu . |
| 5,070,034 | 12/1991 | Satoh et al. . |
| 5,258,322 | 11/1993 | Sakaguchi . |
| 5,277,748 | * 1/1994 | Sakaguchi et al. ............ 156/630 |

| | | |
|---|---|---|
| 5,348,618 | 9/1994 | Canham et al. . |
| 5,358,600 | 10/1994 | Canham et al. . |
| 5,371,037 | 12/1994 | Yonehara . |
| 5,433,168 | 7/1995 | Yonehara . |
| 5,767,020 * | 6/1998 | Sakaguchi et al. .................. 438/705 |
| 5,868,947 * | 2/1999 | Sakaguchi et al. ...................... 216/2 |

FOREIGN PATENT DOCUMENTS

| | | |
|---|---|---|
| 2-09173 | 1/1987 | (EP) . |
| 4-69630 | 2/1992 | (EP) . |
| 2 374 396 | 7/1978 | (FR) . |
| 50-148081 | 11/1975 | (JP) . |
| 53-76139 | 7/1978 | (JP) . |
| 56-039052 | 9/1981 | (JP) . |
| WO 91/09420 | 9/1981 | (JP) . |
| 2-206548 | 8/1990 | (JP) . |
| 9-120197 | 11/1991 | (JP) . |
| 51-06065 | 4/1993 | (JP) . |
| 5-502978 | 5/1993 | (JP) . |
| WOA9109420 | 6/1991 | (WO) . |

OTHER PUBLICATIONS

European Search Report, Appl. No. EP 92 30 1252.

Japanese Official Action, Appl. No. JP 4–059118.

Chem. Prum., vol. 27, No. 12, 1977, pp. 602–606, Sebek Svatopluk, "Chemical Etching of the Surface of Silicon Single Crystals", & Chemical Abstracts, vol. 88, No. 20, May 15, 1978, p. 595.

Patent Abstracts of Japan, vol. 14, No. 580 (E–1017), Dec. 25, 1992, & JP–A–02 252 265 (SONY), Oct. 11, 1990.

"Characterization of Porous Silicone by NRA, RBS, and Channeling", Ortega et al.; Nucl. Instrum, Methods Phys. Res., Sect. B, B45 (1–4), 1990; abstract only.

"Fundamental Selective Etching Characteristics For Gallium Arsenide"; Takebe et al.; J. Electroheim Soc., 140 (4); abstract only; 1993.

R.P. Holmstrom et al., "Complete Dielectric Isolation By Highly Selective And Self–Stopping Formation Of Oxidized Porous Silicon," Applied Physics Letters, vol. 42, No. 4, Feb. 15, 1983, pp. 386–388.

Journal of the Electrochemical Society, vol. 135, No. 8, Aug. 1988, pp. 2105–2107, "Fabrication of Silicon Microstructures Based on Selective Formation and Etching of Porous Silicon."

Extended Abstracts of the 20th (1988 International ) Conference in Solid–State Devices and Materials 1988, pp. 33–36, A. Nakagawa et al., "500V Lateral Double Gate Bipolar–Mode Mosfet (DGIGBT) Dielectrically Isolated by Silicon Wafer Direct–Bonding (DISDB)."

G. Bomchil et al., "Pore Size Distribution in Porous Silicon Studied by Adsorption Isotherms," Journal of the Electromical Society, vol. 130, No. 7, Jul. 1983, pp. 1611–1614.

K. Imai et al., "Crystalline Quality of Silicon Layer Formed by FIPOS Technology," Journal of Crystal Growth, vol. 63, No. 3, pp. 547–553.

A. Uhlir, Jr., Electrolytic Shaping of Germanium and Silicon, The Bell System Technical Journal, vol. XXXV, Mar. 1956, pp. 333–347.

Applied Physics Letters, vol. 57, No. 10, Sep. 1990, pp. 1046–1048, L.T. Canham, "Silicon Quantum Wire Array Fabrication By Electrochemical and Chemical Dissolution of Wafers."

IBM Technical Disclosure Bulletin, vol. 14, No. 11, Apr. 11, 1972, G.H. Schwuttke et al., "Etching of Vertical Walled Patterns in (100) Silicon."

Journal of the Electrochemical Society, vol. 114, No. 4, Apr. 1967, p. 114, S.M. Hu et al., "Observation of Etching of N–Type Silicon in Aqueous HF Solutions."

Journal of the Electrochemical Society, vol. 131, No. 3, Mar. 1984, pp. 672–674, L. Liou et al., "Amorphous Silicon Produced by Ion Implantation. Etching Rate in HF Solutions and Effect of Annealing."

* cited by examiner

*Primary Examiner*—Gregory Mills
*Assistant Examiner*—George Goudreau
(74) *Attorney, Agent, or Firm*—Fitzpatrick, Cella, Harper & Scinto

(57) ABSTRACT

A method for preparing a semiconductor member comprises:
  forming a substrate having a non-porous silicon monocrystalline layer and a porous silicon layer;
  bonding another substrate having a surface made of an insulating material to the surface of the monocrystalline layer; and
  etching to remove the porous silicon layer by immersing in an etching solution.

25 Claims, 19 Drawing Sheets

ETCHING SOLUTION FOR ETCHING POROUS SILICON, ETCHING METHOD USING THE ETCHING SOLUTION AND METHOD OF PREPARING SEMICONDUCTOR MEMBER USING THE ETCHING SOLUTION

This application is a division of application Ser. No. 08/472,270, filed Jun. 7, 1995, now pending, which in turn is a division of application Ser. No. 07/835,381, filed Feb. 14, 1992, now U.S. Pat. No. 5,767,020.

BACKGROUND OF THE INVENTION

1. Field of the Invention

This invention relates to an etching solution for porous silicon, an etching method using the etching solution and a method of producing a semiconductor member using the etching solution. Particularly, this invention relates to a method of producing a semiconductor member which is suitable for separation of dielectric materials or electronic devices, integrated circuits prepared on a monocrystalline semiconductor layer on an insulating material.

2. Related Background Art

Formation of a monocrystalline Si semiconductor layer on an insulating material has been widely known as the silicon on insulator (SOI) technology, and since a large number of advantages which cannot be reached by bulk Si substrates for preparation of conventional Si integrated circuits are possessed by the device utilizing the SOI structure, so many researches have been done. More specifically, by utilizing the SOI structure, the following advantages can be obtained:

1. Dielectric isolation can be easily done to enable high degree of integration;
2. Radiation hardness is excellent;
3. Stray capacity is reduced to attain high speed;
4. Well formation step can be omitted;
5. Latch-up can be prevented;
6. Fully depleted field effect transistor can be made by thin film formation.

In order to realize the many advantages in device characteristics as mentioned above, studies have been made about the method for forming the SOI structure for these some 10 years. The contents are summarized in, for example, the literature as mentioned below:

Special Issue: "Single-crystal silicon on non-single-crystal insulators"; edited by G. W. Cullen, Journal of Crystal Growth, Volume 63, No. 3, pp. 429–590 (1983).

Also, it has been known for a long time to form the SOS (silicon on sapphire) structure by heteroepitaxy of Si on a monocrystalline sapphire substrate by CVD (chemical vapor deposition) method. This was successful to some extent as the most mature SOI technique, but for such reasons as a large amount of crystal defects because of lattice mismatching at the interface between the Si layer and the sapphire substrate, introduction of aluminum from the sapphire substrate into the Si layer, and above all the high cost of the substrate and delay in enlargement of the substrate wafer size, it is obstructed from being widely applied. In recent years, attempts to realize the SOI structure without use of a sapphire substrate have been done. Such attempts may be broadly classified into the two shown below:

(1) After surface oxidation of an Si monocrystalline substrate, a window is formed to have the Si substrate partially exposed, and epitaxial growth is proceeded in the lateral direction with that exposed portion as the seed to form an Si monocrystalline layer on $SiO_2$. (In this case, deposition of Si layer on $SiO_2$ is accompanied).

(2) By use of an Si monocrystalline substrate itself as an active layer, $SiO_2$ is formed therebeneath. (This method is accompanied with no deposition of Si layer).

As the means for realizing the above (1), there have been known the method in which a monocrystalline Si layer is formed directly to lateral epitaxial growth by CVD, the method in which amorphous Si is deposited and subjected to solid phase lateral epitaxial growth by heat treatment, the method in which an amorphous or polycrystalline Si layer is irradiated convergently with an energy beam such as electron beam, laser beam, etc. and a monocrystalline layer is grown on $SiO_2$ by melting and recrystallization, and the method in which a melting region is scanned in a zone fashion by a rod-shaped heater (Zone melting recrystallization). These methods have both advantages and disadvantages, they still have many problems with respect to controllability, productivity, uniformity and quality, and none of them have been industrially applied to date. For example, the CVD method requires sacrifice-oxidation in flat thin film formation, while the crystallinity is poor in the solid phase growth method. On the other hand, in the beam annealing method, problems are involved in controllability such as treatment time by converged beam scanning, the manner of overlapping of beams, focus adjustment, etc. Among these, the Zone Melting Recrystallization method is the most mature, and a relatively larger scale integrated circuit has been trially made, but still a large number of crystal defects such as point defects, line defects, plane defects (sub-boundary), etc. remain, and no device driven by minority carriers has been prepared.

Concerning the method using no Si substrate as the seed for epitaxial growth which is the above method (2), for example, the following methods may be included.

1. An oxide film is formed on an Si monocrystalline substrate with V-grooves as anisotropically etched on the surface, a polycrystalline Si layer is deposited on the oxide film thick to the extent as the Si substrate, and thereafter by polishing from the back surface of the Si substrate, Si monocrystalline regions dielectrically separated by surrounding with the V-grooves on the thick polycrystalline Si layer are formed. In this method, although crystallinity is good, there are problems with respect to controllability and productivity in the step of depositing the polycrystalline Si thick as some hundred microns and the step in which the monocrystalline Si substrate is polished from the back surface to leave only the Si active layer as separated.

2. This is the method called SIMOX (Separation by ion-implanted oxygen) in which an $SiO_2$ layer is formed by ion implantation of oxygen into an Si monocrystalline substrate, which is one of the most mature methods because of good matching with the Si-IC (Integrated Circuit) process. However, for formation of the $SiO_2$ layer, $10^{18}$ ions/$cm^2$ or more of oxygen ions are required to be implanted, and the implantation time is very long to be not high in productivity, and also the wafer cost is high. Further, many crystal defects remain, and from an industrial point of view, no sufficient level of quality capable of preparing a device driven by minority carriers have been attained.

3. This is the method to form an SOI structure by dielectric isolation according to oxidation of porous Si. This is a method in which an N-type Si layer is formed on the surface of a P-type Si monocrystalline substrate in shape of islands by way of proton ion implantation (Imai et al., J. Crystal Growth, Vol. 63, 547 (1983)), or by epitaxial growth and patterning; only the P-type Si substrate is made porous by anodization in HF solution so as to surround the Si islands from the surface; and then the N-type Si islands are dielectrically isolated by accelerated oxidation. In this method, the separated Si region is determined before the device steps, whereby there is the problem that the degree of freedom in drive and circuit design may be limited in some cases.

A light-transmissive substrate is important for forming a contact sensor serving as a light-receiving device and a projection-type liquid crystal image display. A high-quality driving device is required for further increasing the density, resolution and definition of the pixels (picture element) of such a sensor or display. It is consequently necessary to produce a device to be provided on a light-transmissive substrate by using a monocrystalline layer having excellent crystallinity.

However, if an Si layer is deposited on a light-transmissive substrate such as glass substrate, etc., the Si layer is generally an amorphous layer or, at best, a polycrystalline layer because the Si layer reflects the disorder of the crystal structure of the substrate, and no high-quality device can thus be formed by using the Si layer. This is because the substrate has an amorphous crystal structure, and thus a monocrystalline layer of high quality cannot be easily obtained by simply depositing the Si layer. It is therefore difficult to produce a driving device having properties sufficient for the present demands or future demands because the crystal structure of an amorphous Si or polycrystalline Si has many defects.

Further, any one of the methods using an Si monocrystalline substrate is unsuitable for obtaining a good monocrystalline film on a light-transmissive substrate.

Takao Yonehara, one of the inventors, previously proposed a method of forming a semiconductor substrate which is capable of solving the above problems in Japanese Patent Application No. 2-206548.

The method of forming a semiconductor substrate disclosed in Patent Application No. 2-206548 comprises forming a substrate having a non-porous semiconductor monocrystalline layer and a porous semiconductor layer, bonding another substrate having an insulating material surface to the surface of the monocrystalline layer, and removing the porous semiconductor layer by etching.

This invention has been achieved for improving the invention disclosed in Patent Application No. 2-206548 previously proposed.

The method of forming a semiconductor substrate disclosed in Patent Application No. 2-206548 comprises the step of removing porous Si by selective etching.

Porous Si is described below.

Porous Si was discovered in the course of research on electrolytic polishing of a semiconductor which was conducted by Uhlir et al, in 1956 (A. Uhlir, Bell Syst. Tech. J., Vol. 35, pp 333 (1956)).

Unagami et al. investigated dissolving reaction of Si during anodization and reported that the anodic reaction of Si in a HF solution requires positive holes, and that the reaction is expressed as follows (T. Unagami, J. Electrochem. Soc., Vol. 127, pp 476 (1980)):

$$Si+2HF+(2-n)e^+ \rightarrow SiF_2+2H^++ne^- \tag{1}$$

$$SiF_2+2HF \rightarrow SiF_4+H_2 \tag{2}$$

$$SiF_4+2HF \rightarrow H_2SiF_6 \tag{3}$$

or $$Si+4HF+(4-\lambda)e^+ \rightarrow SiF_4+4H^++\lambda e^- \tag{4}$$

$$SiF_4+2HF \rightarrow H_2SiF_6 \tag{5}$$

wherein $e^+$ and $e^-$ respectively denote a positive hole and an electron, and n and $\lambda$ each denotes the number Of positive holes required for dissolving one silicon atom. Porous Si can be formed when the condition, n>2 or $\lambda$>4, is satisfied.

It is therefore found that positive holes are required for forming porous Si, and that P-type Si can be more easily made porous than N-type Si. However, it is also known that N-type Si can be made porous if holes are implanted thereto (R. P. Holmstrom and J. Y. Chi, Appl. Phys. Lett., Vol. 42, 386 (1983)).

The density of the porous Si layer can be changed to the range of 1.1 to 0.6 g/cm³ by changing the concentration of the HF solution from 50 to 20%, as compared with the density of 2.33 g/cm³ of monocrystalline Si. The porous Si layer has pores having an average size of about 600 Å which was measured by observation by a transmission electron microscope. Although the porous Si layer has a density which is half or less than that of monocrystalline Si, monocrystallinity is maintained, and a monocrystalline Si layer can be formed on the porous layer by epitaxial growth.

Although the volume of an Si monocrystal is generally increased by 2.2 times by oxidation, the increase in volume can be suppressed by controlling the density of the porous Si so that the occurrence of curvature of a substrate or the occurrence of a crack in a monocrystalline layer remained on the surface can be avoided during the oxidation process. The volume ratio R of monocrystalline Si to porous Si after oxidation can be expressed as follows:

$$R2.2\times(A/2.33) \tag{6}$$

wherein A denotes the density of porous Si. If R=1, i.e., there is no increase in volume after oxidation, A=1.06 (g/cm³). Namely, if the density of the porous Si layer is 1.06, an increase in volume, which is caused by oxidation, can be suppressed.

It can be said that at present, porous Si is subjected as such directly to subsequent steps (epitaxial growth and oxidation) after producting it, and the porous Si itself is not processed. This is because the porous Si cannot be easily processed or removed with good controllability. Namely, it has been not reported yet that porous Si is etched with good controllability.

In addition, P generally shown by the following equation is referred as porosity:

$$P=(2.33-A)/2.33 \tag{7}$$

When the value of porosity is adjusted to 30 to 55% during anodization, the properties of oxidized porous Si can be equalized to those of a monocrystalline Si oxide film. The porosity is expressed as follows:

$$P=(m1-m2)/(m1-m3) \tag{8}$$

or $$P=(m1-m2)/\rho At \tag{9}$$

wherein m1: total weight before anodization m2: total weight after anodization m3: total weight after removal of porous Si ρ: density of monocrystalline Si
A: area of porous region
t: thickness of porous Si However, the area of the porous region cannot be accurately calculated in many cases. In this case, although the equation (8) is effective, the porous Si must be etched for measuring the value of m3.

In addition, during epitaxial growth on the porous Si, the porous Si is capable of relieving distortion produced during heteroepitaxial growth and suppressing the occurrence of defects. However, in this case, since it is clear that the porosity is a very important parameter, measurement of the porosity is necessary and indispensable.

Known methods of etching porous Si are the following methods (1) and (2):

(1) The method of etching porous Si with an aqueous NaOH solution (G. Bonchil, R. Herino, K. Barla, and J. C. Pfister, J. Electrochem. Soc., Vol. 130, No. 7, 1611 (1983)).

(2) The method of etching porous Si with an etching solution which is capable of etching non-porous Si.

In the above method (2), a fluoronitric acid-type etching solution is generally used, and etching of Si proceeds as follows:

$$Si + 2O \rightarrow SiO_2 \tag{10}$$

$$SiO_2 + 4HF \rightarrow SiF_4 + H_2O \tag{11}$$

As shown by the above reaction formulas, Si is oxidized to $SiO_2$, and the $SiO_2$ produced is etched with hydrofluoric acid.

Examples of etching solutions for non-porous Si include the above fluoronitric acid-type etching solution as well as ethylenediamine-type, KOH-type and hydrazine-type etching solutions and the like.

In this invention, it is necessary in selective etching of porous Si to select an etching solution which is capable of etching porous Si, other than the above etching solutions for non-porous Si. The porous Si is generally selectively etched by the above method (1) which uses an aqueous NaOH solution as an etching solution.

As described above, both porous and non-porous Si are etched with the fluoronitric acid-type etching solution.

On the other hand, in the conventional method of selectively etching porous Si with an aqueous NaOH solution, Na ions are inevitably adsorbed on the etched surface. Since the Na ions cause impurity contamination, are movable and have adverse effects such as the formation of a interfacial states, the ions must not be introduced into the semiconductor process.

SUMMARY OF THE INVENTION

An object of this invention is to provide an etching solution which efficiently, uniformly, selectively and chemically etches porous Si without affecting the semiconductor process and etching non-porous Si.

Another object of this invention is to provide a method of preparing a semiconductor member using an etching solution for uniformly and selectively etching porous Si.

DETAILED DESCRIPTION OF THE PREFERRED EMBODIMENTS

Figure 1A:
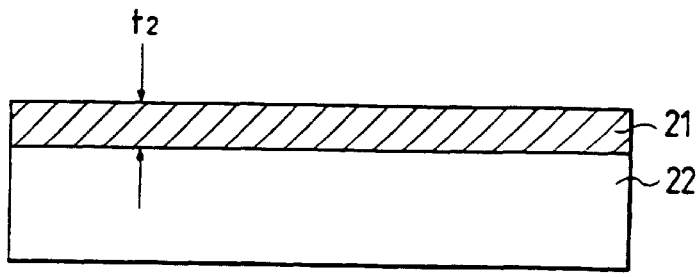
FIGS. 1A and 1B are schematic views explaining an etching step using an etching solution of this invention.

According to one aspect of this invention, this invention provides a chemical etching solution for etching porous silicon.

A first embodiment of the chemical etching solution of this invention is hydrofluoric acid.

A second embodiment of the chemical etching solution is a mixture containing hydrofluoric acid and an alcohol.

A third embodiment of the chemical etching solution is a mixture containing hydrofluoric acid and hydrogen peroxide.

A fourth embodiment of the chemical etching solution is a mixture containing hydrofluoric acid, an alcohol and hydrogen peroxide.

A fifth embodiment of the chemical etching solution is buffered hydrofluoric acid.

A sixth embodiment of the chemical etching solution is a mixture containing buffered hydrofluoric acid and an alcohol.

A seventh embodiment of the chemical etching solution is a mixture containing buffered hydrofluoric acid and hydrogen peroxide.

A eighth embodiment of the chemical etching solution is a mixture of buffered hydrofluoric acid, an alcohol and hydrogen peroxide.

The etching method of this invention comprises selectively etching porous silicon using the etching solution of this invention.

According to another aspect of this invention, this invention provides a method of preparing a semiconductor member.

A first embodiment of the method of preparing a semiconductor member of this invention comprises forming a substrate having a non-porous monocrystalline silicon layer and a porous silicon layer, bonding another substrate having a surface made of insulating material to the surface of the monocrystalline layer, and etching the porous silicon layer by immersing it in hydrofluoric acid.

A second embodiment of the method of preparing a semiconductor member of this invention uses each of the second to eighth forms of the etching solution of this invention in place of hydrofluoric acid used as an etching solution in the first form of the method of preparing a semiconductor member of this invention.

A third embodiment of the method of preparing a semiconductor member of this invention comprises the steps of making a silicon substrate porous, forming a non-porous monocrystalline silicon layer on the silicon substrate made porous, bonding a light-transmissive glass substrate to the surface of the non-porous monocrystalline silicon layer, and selectively etching porous silicon so as to remove porous silicon by chemical etching using an etching solution of this invention by immersing the silicon substrate made porous therein.

A fourth embodiment of the method of preparing a semiconductor member of this invention comprises the steps of making a silicon substrate porous, forming a non-porous monocrystalline silicon layer on the silicon substrate made porous, bonding another silicon substrate having an insulating layer on the surface thereof to the surface of the non-porous monocrystalline silicon layer, and selectively etching porous silicon so as to remove porous silicon by chemical etching using an etching solution of this invention by immersing the silicon substrate made porous therein.

A fifth embodiment of the method of preparing a semiconductor member of this invention comprises the steps of making a silicon substrate porous, forming a non-porous monocrystalline silicon layer on the silicon substrate made porous, forming an oxide layer on the surface of the non-porous monocrystalline silicon layer, bonding a light-transmissive substrate to the surface of the oxide layer and selectively etching the silicon substrate made porous to remove it by chemical etching using an etching solution of this invention by immersing the silicon substrate made porous therein.

A sixth embodiment of the method of preparing a semiconductor member of this invention comprises the steps of making a silicon substrate porous, forming a non-porous monocrystalline silicon layer on the silicon substrate made porous, forming an oxide layer on the surface of the non-porous monocrystalline silicon layer, bonding another silicon substrate having an insulating layer on the surface thereof to the oxide layer formed on the non-porous monocrystalline silicon layer, and selectively etching the silicon substrate made porous to remove it by chemical etching using an etching solution of this invention by immersing the silicon substrate made porous therein.

In each of the above embodiments according to the method of preparing a semiconductor member of the present invention, the etching step may be carried out with coating the surfaces other than the surface of the silicon layer made porous with a protecting material before etching.

The etching solution for porous Si of this invention is capable of uniformly and efficiently etching porous Si without the danger of contaminating the semiconductor process.

The etching method of this invention can be applied to usual semiconductor processes and is capable of selectively etching, with high accuracy, the porous Si provided on the same substrate provided non-porous Si to remove the porous Si because a chemical etching solution which does not etch non-porous Si is used.

The method of preparing a semiconductor member of this invention is excellent in productivity, uniformity, controllability and economy for forming a crystalline Si layer having excellent crystallinity equal to that of a monocrystalline wafer on insulating substrates such as light-transmissive insulating substrates represented by a glass substrate.

The method of preparing a semiconductor member of this invention is capable of realizing the advantages of conventional SOI devices and can be applied to various fields.

The method of preparing a semiconductor member of this invention can also be used in place of the expensive SOS or SIMOX used for producing a large-scale integrated circuit having the SOI structure.

In addition, the method of preparing a semiconductor member of this invention comprises the steps of chemically removing the lower portion of a monocrystalline Si substrate of high quality used as a starting material, with leaving only a monocrystalline layer on the surface thereof, and bonding the substrate to an insulating layer, and thus enables many treatments to be performed for a short time and has excellent productivity and economy.

Further, the method of preparing a semiconductor member of this invention can use a chemical etching solution which has a bad effect on the semiconductor process in etching of porous Si and exhibits an etching selection ratio of a five digits value or more of porous Si to non-porous Si and excellent controllability and productivity.

I. A description will now be given of the etching solution in accordance with the present invention.

I-(1) A description will be made first as to the case where hydrofluoric acid is used as the electroless wet chemical etching solution for porous Si, with specific reference to FIG. 7A.

Figure 7A:
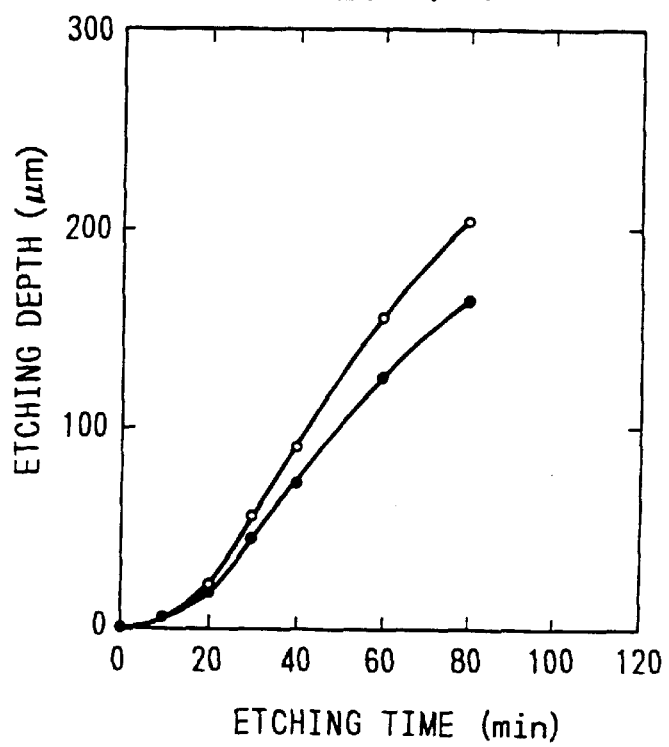
FIGS. 7A to 7H are graphs showing the relations between the etched thickness (etching depth) of porous Si and etching time when etching solutions of this invention are respectively used.

FIG. 7A shows the etching time dependency of etched thickness of porous Si when the latter is etched by being immersed in hydrofluoric acid. The porous Si was formed by anodizing a monocrystalline Si. The conditions of anodization are shown below. It is to be noted, however, that the starting material for producing porous Si by anodization is not limited to monocrystalline Si and Si of other crystalline structure may be used as the starting material.

Voltage applied: 2.6 (V)

Current density: 30 (mA·cm$^{-2}$)

Anodizing solution: HF:H$_2$O:C$_2$H$_5$OH=1:1:1

Time: 2.4 hours

Thickness of porous Si: 300 ($\mu$m)

Porosity: 56 (%)

Test pieces of the porous Si thus prepared were immersed in 49% hydrofluoric acid solution (white circles) and 20% hydrofluoric acid solution (black circles) both at the room temperature, and the solutions were agitated. The reduction in the thickness of these test pieces of the porous Si were then measured. A large etching rate was observed: namely, 90 $\mu$m in 40 minutes in case of the 49% hydro hydro acid solution and 72 $\mu$m in 40 minutes in case of the 20% hydrofluoric acid solution. After elapse of 80 minutes, the porous Si test pieces were etched by 205 $\mu$m with a high degree of surface state in case of the 49% hydrofluoric acid solution, whereas, in case of the 20% hydrofluoric acid solution, the etching depth was 164 $\mu$m after elapse of 80 minutes.

The etching rate has dependencies on the concentration of the etching solution and the temperature. The etching solution concentration and temperature are suitably determined i practical ranges. Although solution concentration of 49% and 20% and the room temperature are mentioned above, these are only illustrative and are not intended for limiting purpose. Preferably, the concentration of the hydrofluoric acid ranges between 5% and 95% and the temperature of the solution is set to a level which is ordinarily adopted in this field of technology.

The etched test pieces of porous Si were then rinsed with water and the surfaces after the rinsing were examined by microanalysis using secondary ions but no impurity was detected.

A description will now be given with specific reference to FIG. 6A of the etching characteristics of porous Si and non-porous Si when hydrofluoric acid is used as the etching solution, followed by a description of an example of etching of a non-porous Si substrate whose one side surface is completely porous Si, taken in conjunction with FIGS. 1A and 1B.

Figure 6A:
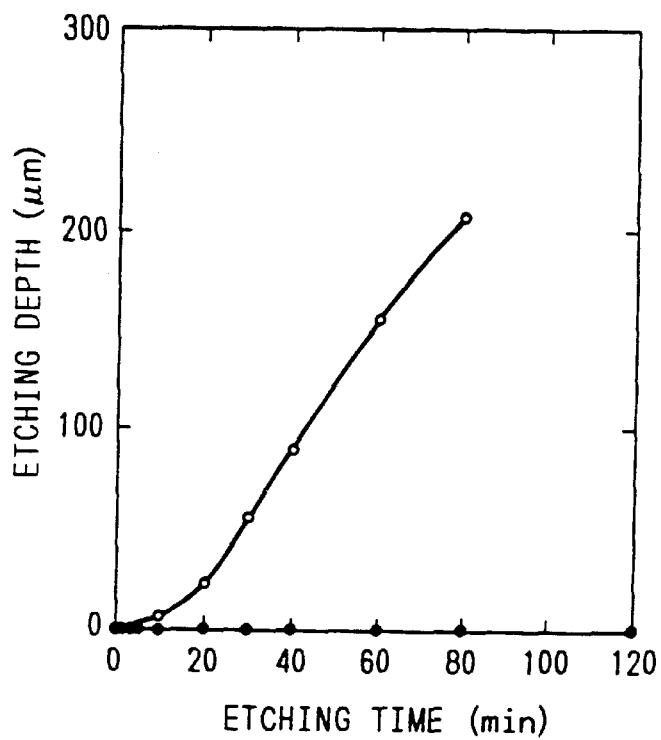
FIGS. 6A to 6H are graphs showing the etching properties of porous and non-porous Si when etching solutions of this invention are respectively used.

FIG. 6A is a graph showing the time dependency of etching depth of porous Si and monocrystalline Si as observed when they are immersed in hydrofluoric acid solution. Porous Si was formed by anodizing monocrystalline Si under the same conditions as those mentioned above. In this case also, the use of monocrystalline Si as the starting material for anodization is only illustrative and Si of other crystalline structures may be used as the starting material.

Test pieces of the porous Si thus prepared were immersed in 49% hydrofluoric acid solution (white circles) at the room temperature, and the solutions were agitated. The reduction in the thickness of these test pieces of porous Si were then measured. A large etching rate was observed: namely, 90 $\mu$m in 40 minutes in case of the 49% hydrofluoric acid solution and, after elapse of 80 minutes, the porous Si test pieces were etched by 205 $\mu$m with a high degree of surface state. The etching rate has dependencies on the concentration of the etching solution and the temperature. The etching solution concentration and temperature are suitably determined in practical ranges. Although solution density of 49% and the room temperature are mentioned above, these are only illustrative and are not intended for limiting purpose. Preferably, the concentration of the hydrofluoric acid ranges between 5% and 95% and the temperature of the solution is set to a level which is ordinarily adopted in this field of technology.

A test piece of a non-porous Si of 500 $\mu$m thick was immersed in a 49% solution of hydrofluoric acid (black circles), followed by an agitation of the solution. The reduction in the thickness was then measured. In this case, the test piece of non-porous Si was etched only by 100 Angstrom or less even after elapse of 120 minutes. The etching rate showed almost no dependency on solution concentration and temperature.

Both the porous and non-porous Si test pieces after the etching were rinsed with water and the surface states of these test pieces were examined by microanalysis with secondary ions but no impurity was detected.

Figure 1B:
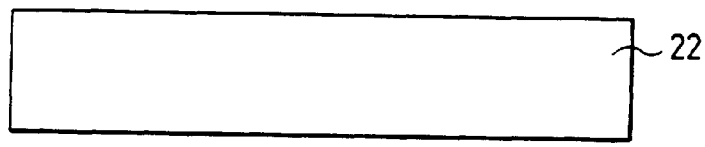

As shown in FIG. 1A, a monocrystalline Si substrate 22 was anodized only at its one side so as to have a porous Si structure only at its one side as denoted by 21. Then, the substrate having the porous Si/monocrystalline Si structure was immersed in a hydrofluoric acid. As a consequence, only the porous Si portion was removed by the etching while the monocrystalline Si substrate 22 alone remained unetched. It is thus possible to selectively etch porous Si by using monocrystalline Si as the etch stopper.

A description will now be given of a case where both porous Si portion and monocrystalline Si portion are provided on one side of the substrate.

Figure 2A:
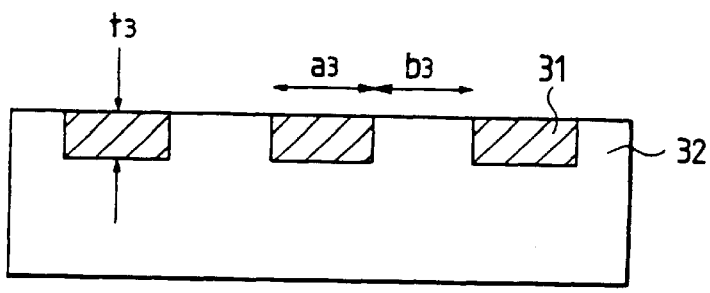
FIGS. 2A and 2B are schematic views explaining an etching step using an etching solution of this invention.

As shown in FIG. 2A, a portion of one side of a monocrystalline Si substrate 32 was anodized to become porous Si structure 31. Since the current and voltage necessary for the anodization vary depending on the carrier concentration, it is possible to selectively form porous Si structure by locally varying the carrier concentration in the monocrystalline Si surface layer through implantation of proton or impurities. The substrate having the porous Si/monocrystalline Si structure was then immersed in hydrofluoric acid. As a result, only the porous Si portion was removed while the monocrystalline Si substrate 32 remained unetched. It is thus possible to selectively etch porous Si.

A description will be made as to the case where a porous Si structure and a polycrystalline structure are formed in layers on one side of the substrate.

Figure 3A:
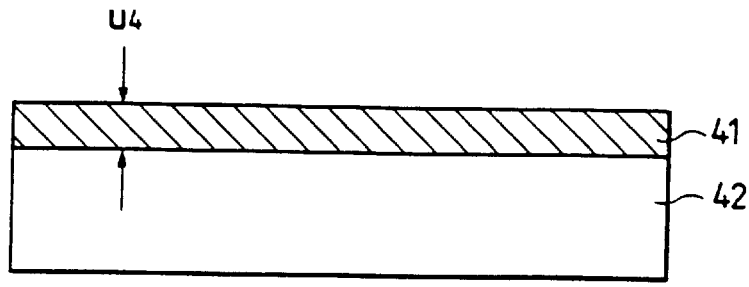
FIGS. 3A to 3C are schematic views explaining an etching step using an etching solution of this invention.
Figure 3B:
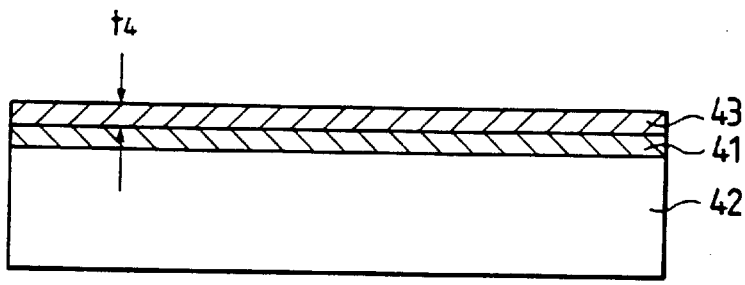

As shown in FIG. 3A, a polycrystalline Si layer 41 was formed by deposition on a single-crystalline Si substrate 42, and the surface layer of this polycrystalline Si was changed into a porous Si layer 43 by anodization, as shown in FIG. 3B. The substrate having the porous Si/polycrystalline Si/monocrystalline Si structure was immersed in a solution of hydrofluoric acid, whereby the porous Si structure alone was removed by etching while the monocrystalline Si substrate 42 and the polycrystalline Si layer 41 remained unetched. It was thus possible to selectively etch the porous Si by using polycrystalline Si as the etching stopper.

A description will now be given of a case where porous Si portion is formed in the surface of a polycrystalline Si layer which is formed on one side of the substrate.

Figure 4A:
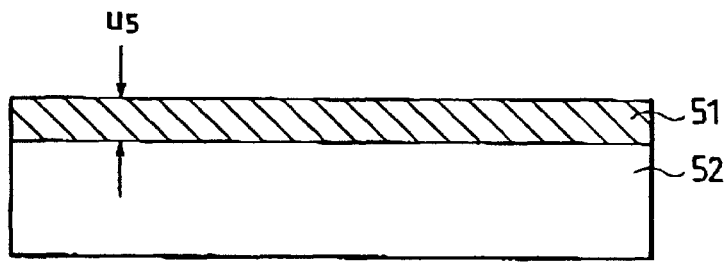
FIGS. 4A to 4C are schematic views explaining an etching step using an etching solution of this invention.

As shown in FIG. 4A, a polycrystalline Si layer 51 was formed by deposition in a monocrystalline Si substrate 52 and a portion of this polycrystalline Si layer was changed into porous Si layer 53 by anodization. Then, the substrate having the porous Si/polycrystalline Si/monocrystalline Si structure was immersed in a solution of hydrofluoric acid, so that the porous Si alone was removed while the monocrystalline Si substrate 52 and the polycrystalline Si layer 51 remained unetched. It was thus possible to selectively etch the porous Si

I-(2)

A description will now be given of the case where a mixture of hydrofluoric acid and an alcohol is used as the electroless wet chemical etching solution for porous Si, with reference to FIG. 7B.

Figure 7B:
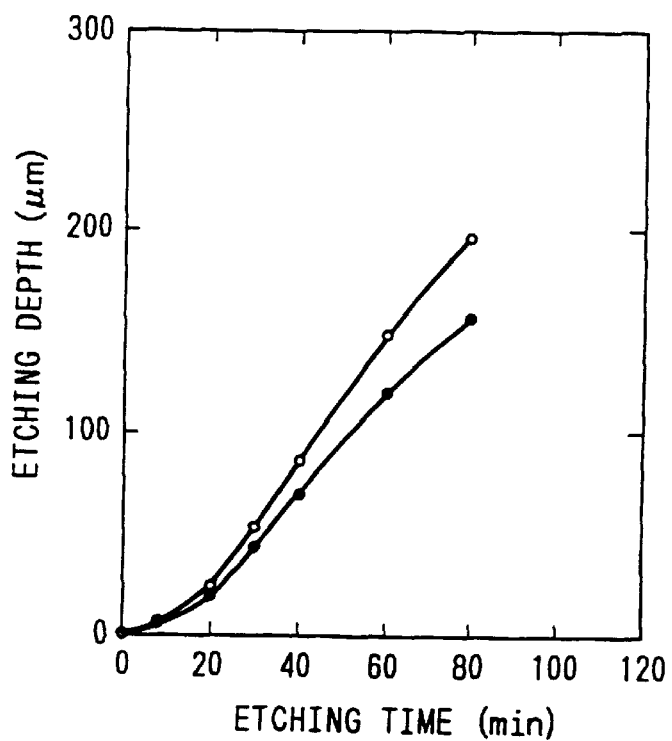

FIG. 7B shows the time dependency of etching thickness of porous Si as observed when the porous Si is immersed in a mixture liquid of hydrofluoric acid and ethyl alcohol without agitation of the liquid. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 (mA·cm$^{-2}$)

Anodizing solution: HF:H$_2$O: C$_2$H$_5$OH=1:1:1

Time: 2.4 (hours)

Thickness of porous Si: 300 ($\mu$m)

Porosity: 56 (%)

Test pieces of the porous Si prepared as described above were immersed, without agitation, in a mixture solution of 49% hydrofluoric acid and ethyl alcohol (10:1) (white circles) and in a mixture solution of 20% hydrofluoric acid and ethyl alcohol (10:1) (black circles). The reductions in the thicknesses of the porous Si test pieces were then measured. Large rates of etching of the porous Si were observed: namely, in the case of the mixture solution of 49% hydrofluoric acid and ethyl alcohol (10:1), the porous Si was etched by 85 µm and, in case of the mixture solution of 20% hydrofluoric acid and ethyl alcohol (10:1), the porous Si was etched by 68 µm, in about 40 minutes. After elapse of 80 minutes, the porous Si was etched by a thickness as large as 195 µm in the case of the mixture solution of 49% hydrofluoric acid and ethyl alcohol (10:1) and 156 µm even in the case of the mixture solution of 20% hydrofluoric acid and ethyl alcohol (10:1), with high degrees of states of the etched surfaces.

The etching rate has dependencies on the concentration of the hydrofluoric acid solution, as well as on the temperature. The addition of alcohol serves to remove bubbles of reaction product gases generated as a result of the etching without delay from the surface being etched, without necessitating agitation, thus ensuring a high efficiency and uniformity of the etching.

The solution concentration and the temperature are determined such that a practical etching speed is obtained in preparation process and the effect of addition of alcohol is appreciable. Although the mixture solutions of 49% hydrofluoric acid and ethyl alcohol (10:1) and 20% hydrofluoric acid and ethyl alcohol (10:1), as well as the room temperature as the solution temperature, are mentioned, these solution densities and temperature are only illustrative and are not intended to restrict the scope of the invention. The HF concentration with respect to the etching solution preferably ranges between 1 and 95 %, more preferably between 5 and 90% and most preferably between 5 and 80%. The concentration of alcohol with respect to the etching solution is preferably 80% or less, more preferably 60% or less and most preferably 40% or less, and is determined so as to provide an appreciable effect of addition of the alcohol. The temperature is selected to range preferably 0 to 100° C., more preferably 5 to 800° C. and most preferably 5 to 600° C.

Although ethyl alcohol has been mentioned specifically, the invention does not exclude the use of other alcohol such as isopropyl alcohol which does not cause any inconvenience in the production process and which can provide an appreciable effect of addition of such alcohol.

The porous Si after the etching was rinsed with water and the rinsed surface was examined by microanalysis by using secondary ions but no impurity was detected.

A description will now be given of the etching characteristic of porous Si and non-porous Si when they are etched by a mixture solution of hydrofluoric acid and ethyl alcohol, with specific reference to FIG. 6B.

Figure 6B:
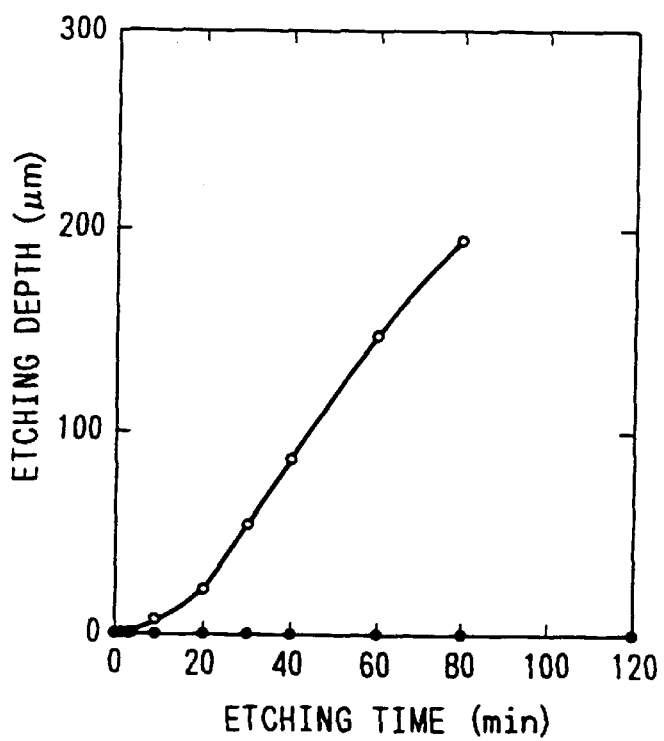

FIG. 6B shows time dependencies of etched thicknesses of porous Si and monocrystalline Si as observed when the porous Si and the monocrystalline Si are immersed in a mixture solution of hydrofluoric acid and ethyl alcohol without agitation. The porous Si was formed by anodization of monocrystalline Si conducted under the same conditions as those shown before. The use of monocrystalline Si as the starting material for forming porous Si through anodization is only illustrative and Si of other crystalline structures can be used as the starting material.

A test piece of porous Si prepared as described above was immersed, without agitation, in a mixture solution of 49% hydrofluoric acid and ethyl alcohol(10:1) (while circles), and reduction in the thickness of the porous Si was measured. The porous Si was rapidly etched: namely, by a thickness of 85 µm in 40 minutes and 195 µm in 80 minutes, with high degrees of surface quality and uniformity.

The etching rate depends on the concentration and the temperature of the hydrofluoric acid solution.

The addition of alcohol serves to remove bubbles of reaction product gases generated as a result of the etching without delay from the surface being etched, without necessitating agitation, thus ensuring a high efficiency and uniformity of the etching.

A test piece of a non-porous Si of 500 µm thick was immersed in a mixture solution of 49 hydrofluoric acid and ethyl alcohol (10 1) (black circles), without agitation of the solution. The reduction in the thickness was then measured. In this case, the test piece of non-porous Si was etched only by 100 Angstrom or less even after elapse of 120 minutes. The etching rate showed almost no dependency on the solution concentration and temperature.

Both the porous and non-porous Si test pieces after the etching were rinsed with water and the surface states of these test pieces were examined by microanalysis with secondary ions but no impurity was detected.

Naturally, various etching methods explained in connection with I by making reference to FIGS. 1A and 1B, FIGS. 2A and 2B, FIGS. 3A to 3C and FIGS. 4A to 4C can be realized also in the case where the mixture solution of hydrofluoric acid and an alcohol is used as the etchant for porous Si.

I-(3)

A description will now be given of the case where a mixture of hydrofluoric acid and aqueous hydrogen peroxide (hereinafter also referred to as "hydrogen peroxide") is used as the electroless wet chemical etching solution for porous Si, with reference to FIG. 7C.

Figure 7C:
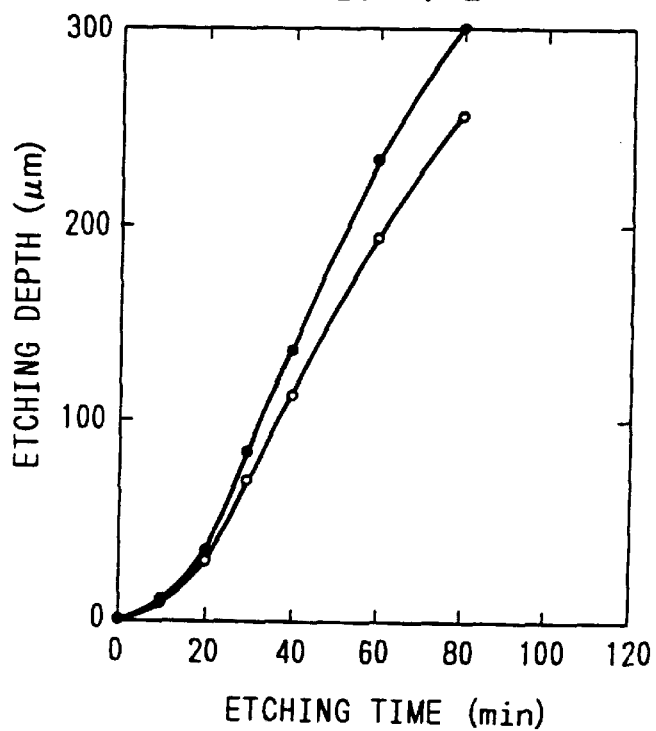

FIG. 7C shows the time dependency of etched thickness of porous Si as observed when the porous Si is immersed in a mixture liquid of hydrofluoric acid and hydrogen peroxide under agitation of the liquid. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 (mA·cm$^{-2}$)

Anodizing solution: $HF:H_2O:C_2H_5OH=1:1:1$

Time: 2.4 (hours)

Thickness of porous Si: 300 (µm)

Porosity: 56 (%)

Test pieces of the porous Si prepared as described above were immersed, without agitation, in a mixture solution of 49% hydrofluoric acid and hydrogen peroxide (1:5) (white circles) and in a mixture solution of 49% hydrofluoric acid and hydrogen peroxide (1:1) (black circles). The reductions in the thicknesses of the porous Si test pieces were then measured. Large rates of etching of the porous Si were observed: namely, in the case of the 1:5 solution, the porous Si was etched by 112 µm and, in case of the 1:1 solution, the porous Si was etched by 135 µm, in about 40 minutes. After elapse of 80 minutes, the porous Si was etched by a thickness as large as 256 µm in the case of the 1:5 solution and 307 µm in the case of the 1:1 solution, with high degrees of states of the etched surfaces. The concentration of hydrogen peroxide was 30% in this case but the hydrogen peroxide concentration may be determined in a range which provides an appreciable effect of addition of hydrogen peroxide and which does not cause any practical problem in the production process.

The etching rate has dependencies on the density of the hydrofluoric acid solution, as well as on the temperature of the same. The addition of alcohol serves to accelerate oxidation of silicon, thus enhancing the reaction speed as compared to the case where hydrogen peroxide is not used. It is also possible to control the reaction speed by suitably selecting the content of hydrogen peroxide.

The solution concentration and the solution temperature are determined such that a practical etching speed is obtained in preparation process and the effect of hydrofluoric acid and hydrogen peroxide is appreciable. Although the mixture solutions of 49% hydrofluoric acid and hydrogen peroxide (1:5) and 49% hydrofluoric acid and hydrogen peroxide (1:1), as well as the room temperature as the solution temperature, are mentioned, these solution concentrations and temperature are only illustrative and are not intended to restrict the scope of the invention.

The HF concentration with respect to the etching solution preferably ranges between 1 and 95%, more preferably between 5 and 90% and most preferably between 5 and 80%. The concentration of $H_2O_2$ with respect to the etching solution is preferably selected to range between 1 and 95%, more preferably between 5 and 90% and most preferably between 10 and 80%, and is determined so as to provide an appreciable effect of addition of the hydrogen peroxide. The temperature is selected to range preferably 0 to 100° C., more preferably 5 to 80° C. and most preferably 5 to 60° C.

The porous Si after the etching was rinsed with water and the rinsed surface was examined by microanalysis by using secondary ions but no impurity was detected.

Figure 6C:
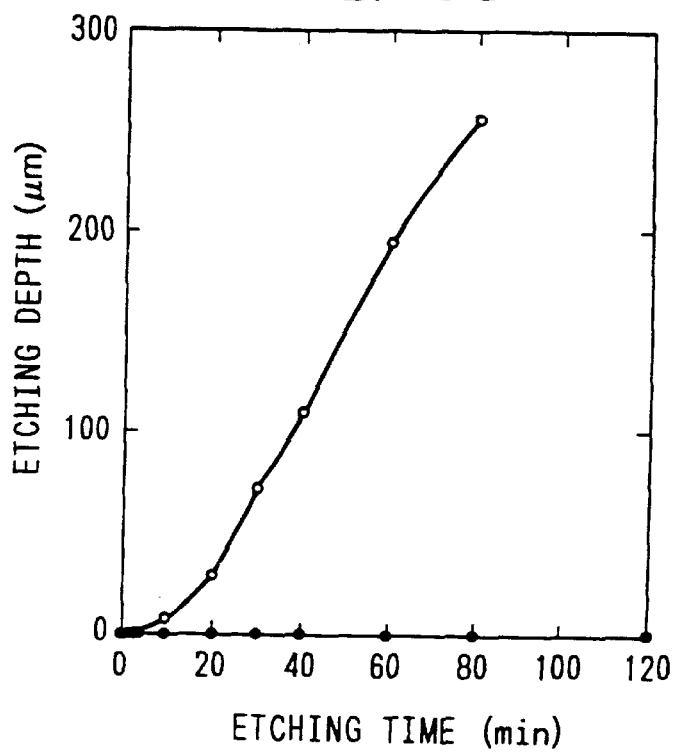

A description will now be given of the etching characteristics of porous Si and non-porous Si as observed when they are etched by a mixture solution of hydrofluoric acid and aqueous hydrogen peroxide, with specific reference to FIG. 6C. FIG. 6C shows the time dependencies of etched depth of porous Si and monocrystalline Si as observed when the porous Si and the monocrystalline Si are immersed in a mixture solution of hydrofluoric acid and aqueous hydrogen peroxide. The porous Si was formed by anodization of monocrystalline Si conducted under the same conditions as those shown before. The use of monocrystalline Si as the starting material for forming porous Si through anodization is only illustrative and Si of other crystalline structures can be used as the starting material.

A test piece of porous Si prepared as described above was immersed, followed by agitation, in a mixture solution of 49% hydrofluoric acid and aqueous hydrogen peroxide (white circles), and reduction in the thickness of the porous Si was measured. The porous Si was rapidly etched: namely, by a thickness of 112 $\mu$m in 40 minutes and 256 $\mu$m in 80 minutes, with high degrees of surface quality and uniformity. Although the concentration of aqueous hydrogen peroxide was 30% in this case, the concentration of hydrogen peroxide may be suitably determined within a range which does not impair the effect of addition of hydrogen peroxide and which does not cause any practical inconvenience in the production.

The etching rate depends on the concentration and the temperature of the hydrofluoric acid and aqueous hydrogen peroxide The addition of hydrogen peroxide serves to
accelerate oxidation of silicon, thus enhancing the reaction speed as compared to the case where hydrogen peroxide is not added. Furthermore, the reaction speed can be controlled by suitably selecting the content of the hydrogen peroxide.

A test piece of a non-porous Si of 500 $\mu$m thick was immersed in a mixture solution of 49% hydrofluoric acid and aqueous hydrogen peroxide (1:5) (Black circles), followed by agitation of the solution. The reduction in the thickness of the porous Si was then measured. In this case, the test piece of nonporous Si was etched only by 100 Angstrom or less even after elapse of 120 minutes. The etching rate showed almost no dependency on the solution concentration and temperature.

Both the porous and non-porous Si test pieces after the etching were rinsed with water and the surface states of these test pieces were examined by microanalysis with secondary ions but no impurity was detected.

Naturally, various embodiments explained in connection with I by making reference to FIGS. 1A and 1B, FIGS. 2A and 2B, FIGS. 3A to 3C and FIGS. 4A to 4C can be realized also in the case where the mixture solution of hydrofluoric acid and aqueous hydrogen peroxide is used as the etching solution.

I-(4)

A description will now be given of the case where a mixture of hydrofluoric acid, an alcohol and aqueous hydrogen peroxide is used as the electroless wet chemical etching solution for porous Si, with reference to FIG. 7D.

Figure 7D:
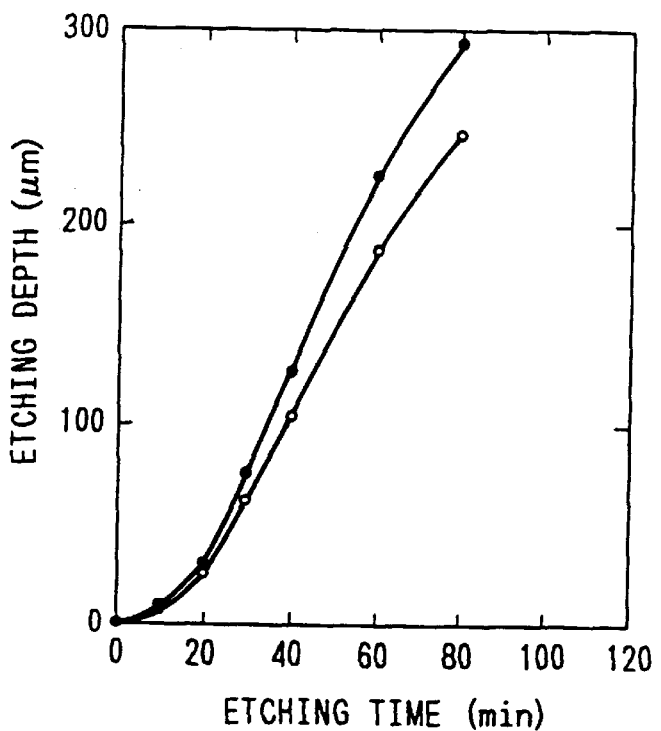

FIG. 7D shows the time dependency of etched thickness of porous Si as observed when the porous Si is immersed in a mixture liquid of hydrofluoric acid, ethyl alcohol and aqueous hydrogen peroxide without agitation of the liquid. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 ($mA \cdot cm^{-2}$

Anodizing solution: $HF:H_2O:C_2H_5OH=1:1:1$

Time: 2.4 (hours)

Thickness of porous Si: 300 ($\mu$m)

Porosity: 56 (%)

Test pieces of the porous Si prepared as described above were immersed, without agitation, in a mixture solution of 49% hydrofluoric acid, ethyl alcohol and aqueous hydrogen peroxide (10:6:50) (white circles) and in a mixture solution of 49% hydrofluoric acid, ethyl alcohol and hydrogen peroxide (10:2:10) (black circles). The reductions in the thicknesses of the porous Si test pieces were then measured. Large rates of etching of the porous Si were observed: namely, in the case of the 10:6:50 solution, the porous Si was etched by 107 $\mu$m and, in case of the 10:2:10 solution, the porous Si was etched by 128 $\mu$m, in about 40 minutes. After elapse of 80 minutes, the porous Si was etched by a thickness as large as 244 $\mu$m in the case of the 10:6:50 solution and 292 $\mu$m in the case of the 10:2:10 solution, with high degrees of states of the etched surfaces. The concentration of aqueous hydrogen peroxide was 30% in this case but the hydrogen peroxide concentration may be determined in a range which provides an appreciable effect of addition of hydrogen peroxide and which does not cause any practical problem in the production process.

The etching rate has dependencies on the density of the hydrofluoric acid solution, as well as on the temperature of the same. The addition of alcohol serves to accelerate oxidation of silicon, thus enhancing the reaction speed as compared to the case where hydrogen peroxide is not used. It is also possible to control the reaction speed by suitably selecting the content of hydrogen peroxide. On the other hand, the addition of alcohol serves to remove, without delay, bubbles of reaction gases generated as a result of the etching from the etched surface, without requiring agitation of the solution, thus offering high degrees of efficiency and uniformity of etching of the porous Si.

The solution density and the solution temperature are determined such that a practical etching speed is obtained and such that the effect of the use of hydrofluoric acid, alcohol and hydrogen peroxide is appreciable. Although the mixture solutions of 49% hydrofluoric acid, ethyl alcohol and hydrogen peroxide (10:6:50) and 49% hydrofluoric acid, ethyl alcohol and hydrogen peroxide (10:2:10), as well as the room temperature as the solution temperature, are mentioned, these solution densities and temperature are only illustrative and are not intended to restrict the scope of the invention.

The HF concentration with respect to the etching solution preferably ranges between 1 and 95%, more preferably between 5 and 90% and most preferably between 5 and 80%. The concentration of $H_2O_2$ with respect to the etching solution is preferably selected to range between 1 and 95%, more preferably between 5 and 90% and most preferably between 10 and 80%, and is determined so as to provide an appreciable effect of addition of the hydrogen peroxide. The concentration of the alcohol with respect to the etching solution is preferably determined to be 80% or less, more preferably 60% or less and most preferably 40% or less, and is selected so as to provide an appreciable effect of addition of the alcohol. The temperature is selected to range preferably 0 to 100° C., more preferably 5 to 80° C. and most preferably 5 to 60° C.

Alcohol to be used in the present invention is not limited to ethyl alcohol and includes those alcohols such as isopropyl alcohol which can practically be used in preparation process and accomplish the effect of the addition of alcohol as mentioned above.

The porous Si after the etching was rinsed with water and the rinsed surface was examined by microanalysis by using secondary ions but no impurity was detected.

This type of etching solution is advantageous in that bubbles of reaction product gases generated as a result of the etching can be removed without delay from the surface being etched, without requiring agitation, so that the surface is etched with high degrees of smoothness and uniformity even to the bottoms of minute recesses which may exist in the etched surface.

A description will now be given of the etching characteristics of porous Si and non-porous Si as observed when they are etched by a mixture solution of hydrofluoric acid, ethyl alcohol and aqueous hydrogen peroxide, with specific reference to FIG. 6D.

Figure 6D:
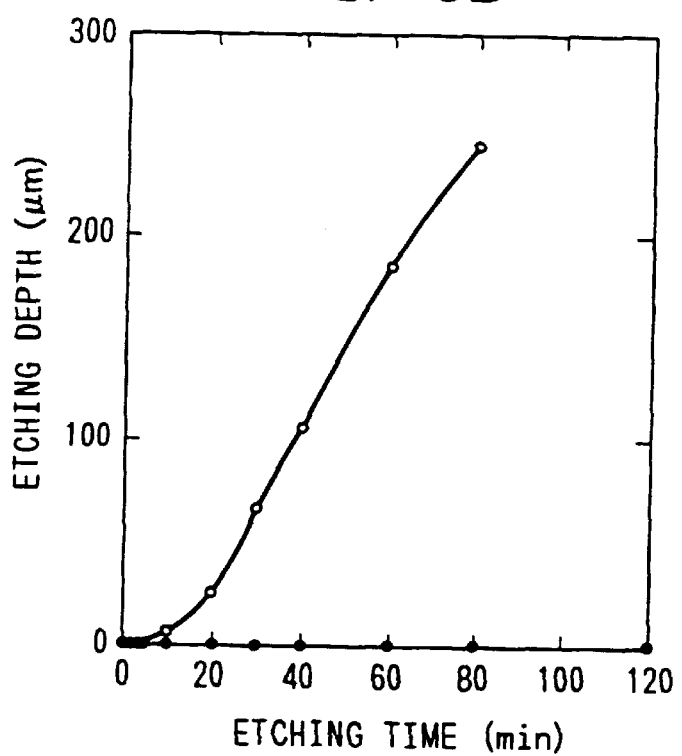

FIG. 6D shows the time dependencies of etched thickness of porous Si and monocrystalline Si as observed when the porous Si and the monocrystalline Si are immersed in a mixture solution of hydrofluoric acid, ethyl alcohol and aqueous hydrogen peroxide, without agitation. The porous Si was formed by anodization of monocrystalline Si conducted under the same conditions as those shown before. The use of monocrystalline Si as the starting material for forming porous Si throught anodization is only illustrative and Si of other crystalline structures can be used as the starting material.

A test piece of porous Si prepared as described above was immersed, without agitaion, in a mixture solution of 49% hydrofluoric acid, ethyl alcohol and aqueous hydrogen peroxide (10:6:50) (while circles) at the room temperature, and reduction in the thickness of the porous Si was measured. The porous Si was rapidly etched: namely, by a thickness of 107 $\mu$m in 40 minutes and 244 $\mu$m in 80 minutes, with high degrees of surface quality and uniformity. Although the concentration of the aqueous hydrogen peroxide was 30% in this case, the content of hydrogen perozide may be suitably determined within a range which does not impair the effect of addition of hydrogen peroxide and which does not cause any practical inconvenience in the production.

The etching rate depends on the concentration and the temperature of the hydrofluoric acid and aqueous hydrogen peroxide.

The addition of hydrogen peroxide serves to accelerate oxidation of silicon, thus enhancing the reaction speed as compared to the case where hydrogen peroxide is not added. Furthermore, the reaction speed can be controlled by suitably selecting the content of the hydrogen peroxide. In addition, alcohol serves to remove, without delay, bubbles of the reaction product gases generated as a result of the etching without requiring agitation, thus ensuring high degrees of uniformity and etching of the porous Si.

A test piece of a non-porous Si of 500 $\mu$m thick was immersed in a mixture solution of 49% hydrofluoric acid, ethyl alcohol and aqueous hydrogen peroxide (10:6:50) (black circles) at the room temperature, without agitation of the solution. The reduction in the thickness was then measured. In this case, the test piece of non-porous Si was etched only by 100 Angstrom or less even after elapse of 120 minutes. The etching rate showed almost no dependency on the solution concentration and temperature.

Both the porous and non-porous Si test pieces after the etching were rinsed with water and the surface states of these test pieces were examined by microanalysis with secondary ions but no impurity was detected.

Naturally, the various embodiments explained in connection with I by making reference to FIGS. 1A and 1B, FIGS. 2A and 2B, FIGS. 3A to 3C and FIGS. 4A to 4C can be realized also in the case where the mixture solution of hydrofluoric acid, alcohol and aqueous hydrogen peroxide is used as the etchant for porous Si.

I-(5)

A description will now be given of the case where a buffered hydrofluoric acid is used as the electroless wet chemical etching solution for porous Si, with reference to FIG. 7E. For instance, an aqueous solution containing 36.2 % of ammonium fluoride ($NH_4F$) and 4.5% of hydrogen fluoride (HF) is used as the buffered hydrofluoric acid.

Figure 7E:
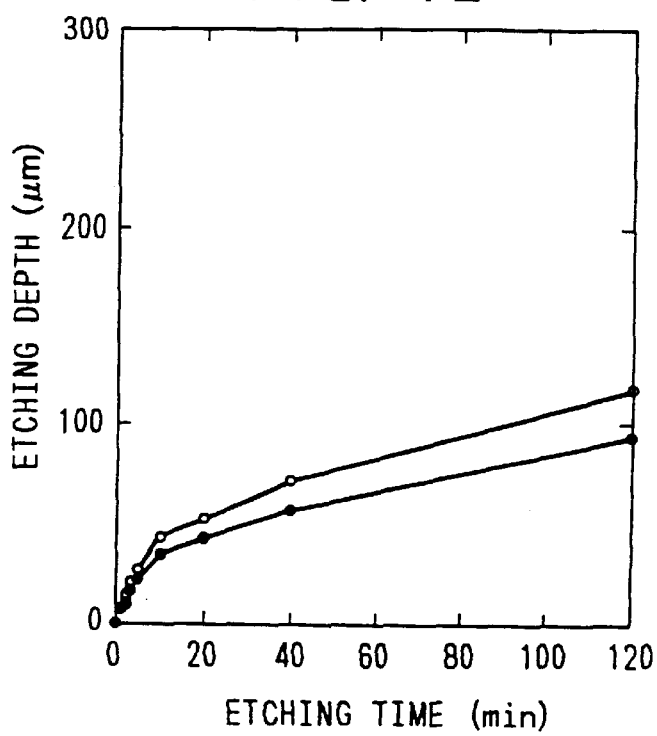

FIG. 7E shows the time dependency of etching thickness of porous Si as observed when the porous Si is immersed in the buffered hydrofluoric acid followed by agitation. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 ($mA \cdot cm^{-2}$

Anodizing solution: $HF:H_2O:C_2H_5OH=1:1:1$

Time: 2.4 (hours)

Thickness of porous Si: 300 ($\mu$m)

Porosity: 56 (%)

Test pieces of the porous Si prepared as described above were immersed, followed by agitation, in the buffered hydrofluoric acid (white circles) and in a 20% diluted buffered hydrofluoric acid (black circles). The reductions in the thicknesses of the porous Si test pieces were then measured. Large rates of etching of the porous Si were observed: namely, in the case of buffered hydrofluoric acid, the porous Si was etched by 70 $\mu$m and, in case of the 20% diluted buffered hydrofluoric acid, the porous Si was etched by 56 $\mu$m, in about 40 minutes. After elapse of 120 minutes, the porous Si was etched by a thickness as large as 118 $\mu$m in the case of the buffered hydrofluoric acid and 94 $\mu$m in the case of the 20% diluted buffered hydrofluoric acid, with high degrees of states of the etched surfaces.

The etching rate has dependencies on the density of the hydrofluoric acid solution, as well as on the temperature of the same. The density of the solution and the temperature of the same are determined to fall within the ranges which would not cause any practical inconvenience. Although the buffered hydrofluoric acid which is an aqueous solution containing 36.2% of ammonium fluoride ($NH_4F$) and 4.5% of hydrogen fluoride (HF) and the 20% diluted buffered hydrofluoric acid, as well as the room temperature as the solution temperature, are mentioned, these solution densities and temperature are only illustrative and are not intended to restrict the scope of the invention.

The HF concentration in the buffered hydrofluoric acid with respect to the etching solution preferably ranges between 1 and 95%, more preferably between 1 and 85% and most preferably between 1 and 70%. The concentration of $NH_4$ in the buffered hydrofluoric acid with respect to the etching solution is preferably selected to range between 1 and 95%, more preferably between 5 and 90% and most preferably between 5 and 80%. The temperature is selected to range preferably 0 to 100° C., more preferably 5 to 80° C. and most preferably 5 to 60° C.

The porous Si after the etching was rinsed with water and the rinsed surface was examined by microanalysis by using secondary ions but no impurity was detected.

Figure 6E:
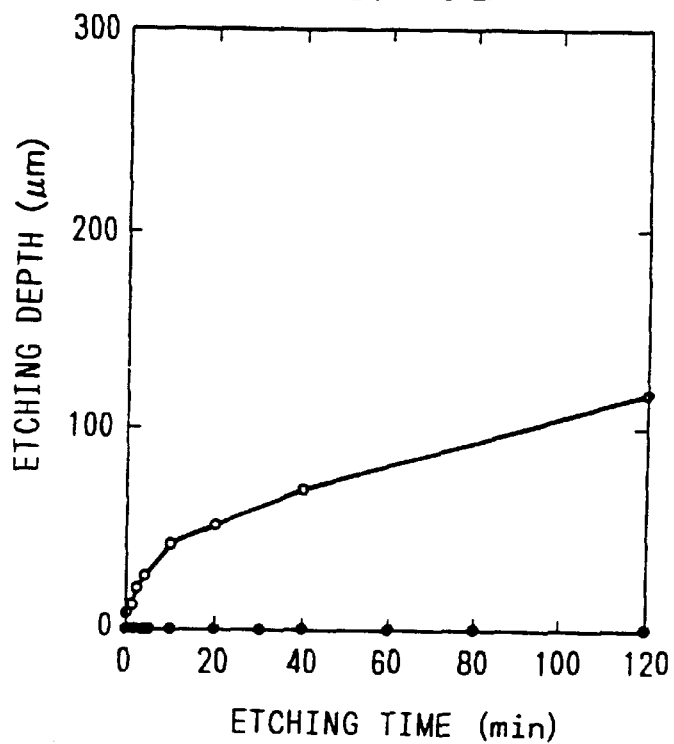

A description will now be given of the etching characteristics of porous Si and non-porous Si as observed when they are etched by the buffered hydrofluoric acid, with specific reference to FIG. 6E. FIG. 6E shows the time dependencies of etching of porous Si and monocrystalline Si as observed when the porous Si and the monocrystalline Si are immersed in the buffered hydrofluoric acid. The porous Si was formed by anodization of monocrystalline Si conducted under the same conditions as those shown before. The use of monocrystalline Si as the starting material for forming porous Si through anodization is only illustrative and Si of other crystalline structures can be used as the starting material.

A test piece of porous Si prepared as described above was immersed, followed by agitation, in the buffered hydrofluoric acid (white circles) at the room temperature, and reduction in the thickness of the porous Si was measured. The porous Si was rapidly etched: namely, by a thickness of 70 $\mu$m in 40 minutes and 118 $\mu$m in 120 minutes, with high degrees of surface quality and uniformity.

The etching rate has dependencies on the density of the hydrofluoric acid solution, as well as on the temperature of the same. The density of the solution and the temperature of the same are determined to fall within the ranges which would not cause any practical inconvenience. Although the buffered hydrofluoric acid which is an aqueous solution containing 36.2% of ammonium fluoride ($NH_4F$) and 4.5% of hydrogen fluoride (HF) as well as the room temperature as the solution temperature, are mentioned, these solution densities and temperature are only illustrative and are not intended to restrict the scope of the invention.

A test piece of a non-porous Si of 500 $\mu$m thickness was immersed in the buffered hydrofluoric acid(black circles) at the room temperature, followed by agitation of the solution. The reduction in the thickness was then measured. In this case, the test piece of non-porous Si was etched only by 100 Angstroms or less even after elapse of 120 minutes. The etching rate showed almost no dependency on the solution density and temperature.

Both the porous and non-porous Si test pieces after the etching were rinsed with water and the surface states of these test pieces were examined by microanalysis with secondary ions but no impurity was detected.

Obviously, various etching methods explained in connection with (1) by making reference to FIGS. 1A and 1B, FIGS. 2A and 2B, FIGS. 3A to 3C and FIGS. 4A to 4C can be realized also in the case where the buffered hydrofluoric acid is used as the etching solution.

I-(6)

A description will now be given of the case where a mixture liquid of a buffered hydrofluoric acid and an alcohol is used as the electroless wet chemical etching solution for porous Si, with reference to FIG. 7F. For instance, an aqueous solution containing 36.2% of ammonium fluoride ($NH_4F$) and 4.5% of hydrogen fluoride (HF) is used as the buffered hydrofluoric acid.

Figure 7F:
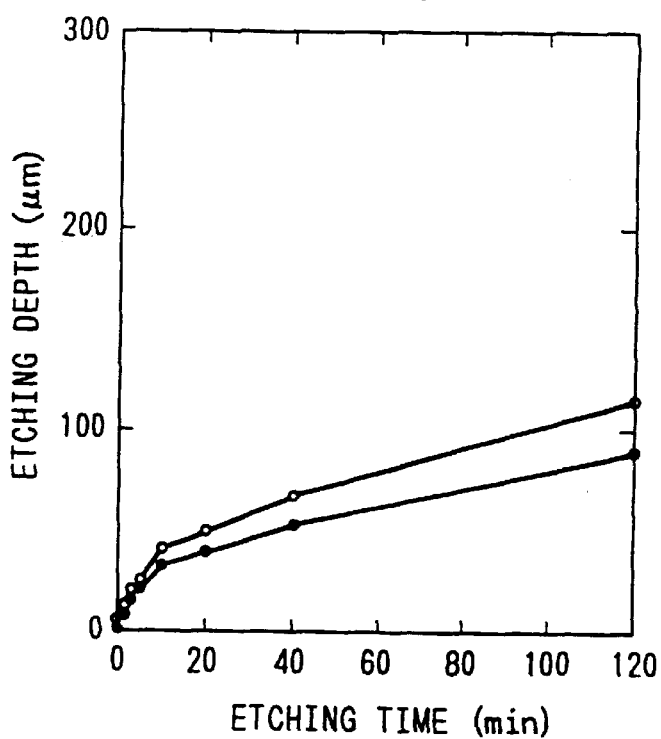

FIG. 7F shows the time dependency of etching thickness of porous Si as observed when the porous Si is immersed in the mixed solution of the buffered hydrofluoric acid and ethyl alcohol, without agitation. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 (mA·cm$^{-2}$)

Anodizing solution: $HF:H_2O:C_2H_5OH$=1:1:1

Time: 2.4 (hours)

Thickness of porous Si: 300 ($\mu$m)

Porosity: 56 (%)

Test pieces of the porous Si prepared as described above were immersed, without agitation, in a mixture solution of the buffered hydrofluoric acid and ethyl alcohol(10:1) (white circles) and in a mixture solution of 20% diluted buffered hydrofluoric acid and ethyl alcohol (10:1) (black circles). The reductions in the thicknesses of the porous Si test pieces were then measured. Large rates of etching of the porous Si were observed: namely, in the case of the mixture solution of the buffered hydrofluoric acid and ethyl alcohol (10:1), the porous Si was etched by 67 $\mu$m and, in case of the mixture solution of the 20% diluted buffered hydrofluoric acid and ethyl alcohol (10:1), the porous Si was etched by 54 $\mu$m, in about 40 minutes. After elapse of 120 minutes, the porous Si was etched by a thickness as large as 112 $\mu$m in the case of the mixture solution of the buffered hydrofluoric acid and ethyl alcohol (10:1) and 90 $\mu$m in the case of the mixture solution of 20% diluted buffered hydrofluoric acid and ethyl alcohol (10:1), with high degrees of states of the etched surfaces. The etching rate has dependencies on the density of the hydrofluoric acid solution, as well as on the temperature of the same. The addition of alcohol serves to remove, without delay, bubbles of reaction product gases generated as a result of the etching from the surface being etched, without requiring agitation, thus enabling etching of the porous Si with high degrees of uniformity and efficiency.

The density of the solution and the temperature of the same are determined to fall within the ranges which would not cause any practical inconvenience. Although the mixture solution of the buffered hydrofluoric acid and ethyl alcohol (10:1) and the mixture solution of the 20% diluted buffered hydrofluoric acid and ethyl alcohol (10:1), as well as the room temperature as the solution temperature, are mentioned, these solution densities and temperature are only illustrative and are not intended to restrict the scope of the invention.

The HF concentration in the buffered hydrofluoric acid with respect to the etching solution preferably ranges between 1 and 95%, more preferably between 1 and 85% and most preferably between 1 and 70%. The concentration of $NH_4$ in the buffered hydrofluoric acid with respect to the etching solution is preferably selected to range between 1 and 95%, more preferably between 5 and 90% and most preferably between 5 and 80%. The concentration of the alcohol with respect to the etching solution is preferably 80% or less, more preferably 60% or less and most preferably 40% or less, and is determined to make the effect of addition of the alcohol appreciable. The temperature is selected to range preferably 0 to 100° C., more preferably 5 to 80° C. and most preferably 5 to 600° C.

Although ethyl alcohol has been specifically mentioned, other alcohols such as isopropyl alcohol, which does not cause any inconvenience in the commercial production and which can provide an appreciable effect of addition of such alcohol, may be used as the alcohol used in this type of etching solution.

The porous Si after the etching was rinsed with water and the rinsed surface was examined by microanalysis by using secondary ions but no impurity was detected.

In this etching solution, bubbles of reaction product gases generated as a result of the etching can be removed without delay and without requiring agitation of the solution, by virtue of the addition of the alcohol, so that the bottoms of minute recesses can be formed with high degrees of smoothness and uniformity.

Figure 6F:
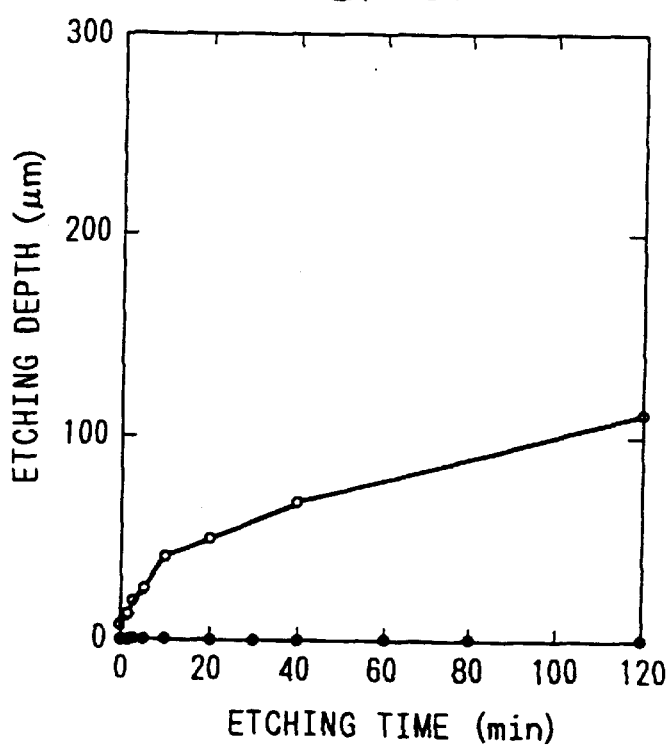

A description will now be given of the etching characteristics of porous Si and non-porous Si as observed when they are etched by the mixture solution of the buffered hydrofluoric acid and the ethyl alcohol, with specific reference to FIG. 6F. FIG. 6F shows the time dependencies of etching thickness of porous Si and monocrystalline Si as observed when the porous Si and the monocrystalline Si are immersed in the mixture solution of the buffered hydrofluoric acid and ethyl alcohol. The porous Si was formed by anodization of monocrystalline Si conducted under the same conditions as those shown before. The use of monocrystalline Si as the starting material for forming porous Si through anodization is only illustrative and Si of other crystalline structures can be used as the starting material.

A test piece of porous Si prepared as described above was immersed, without agitation, in the mixture solution of the buffered hydrofluoric acid and ethyl alcohol (10:1) (white circles) at the room temperature, and reduction in the thickness of the porous Si was measured. The porous Si was rapidly etched: namely, by a thickness of 67 $\mu$m in 40 minutes and 112 $\mu$m in 120 minutes, with high degrees of surface quality and uniformity.

A test piece of a non-porous Si of 500 $\mu$m thickness was immersed in the mixture solution of the buffered hydrofluoric acid and ethyl alcohol (10:1) (black circles) at the room temperature, without agitation of the solution. The reduction in the thickness of the non-porous Si was then measured. In this case, the test piece of non-porous Si was etched only by 100 Angstroms or less even after elapse of 120 minutes. The etching rate showed almost no dependency on the solution density and temperature.

Both the porous and non-porous Si test pieces after the etching were rinsed with water and the surface states of these test pieces were examined by microanalysis with secondary ions but no impurity was detected.

Obviously, various etching methods explained in connection with (1) by making reference to FIGS. 1A and 1B, FIGS. 2A and 2B, FIGS. 3A to 3C and FIGS. 4A to 4C can be realized also in the case where the mixture solution of the buffered hydrofluoric acid and alcohol is used as the etching solution.

I-(7)

A description will now be given of the case where a mixture solution of a buffered hydrofluoric acid and hydrogen peroxide is used as the electroless wet chemical etching solution for porous Si, with reference to FIG. 7G. For instance, an aqueous solution containing 36.2% of ammonium fluoride ($NH_4F$) and 4.5% of hydrogen fluoride (HF) is used as the buffered hydrofluoric acid.

Figure 7G:
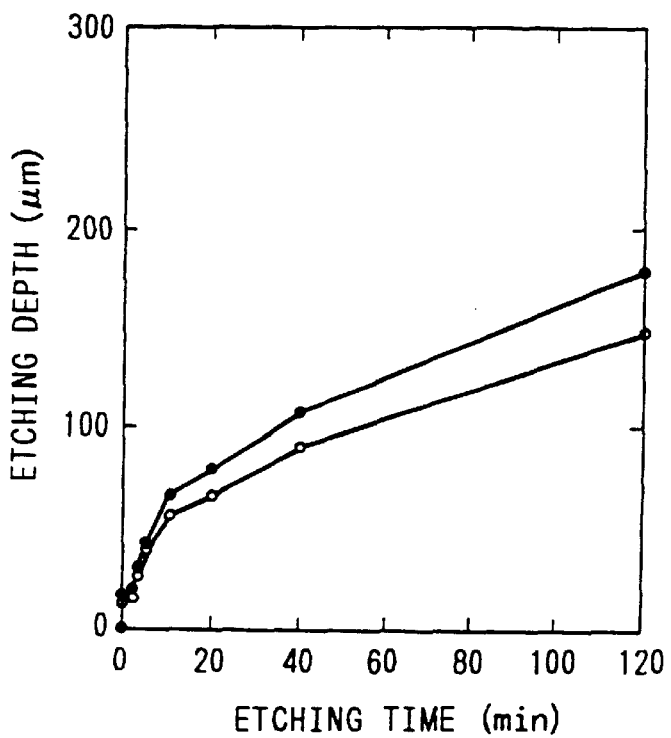

FIG. 7G shows the time dependency of etching thickness of porous Si as observed when the porous Si is immersed in the mixed solution of the buffered hydrofluoric acid and hydrogen peroxide followed by agitation. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 ($mA \cdot cm^{-2}$)

Anodizing solution: $HF:H_2O:C_2H_5OH=1:1:1$

Time: 2.4 (hours)

Thickness of porous Si: 300 ($\mu$m)

Porosity: 56 (%)

Test pieces of the porous Si prepared as described above were immersed, followed by agitation, in a mixture solution of the buffered hydrofluoric acid and hydrogen peroxide (1:5) (white circles) and in a mixture solution of the buffered hydrofluoric acid and hydrogen peroxide (5:1) (black circles). The reductions in the thicknesses of the porous Si test pieces were then measured. Large rates of etching of the porous Si were observed: namely, in the case of the 1:5 mixture solution, the porous Si was etched by 88 $\mu$m and, in case of the 5:1 mixture solution, the porous Si was etched by 105 $\mu$m, in about 40 minutes. After elapse of 120 minutes, the porous Si was etched by a thickness as large as 147 $\mu$m in the case of the 1:5 mixture and 177 $\mu$m in the case of the Si mixture solution, with high degrees of states of the etched surfaces. In this case, the concentration of hydrogen peroxide was 30%. This, however, is only illustrative and the concentration of hydrogen peroxide is suitably selected within a range which does not impair the effect of addition of hydrogen peroxide. The etching rate has dependencies on the solution densities of the buffered hydrofluoric acid and hydrogen peroxide, as well as on the temperature of the same. The addition of hydrogen peroxide accelerates the oxidation of silicon, thus attaining a higher reaction speed as compared to the case where hydrogen peroxide is not added. In addition, the reaction speed can be controlled by suitably determining the content of hydrogen peroxide.

The density of the solution and the temperature of the same are determined to fall within the ranges which would not cause any practical inconvenience in commercial production. Although the mixture solution of the buffered hydrofluoric acid and hydrogen peroxide (1:5) and the mixture solution of the buffered hydrofluoric acid and hydrogen peroxide (5:1), as well as the room temperature as the solution temperature, are mentioned, these solution densities and temperature are only illustrative and are not intended to restrict the scope of the invention.

The HF concentration in the buffered hydrofluoric acid with respect to the etching solution preferably ranges between 1 and 95%, more preferably between 1 and 85% and most preferably between 1 and 70%. The concentration of $NH_4$ in the buffered hydrofluoric acid with respect to the etching solution is preferably selected to range between 1 and 95%, more preferably between 5 and 90% and most preferably between 5 and 80%. The concentration of $H_2O_2$ with respect to the etching solution is preferably 1 to 95 % more preferably 5 to 90% and most preferably 10 to 80 %, and is determined to make the effect of addition of the hydrogen peroxide. The temperature is selected to range preferably 0 to 100° C., more preferably 5 to 80° C. and most preferably 5 to 600C.

The porous Si after the etching was rinsed with water and the rinsed surface was examined by microanalysis by using secondary ions but no impurity was detected.

Figure 6G:
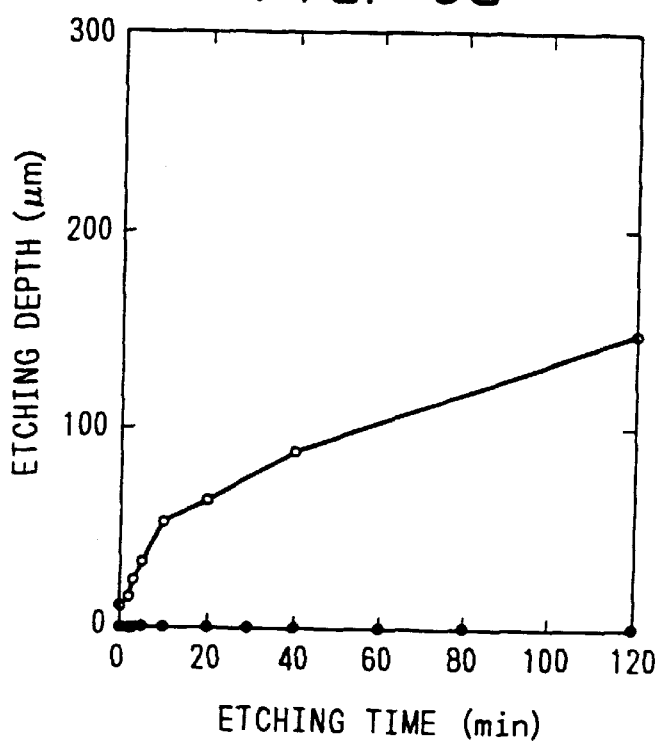
Figure 6H:
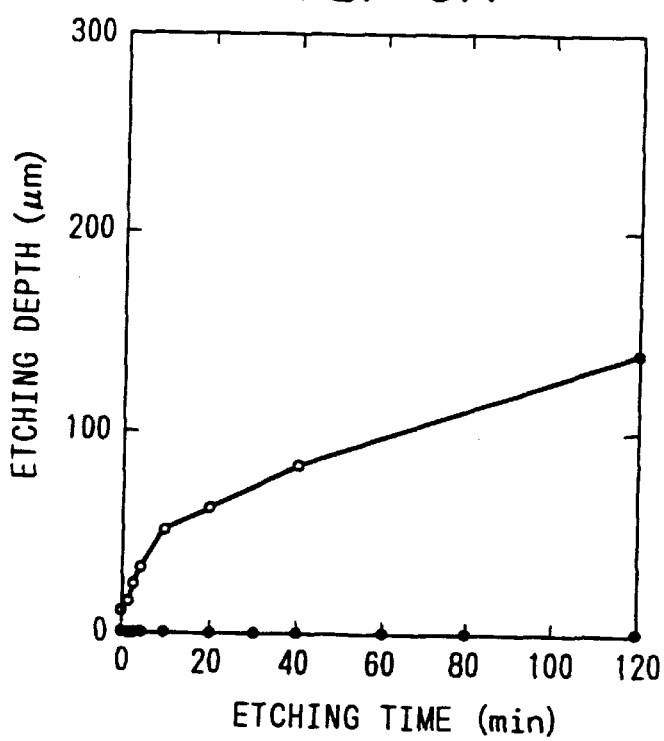

A description will now be given of the etching characteristics of porous Si and non-porous Si as observed when they are etched by the mixture solution of the buffered hydrofluoric acid and hydrogen peroxide, with specific reference to FIG. 6G. FIG. 6G shows the time dependencies of etching thickness of porous Si and monocrystalline Si as observed when the porous Si and the monocrystalline Si are immersed in the mixture solution of the buffered hydrofluoric acid hydrogen peroxide. The porous Si was formed by anodization of monocrystalline Si conducted under the same conditions as those shown before. The use of monocrystalline Si as the starting material for forming porous Si through anodization is only illustrative and Si of other crystalline structures can be used as the starting material.

A test piece of porous Si prepared as described above was immersed, followed by agitation, in the mixture solution of the buffered hydrofluoric acid and hydrogen peroxide (1:5) (white circles) at the room temperature, and reduction in the thickness of the porous Si was measured. The porous Si was rapidly etched: namely, by a thickness of 88 $\mu$m in 40 minutes and 147 $\mu$m in 120 minutes, with high degrees of surface quality and uniformity. Although in this case the concentration of hydrogen peroxide was 30%, this is only illustrative and the content of hydrogen peroxide is suitably selected within a range which does not cause any practical inconvenience and which does not impair the effect produced by the addition of hydrogen peroxide.

Both the porous and non-porous Si test pieces after the etching were rinsed with water and the surface states of these test pieces were examined by microanalysis with secondary ions but no impurity was detected.

Obviously, various etching methods explained in connection with (1) by making reference to FIGS. 1A and 1B, FIGS. 2A and 2B, FIGS. 3A to 3C and FIGS. 4A to 4C can be realized also in the case where the mixture solution of the buffered hydrofluoric acid and alcohol is used as the etching solution.

I-(8)

The following will now be given of the case where a mixture solution of a buffered hydrofluoric acid, an alcohol and hydrogen peroxide is used as the electroless wet chemical etching solution for porous Si, with reference to FIG. 7H. For instance, an aqueous solution containing 36.2% of ammonium fluoride ($NH_4F$) and 4.5% of hydrogen fluoride (HF) is used as the buffered hydrofluoric acid.

Figure 7H:
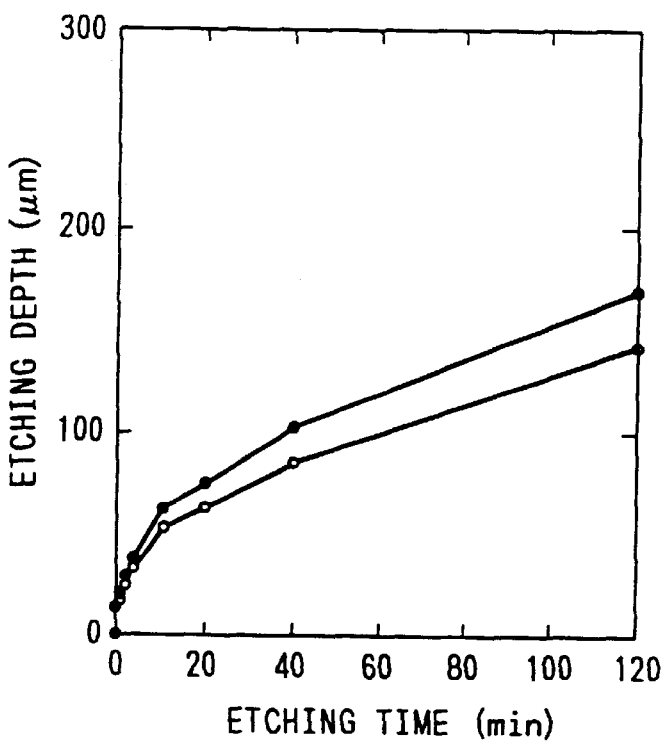

FIG. 7H shows the time dependency of etching thickness of porous Si as observed when the porous Si is immersed in the mixed solution of the buffered hydrofluoric acid, ethyl alcohol and hydrogen peroxide without agitation. The porous Si was formed by anodizing monocrystalline Si under the conditions shown below. The use of the monocrystalline Si as the starting material for forming the porous Si structure through anodization is only illustrative and Si of other crystalline structures can be used as the starting material.

Voltage applied: 2.6 (V)

Current density: 30 ($mA \cdot cm^{-2}$)

Anodizing solution: $HF:H_2O:C_2H_5OH=1:1:1$

Time: 2.4 (hours)

Thickness of porous Si: 300 ($\mu$m)

Porosity: 56 (%)

Test pieces of the porous Si prepared as described above were immersed, without agitation, in a mixture solution of the buffered hydrofluoric acid, ethyl alcohol and hydrogen peroxide (10:6:50) (white circles) and in a mixture solution of the buffered hydrofluoric acid, ethyl alcohol and hydrogen peroxide (50:6:10) (black circles). The reductions in the thicknesses of the porous Si test pieces were then measured. Large rates of etching of the porous Si were observed: namely, in the case of the 10:6:50 mixture solution, the porous Si was etched by 83 $\mu$m and, in case of the 50:6:10 mixture solution, the porous Si was etched by 100 $\mu$m, in about 40 minutes. After elapse of 120 minutes, the porous Si was etched by a thickness as large as 140 $\mu$m in the case of the. 10:6:50 mixture and 168 $\mu$m in the case of the 50:6:10 mixture solution, with high degrees of states of the etched surfaces. In this case, the concentration of hydrogen peroxide was 30%. This, however, is only illustrative and the concentration of hydrogen peroxide is suitably selected within a range which does not impair the effect of addition of hydrogen peroxide. The etching rate has dependencies on the concentrations of the buffered hydrofluoric acid and hydrogen peroxide, as well as on the temperature of the same. The addition of hydrogen peroxide accelerates the oxidation of silicon, thus attaining a higher reaction speed as compared to the case where hydrogen peroxide is not added. In addition, the reaction speed can be controlled by suitably determining the ratio of hydrogen peroxide. The addition of alcohol enables bubbles of reaction products gases generated as a result of the etching to be removed from the surface being etched, without delay and without agitation, thus making it possible to etch the porous Si uniformly and with high efficiency.

The concentrations of the solution and the temperature of the solution are determined to fall within the ranges which provide the above effects of the use of the buffered hydrofluoric acid, hydrogen peroxide and the alcohol and which would not cause any practical inconvenience in commercial production. Although the mixture solution of the buffered hydrofluoric acid, ethyl alcohol and hydrogen peroxide (10:6:50) and the mixture solution of the buffered hydrofluoric acid, ethyl alcohol and hydrogen peroxide (50:6:10), as well as the room temperature as the solution temperature, are mentioned, these solution ratio and temperature are only illustrative and are not intended to restrict the scope of the invention.

The HF concentration in the buffered hydrofluoric acid with respect to the etching solution preferably ranges between 1 and 95%, more preferably between 1 and 85% and most preferably between 1 and 70%. The concentration of $NH_4F$ in the buffered hydrofluoric acid with respect to the etching solution is preferably selected to range between 1 and 95%, more preferably between 5 and 90% and most preferably between 5 and 80%. The concentration of $H_2O_2$ with respect to the etching solution is preferably 1 to 95 %, more preferably 5 to 90% and most preferably 10 to 80 %, and is determined to make the effect of addition of the alcohol appreciable. The concentration of the alcohol with respect to the etching solution is preferably 80% or less, more preferably 60% or less and most preferably 40 t or less, and is determined to make the effect of addition of the alcohol appreciable. The temperature is selected to range preferably 0 to 100° C., more preferably 5 to 80° C. and most preferably 5 to 600C.

Although ethyl alcohol has been specifically mentioned, other alcohols such as isopropyl alcohol, which does not cause any inconvenience in the commercial production and which can provide an appreciable effect of addition of such alcohol, may be used as the alcohol used in this type of etching solution.

The porous Si after the etching was rinsed with water and the rinsed surface was examined by microanalysis by using secondary ions but no impurity was detected.

This etching solution enables bubbles of reaction product gases generated by the etching to be removed from the surface being etched, without delay and without requiring agitation, so that the etching can be performed with high degrees of smoothness and uniformity at the bottoms of minute recesses of the surface to be etched.

Clearly, embodiments explained in the above (1) by making reference to FIGS. 1A and 1B, FIGS. 2A and 2B, FIGS. 3A to 3C and FIGS. 4A to 4C can be realized also in the case where the mixture solution of the buffered hydrofluoric acid, alcohol and hydrogen peroxide is used as the etching solution.

II. The following will now be given of a process of the invention for producing a semiconductor member.

As explained before, the first embodiment of the process for producing the semiconductor member in accordance with the present invention has the following features.

Namely, the first embodiment of the process of the invention for producing a semiconductor member comprises the steps of: forming a member having a non-porous silicon monocrystalline layer and a porous silicon layer; bonding to the monocrystalline layer a member having an insulating material surface; and removing by etching the porous silicon layer by immersing it in hydrofluoric acid.

As explained before, the second embodiment of the process of the invention for producing a semiconductor member uses the same steps as those in the method of the first embodiment, except that, in place of the hydrofluoric acid used in the first embodiment, one of the second to eighth embodiments of the etching solutions mentioned before.

The third to sixth embodiments of the process of the invention for producing a semiconductor member, which also were explained before, are more practical embodiments of the first and the second embodiments of the process of the invention. The process of the present invention for producing a semiconductor member will be described hereinafter with. reference to the third to sixth embodiments.

II-(1) The third embodiment of the process of the invention for producing a semiconductor member will be described with reference to the drawings.

Embodiment 1

Figure 8A:
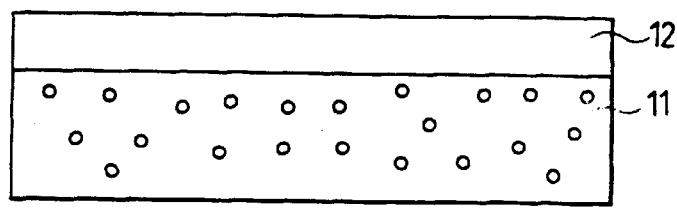
FIGS. 8A to 8C are schematic views explaining a process for preparing a semiconductor member of this invention.
Figure 8B:
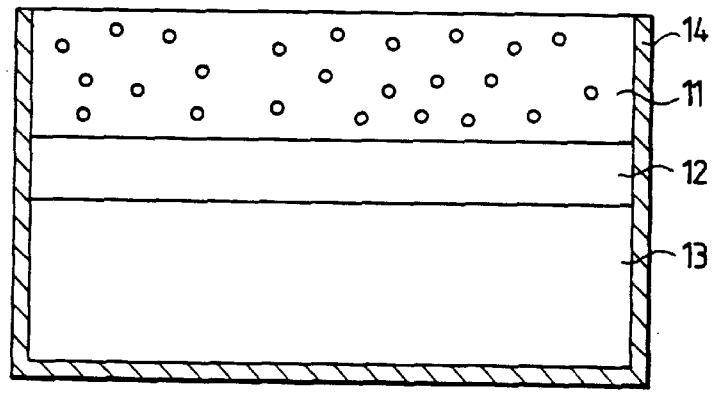
Figure 8C:
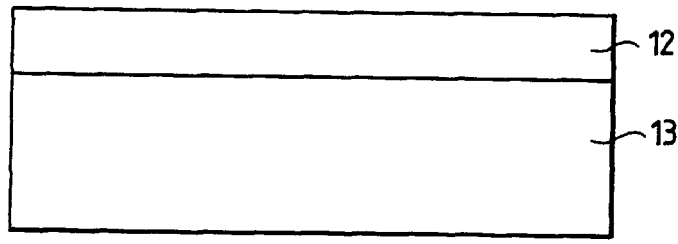

The following will be first given of a method in which the whole member is changed into porous structure and then a monocrystalline layer is formed on the porous structure by epitaxial growth method. FIGS. 8A to 8C are schematic sectional views of the semiconductor member illustrating each of steps of the process.

Referring to FIG. 8A, as the first step, an Si monocrystalline semiconductor member 11 is prepared and is wholly changed into porous structure and, then, an epitaxial growth method is applied to one surface of the porous member, thereby forming a thin film of monocrystalline Si layer 12. The porous structure of Si member is formed by, for example, an anodization employing an HF solution. The initial monocrystalline Si having the density of 2.33 g/cm$^3$ can be changed into a porous Si member the density of which can be varied within the range between 1.1 and 0.6 g/cm$^3$ by varying the HF concentration of the etching solution between 50% and 20%.

Referring now to FIG. 8B, a light-transmissive substrate 13, which is typically a glass sheet, is prepared and bonded on the surface of the monocrystalline Si layer 12 on the porous Si member. Subsequently, an $Si_3N_4$ layer 14 is formed by deposition as an anti-etching film to cover the entire member composed of the layer 12 and the substrate 13 and the $Si_3N_4$ layer on the porous Si member 11 is removed. Although $Si_3N_4$ layer is suitably used as the anti-etching layer, it is possible to use other materials such as Apiezon wax as the material of the anti-etching layer. The porous Si member 11 is then immersed in the etching solution of the present invention and the solution is agitated so that only the porous Si is etched by electroless chemical etching, whereby a thinned non-porous monocrystalline silicon layer 12 is left on the light-transmissive substrate 13.

FIG. 8C shows the semiconductor member obtained by the present process. It will be said that, as a result of the removal of the anti-etching $Si_3N_4$ layer 14 in the step shown in FIG. 8B, a monocrystalline Si layer 12 having a crystallinity equivalent to that of a silicon wafer is formed on the light-transmissive substrate 13 with high degrees of smoothness and uniformity and with a small thickness, over a wide area covering the whole surface of the wafer.

The semiconductor member thus obtained is advantageous from the view point of production of an insulation-isolated electronic device.

Embodiment 2

The following will now be given of a process in which an N-type layer is formed before changing the initial member into porous structure and, subsequently to the formation of the P-type layer, a selective anodization is effected to change only the P-type substrate into porous structure.

Figure 9A:
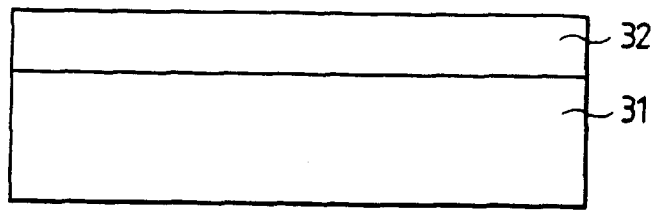
FIGS. 9A to 9D are schematic views explaining a process for preparing a semiconductor member of this invention.

Referring to FIG. 9A, as the first step, a layer 32 of a low impurity concentration is formed on the surface of a P-type Si monocrystalline substrate 31, by an epitaxial growth. Alternatively, an N-type monocrystalline layer 32 may be formed on the surface of the P-type Si monocrystalline substrate 31 by ion-implantation of proton.

Figure 9B:
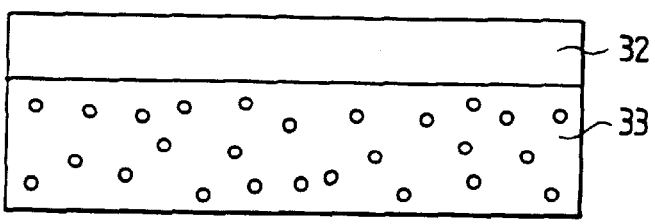

Then, as shown in FIG. 9B, the P-type Si monocrystalline substrate 31 is changed into a porous Si substrate 33 by effecting, on the reverse side of the P-type Si monocrystalline substrate 31, an anodization using, for example, an HF solution. The initial monocrystalline Si having the density of 2.33 g/cm$^3$ can be changed into a porous member the density of which can be varied within the range between 1.1 and 0.6 g/cm$^3$ by varying the HF concentration of the etching solution between 50% and 20%.

Figure 9C:
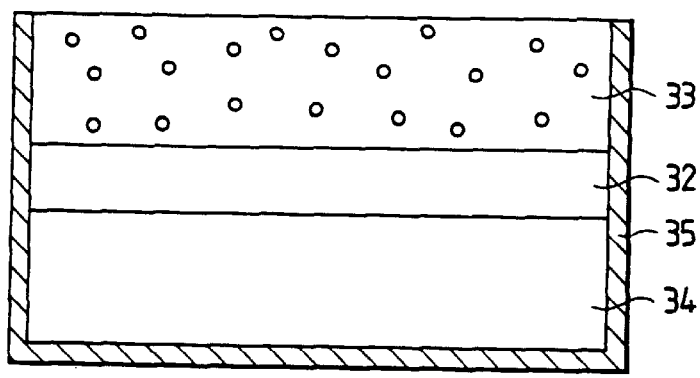

Referring now to FIG. 9C, a light-transmissive substrate 34, which is typically a glass sheet, is prepared and bonded on the surface of the monocrystalline Si layer 32 on the porous Si member. Subsequently, an $Si_3N_4$ layer 35 is formed by deposition as an anti-etching film to cover the entire member composed of the layer 32 and the substrate 34 and the $Si_3N_4$ layer on the porous Si member 33 is removed. Although $Si_3N_4$ layer is suitably used as the anti-etching layer, it is possible to use other materials such as Apiezon wax as the material of the anti-etching layer. The porous Si substrate 33 is then immersed in the etching solution of the present invention and the solution is agitated so that only the porous Si is etched by electroless chemical etching, whereby a thinned non-porous monocrystalline silicon layer 32 is left on the light-transmissive substrate 34.

Figure 9D:
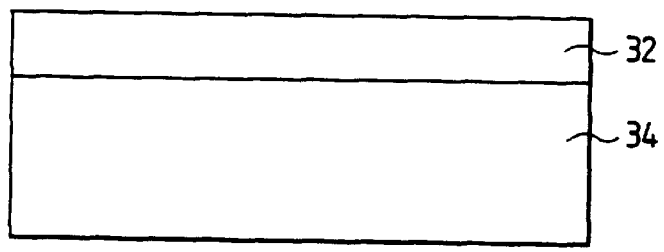

FIG. 9D shows the semiconductor member obtained by the present process. That is, as a result of the removal of the anti-etching $Si_3N_4$ layer in the step shown in FIG. 9D, a monocrystalline Si layer 32 having a crystallinity equivalent to that of a silicon wafer is formed on the light-transmissive substrate 34 with high degrees of smoothness and uniformity and with a small thickness, over a wide area covering the whole surface of the wafer.

The semiconductor member thus obtained is advantageous from the view point of production of an insulation-isolated electronic device.

According to the result of an observation by a transmission electron microscope, micro-pores of an average diameter of about 600 Angstrom are formed in the porous Si layer, so that the density of the layer has been reduced half or below that of the monocrystalline Si.

Nevertheless, the monocrystallinity is still maintained, so that it is possible to form a monocrystalline Si layer on the porous layer by epitaxial growth. When the temperature exceeds 1000° C., rearrangement of internal pores occurs, which impedes the acceleration of the etching. For this reason, the epitaxial growth of the Si layer is preferably effected by a low-temperature growth method such as, for example, a molecule-ray epitaxial growth method, a CVD method such as plasma CVD method, low-pressure CVD method or photo-CVD method, a bias sputter method or a liquid-phase growth method.

II-(2)

The fourth embodiment of the process of the invention of producing a semiconductor member will be described with reference to the drawings.

Embodiment 1

Figure 10A:
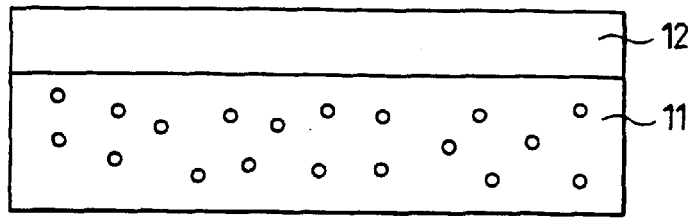
FIGS. 10A to 10C are schematic views explaining a process for preparing a semiconductor member of this invention.
Figure 10B:
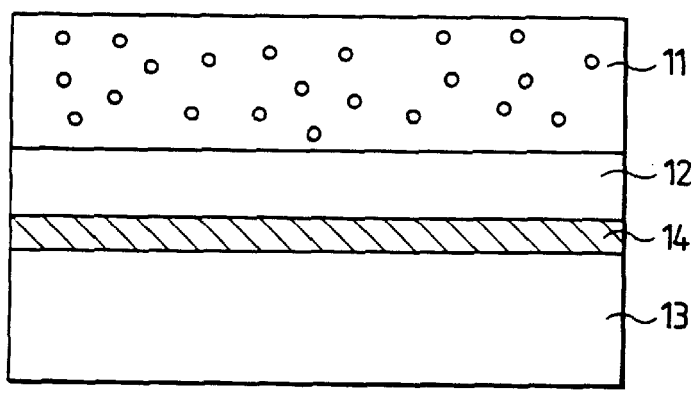
Figure 10C:
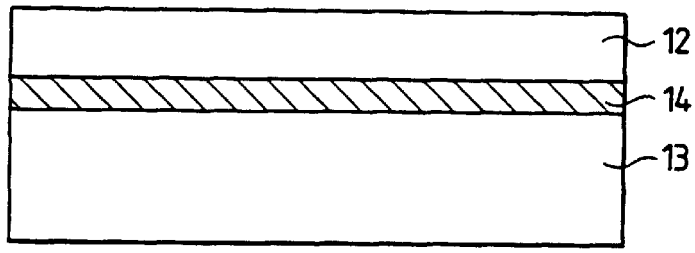

The following will be first given of a form in which the whole P- or high-density N-type substrate is changed into porous structure and then a monocrystalline layer is formed on the porous structure by epitaxial growth method. FIGS. 10A to 10C are schematic sectional views of the semiconductor member illustrating each of steps of the process.

Referring to FIG. 10A, as the first step, an Si monocrystalline semiconductor member 11 of P-type (or high-density N-type) is prepared and is wholly changed into porous structure and, then, an epitaxial growth is effected by a suitable method on the surface of the porous member, thereby forming a thin film of monocrystalline Si layer 12. The porous structure is formed by, for example, an anodization employing an HF solution. The initial monocrystalline Si having the density of 2.33 g/cm$^3$ can be changed into a porous member the density of which can be varied within the range between 1.1 and 0.6 g/cm$^3$ by varying the HF concentration of the etching solution between 50% and 20%.

Referring now to FIG. 10B, another Si substrate 13 is prepared and an insulating layer (silicon oxide layer) 14 is formed on the surface of this Si substrate 13. Subsequently, the surface of the insulating layer 14 of the Si substrate 13 is bonded to the surface of the monocrystalline layer 12 on the porous Si substrate. The whole structure 11–14 composed of the substrates and layers to 14 is then immersed in the etching solution of the present invention and the solution is agitated so that only the porous Si is etched by electroless wet chemical etching, whereby a thinned non-porous monocrystalline silicon layer 12 is left on the insulating layer 14.

FIG. 10C shows the semiconductor member obtained by the present process. That is, the monocrystalline Si layer 12 having a crystallinity equivalent to that of a silicon wafer is formed on the insulating layer 14 on the Si substrate 13 with high degrees of smoothness and uniformity and with a small thickness, over a wide area covering the whole surface of the wafer.

The semiconductor member thus obtained is advantageous from the view point of production of an insulation-isolated electronic device.

Embodiment 2

The following will now be given of a process in which an N-type layer is formed before changing the initial member into porous structure and, subsequently to the formation of the N-type layer, a selective anodization is effected to change only the P-type substrate or the high-density N-type substrate into porous structure. FIGS. 11A to 11D show, in schematic sectional views, the semiconductor member in different steps of the production process.

Figure 11A:
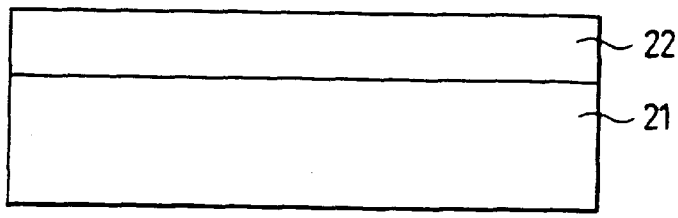
FIGS. 11A to 11D are schematic views explaining a process for preparing a semiconductor member of this invention.

Referring to FIG. 11A, as the first step, a layer 22 of a low impurity concentration is formed on the surface of a P-type (or high-density N-type) Si monocrystalline substrate 21, by an epitaxial growth performed by a suitable method. Alternatively, an N-type monocrystalline layer 22 may be formed on the surface of the P-type Si monocrystalline substrate 21 by ion-implantation of proton.

Figure 11B:
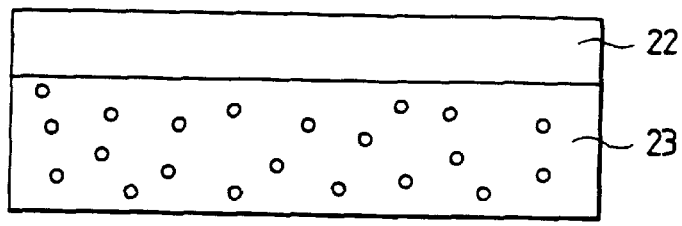

Then, as shown in FIG. 11B, the P-type Si monocrystalline substrate 21 is changed into a porous Si substrate 23 by effecting, on the reverse side of the P-type monocrystalline substrate 21, an anodization using, for example, an HF solution. The initial monocrystalline Si having the density of 2.33 g/cm$^3$ can be changed into a porous member the density of which can be varied within the range between 1.1 and 0.6 g/cm$^3$ by varying the HF concentration of the etching solution between 50% and 20%.

Figure 11C:
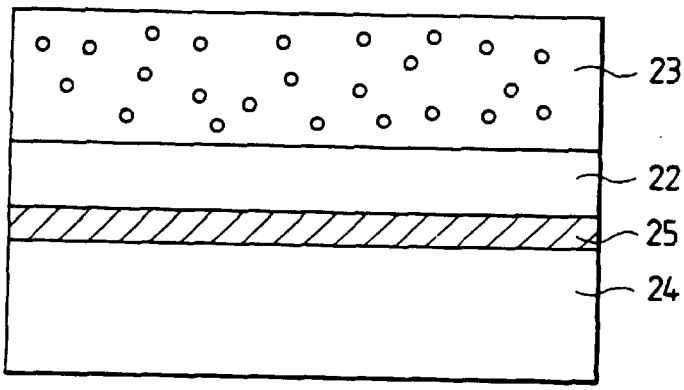

Referring now to FIG. 11C, another Si substrate 24 is prepared and an insulating layer 25 (silicon oxide layer) is formed on the surface of the Si substrate 24. Then, the insulating layer 25 on the Si substrate 24 is bonded to the surface of the monocrystalline Si layer 22 on the porous substrate. Subsequently, the whole structure composed of the substrates and layers 22 to 25 is immersed in the etching solution of the present invention and the solution is agitated so that only the porous Si is etched by electroless chemical etching, whereby a thinned non-porous monocrystalline silicon layer 22 is left on the insulating layer 25.

Figure 11D:
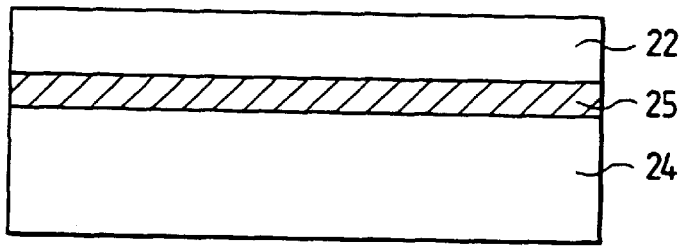

FIG. 11D shows the semiconductor member obtained by the present process. That is, a monocrystalline Si layer 22 having a crystallinity equivalent to that of a silicon wafer is formed on the insulating layer 25 with high degrees of smoothness and uniformity and with a small thickness, over a wide area covering the whole surface of the wafer.

The semiconductor member thus obtained is advantageous from the view point of production of an insulation-isolated electronic device.

II-(3)

The fifth embodiment of the process of the invention will be described with reference to the drawings. A description will be first given of a form in which the whole Si substrate is changed into porous structure and then a monocrystalline layer is formed on the porous structure by epitaxial growth method.

Figure 12A:
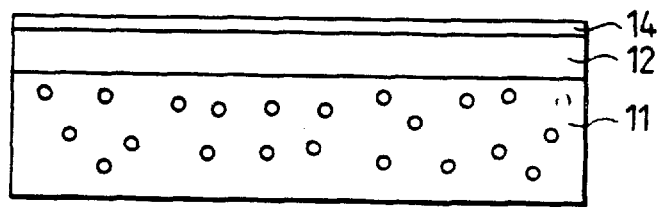
FIGS. 12A to 12C are schematic views explaining a process for preparing a semiconductor member of this invention.

Referring to FIG. 12A, as the first step, an Si monocrystalline substrate 11 is prepared and is wholly changed into porous structure and, then, an epitaxial growth is effected by a suitable method on the surface of the porous substrate, thereby forming a thin film monocrystalline layer 12. The porous structure is formed by, for example, an anodization employing an HF solution. The initial monocrystalline Si having the density of 2.33 g/cm³ can be changed into a porous Si layer the density of which can be varied within the range between 1.1 and 0.6 g/cm³ by varying the HF concentration of the etching solution between 50% and 20%. The porous layer is tended to form in a P type Si substrate. A transmission electromicroscopic observation showed that the porous Si layer thus formed has micropores of a mean diameter of about 600 Angstroms.

Figure 12B:
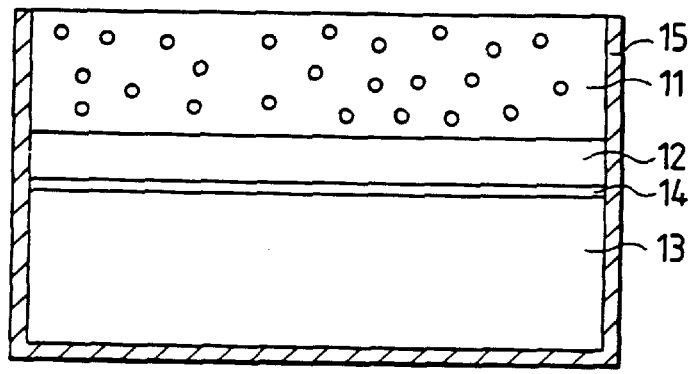

Referring now to FIG. 12B, a light-transmissive substrate 13, which is typically a glass sheet, is prepared. Then, the surface of the monocrystalline Si layer on the porous Si substrate is oxidized to form an oxide layer 14. The above-mentioned light-transmissive substrate 13 is then bonded on the surface of the oxide layer 14. This oxide layer plays an important role formation of device. Namely, with such an oxide layer, the interface level generated at the interface under the Si active layer can be made lower as compared with the glass interface, so that the characteristics of the electronic device can be remarkably improved.

Referring further to FIG. 12B, and $Si_3N_4$ layer 15 is deposited as an anti-etching film (protective material) to cover the entire member composed of the two substrates bonded together, and the $Si_3N_4$ layer on the surface of porous Si substrate is removed. Although $Si_3N_4$ layer is suitably used as the anti-etching layer, it is possible to use other materials such as Apiezon wax as the material of the anti-etching layer. The porous Si substrate 11 is then immersed in the etching solution of the present invention with agitating so that only the porous Si is etched by electroless chemical etching, whereby a thinned monocrystalline silicon layer is left on the light-transmissive substrate 13.

Figure 12C:
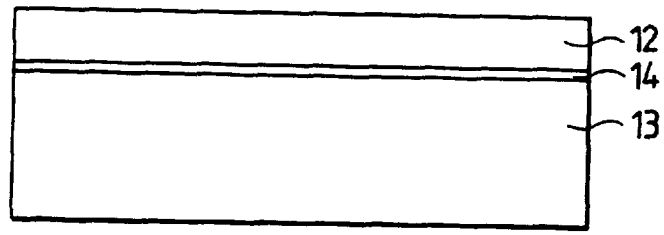

FIG. 12C shows the semiconductor member obtained by the described process. It will be seen that, as a result of the removal of the anti-etching $Si_3N_4$ layer 15 in the step shown in FIG. 12B, a monocrystalline Si layer 12 having a crystallinity equivalent to that of a silicon wafer is formed on the light-transmissive substrate 13 with high degree of smoothness and uniformity and with a small thickness, over a wide area covering the whole surface of the wafer.

The semiconductor member thus obtained is advantageous from the view point of production of an insulation-isolated electronic device.

II-(4)

The sixth embodiment of the process of the invention for producing a semiconductor member will now be described.

Embodiment 1

A description will be first given of a form in which the whole Si substrate is changed into porous structure and then a monocrystalline layer is formed by epitaxial growth method.

Figure 13A:
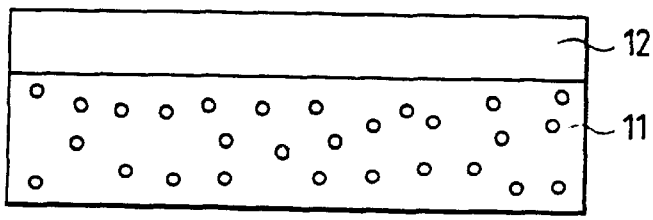
FIGS. 13A to 13C are schematic views explaining a process for preparing a semiconductor member of this invention.
Figure 13B:
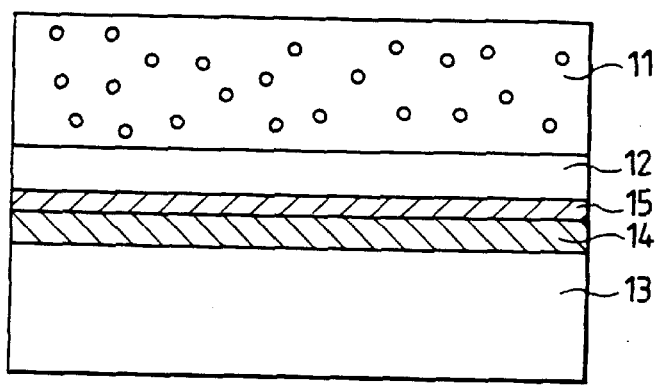
Figure 13C:
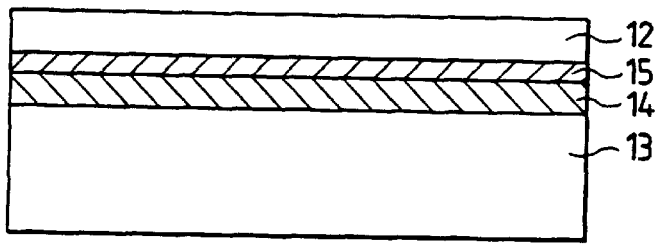

FIGS. 13A to 13C illustrate successive steps of the first embodiment in accordance with the invention.

Referring to FIG. 13A, as the first step, an Si monocrystalline substrate is prepared and is wholly changed into porous structure (11). Then, an epitaxial growth is effected by a suitable method on the surface of the porous substrate, thereby forming a thin film of monocrystalline layer 12. The porous structure is formed by, for example, an anodization employing an HF solution. The initial monocrystalline Si having the density of 2.33 g/cm³ can be changed into a porous Si layer the density of which can be varied within the range between 1.1 and 0.6 g/cm³ by varying the HF concentration of the etching solution between 50% and 20%. A transmission electromicroscopic observation showed that the porous Si layer thus formed has micropores of a mean diameter of about 600 Angstroms.

Referring now to FIG. 13B, another Si substrate 13 is prepared and an insulating material 14 is formed on the surface. Then the Si substrate having the insulating material 14 is bonded to the surface of an oxide layer 15 which is formed on the monocrystalline Si layer carried by the porous Si substrate. The insulating material 14 may be a deposited silicon oxide, nitride, nitrided oxide, or tantalum, not to mention the insulating layer of Si. The bonding step may be conducted by adhering closely the rinsed surfaces, and heating both substrate in an oxygen atmosphere or a nitrogen atmosphere. The oxide layer 15 is formed for the purpose of reducing the interface level of the monocrystalline layer 12 which is the final active layer.

Then, as shown in FIG. 13C, the porous Si substrate 11 is immersed in the etching solution of the present invention and the solution is agitated, so that only the porous Si is etched by electroless wet chemical etching so as to leave a thinned monocrystalline Si layer on the insulating material. FIG. 13C shows the semiconductor substrate obtained according to the present invention. As a result, a monocrystalline Si layer 12 having crystallinity equivalent to that of a silicon wafer is formed on the insulated substrate 13 through the intermediary of the insulating material 14 and the oxide layer 15, with high degrees of smoothness and uniformity and with a small thickness over a wide area covering the whole surface of the wafer.

The semiconductor member thus obtained is advantageous from the view point of production of an insulation-isolated electronic device.

Embodiment 2

A second embodiment will be described with reference to the drawings.

FIGS. 14A to 14D show, in schematic sectional views, the second embodiment according to the present invention.

Figure 14A:
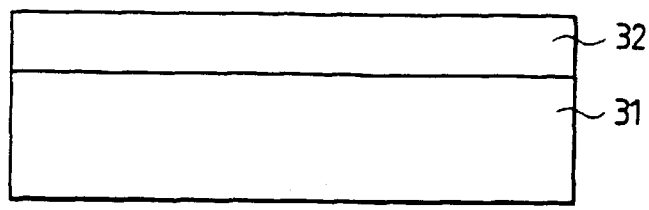
FIGS. 14A to 14D are schematic views explaining a process for preparing a semiconductor member of this invention.

Referring to FIG. 14A, as the first step, a layer 32 of a low impurity concentration is formed on the surface of a P-type Si monocrystalline substrate 31, by an epitaxial growth performed by a suitable method. Alternatively, an N-type monocrystalline layer 32 may be formed on the surface of the P-type Si monocrystalline substrate 21 by implantation of proton.

Figure 14B:
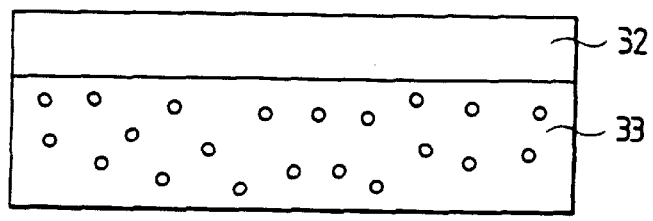

Then, as shown in FIG. 14B, the P-type Si monocrystalline substrate 31 is changed into a porous Si substrate 33 by effecting, on the reverse side of the P-type Si monocrystalline substrate 31 by anodization using, for example, an HF solution. The initial monocrystalline Si having the density of 2.33 g/cm³ can be changed into a porous member the density of which can be varied within the range between 1.1 and 0.6 g/cm³ by varying the HF concentration of the etching solution between 50% and 20 %. As explained before, this porous layer is formed in the P-type substrate.

Figure 14C:
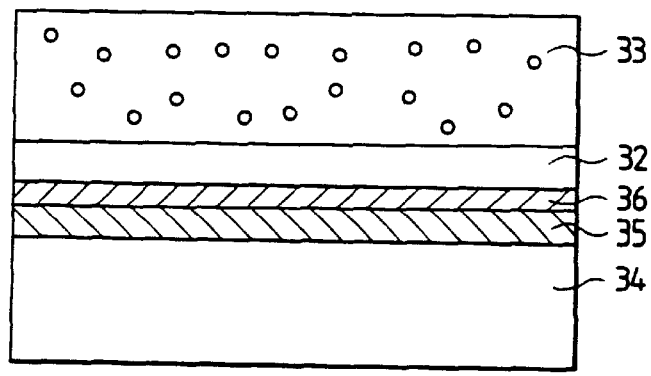

Referring now to FIG. 14C, another Si substrate 34 is prepared and an insulating layer 35 is formed on the surface of the Si substrate 34. Then, the Si substrate 34 having the insulating layer 35 is bonded to the surface of the oxide layer 36 formed on the monocrystalline Si layer on the porous Si substrate. Then, the porous Si substrate is immersed in the etching solution of the present invention and the solution is agitated so that only the porous Si is etched by electroless chemical etching, whereby a thinned non-porous monocrystalline silicon layer is left on the insulating layer.

Figure 14D:
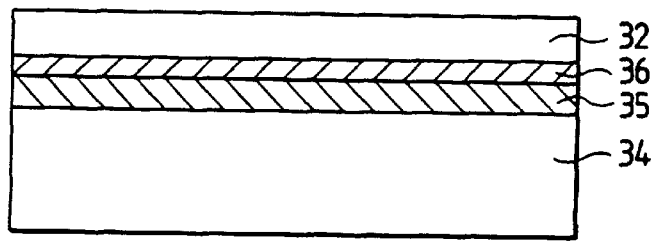

FIG. 14D shows the semiconductor substrate obtained by the described process. It will be seen that a monocrystalline Si layer 32 having a crystallinity equivalent to that of a silicon wafer is formed on the insulated substrate 34 through the intermediary of the oxide layer 36 and the insulation layer 35, with high degrees of smoothness and uniformity and with a small thickness, over a wide area covering the whole surface of the wafer.

The semiconductor member thus obtained is advantageous from the view point of production of an insulation-isolated electronic device.

The processes described above are the type in which the N-type layer is formed prior to changing into porous structure and then only the P-type substrate is selectively changed into porous structure by anodization.

III. The present invention will be described below in detail by way of examples. However, the invention is not limited to these examples except as defined in the appended claims.

EXAMPLE 1

A porous Si layer 21 was formed to a thickness of 50 μm ($t_2$=50 μm) on the entirety of one of the major surfaces of a monocrystalline Si substrate 22 by anodization (FIG. 1A).

Anodization was performed under the following conditions:

Applied voltage: 2.6 (V)

Current density: 30 (mA·cm$^{-2}$)

Anodizing solution: $HF:H_2O:C_2H_5OH$=1:1:1

Time: 0.4 (hours)

Thickness of porous Si: 50 (μm)

Porosity: 56 (%)

Thereafter, the porous Si/monocrystalline Si substrate was subjected to selective etching using a 49%. HF solution. In thirty-three minutes, the porous Si was selectively etched with the monocrystalline Si acting as an etch stopper, only the monocrystalline Si being left behind, as shown in FIG. 1B.

EXAMPLE 2

Prior to anodization, boron ions were implanted in one of the surfaces of a monocrystalline Si substrate 32 at an average concentration of $1.0\times10^{19}$ cm$^{-3}$ in stripes spaced apart from each other by a distance of 100 μm. As shown in FIG. 2A, porous Si 31 was formed by anodization in stripes spaced apart from each other by a distance ($b_3$=100 μm) of 100 μm, each stripe having a width ($a_3$=100 μm) of 100 μm and a thickness ($t_3$=1 μm) of 1 μm.

Anodization was performed under the following conditions:

Applied voltage: 2.6 (V)

Current density: 30 (mA·cm$^{-2}$)

Anodizing solution: $HF:H_2O:C_2H_5OH$=1:1:1

Thickness of porous Si: 1 (μm)

Porosity: 56 (%)

Figure 2B:
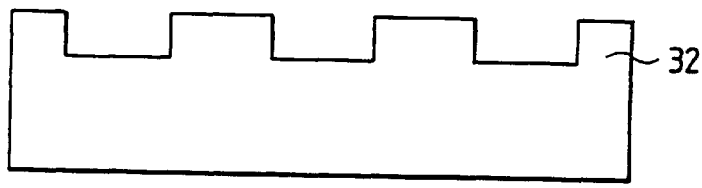

Thereafter, the porous Si/monocrystalline Si substrate was subjected to selective etching using a 49% HF solution. In two minutes, the porous Si was selectively etched, only the monocrystalline Si being left behind, as shown in FIG. 2B.

EXAMPLE 3

A 3 μm ($u_4$=3 μm) thick polycrystalline Si layer 41 was formed on a monocrystalline Si substrate 42 by CVD (FIG. 3A). As shown in FIG. 3B, a surface layer of 2 μm ($t_4$=2 μm) of the polycrystalline Si layer 41 was made porous by anodization to form a porous Si layer 43.

Anodization was performed under the following conditions:

Applied voltage: 2.6 (V)

Current density: 30 (mA·cm$^{-2}$)

Anodizing solution: $HF:H_2O:C_2H_5OH$=1:1:1

Thickness of porous Si: 2 (μm)

Porosity: 56 (%)

Figure 3C:
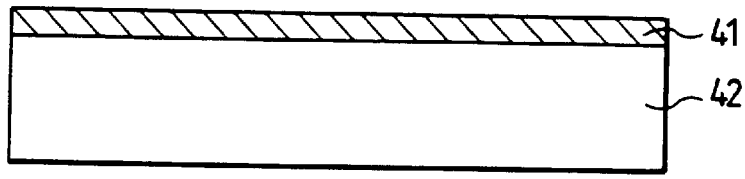

Thereafter, the porous Si/polycrystalline Si/monocrystalline Si substrate was subjected to selective etching using a 49% HF solution. In four minutes, the porous Si was selectively etched with the polycrystalline Si acting as an etch stopper, only the polycrystalline Si and monocrystalline Si being left behind, as shown in FIG. 3C.

EXAMPLE 4

A 3 μm ($u_5$=3 m) thick polycrystalline Si layer 51 was formed on a monocrystalline Si substrate 52 by CVD. Prior to anodization, boron ions were implanted into the surface of the polycrystalline Si layer 51 at $1.0\times10^{19}$ cm$^{-3}$ in stripes spaced apart from each other by a distance of 20 μm. As shown in FIG. 4A, porous Si 53 was formed by anodization in stripes spaced apart from each other by a distance ($b_5$=20 μm) of 20 μm, each stripe having a width ($a_5$=20 μm) of 20 μm and a thickness ($t_5$=1 μm) of 1 μm.

Anodization was performed under the following conditions:

Applied voltage: 2.6 (V)

Current density: 30 (mA·cm$^{-2}$)

Anodizing solution: $HF:H_2O:C_2H_5OH$=1:1:1

Thickness of porous Si: 1 (μm)

Porosity: 56 (%)

Figure 4B:
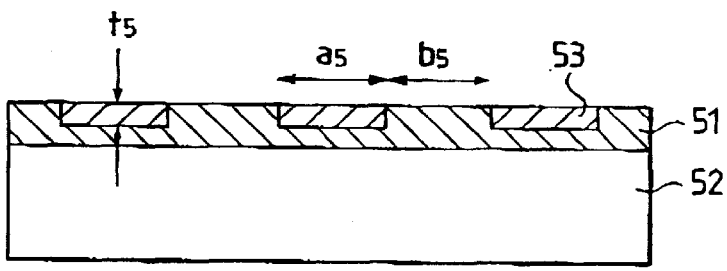
Figure 4C:
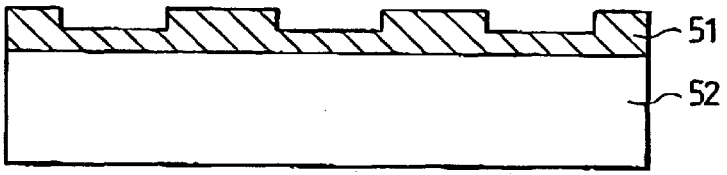

Thereafter, the porous Si/polycrystalline Si/monocrystalline Si substrate was subjected to selective etching using a 49% HF solution. In two minutes, the porous Si was selectively etched, only the polycrystalline Si and monocrystalline Si being left behind, as shown in FIG. 4B.

EXAMPLE 5

Figure 5A:
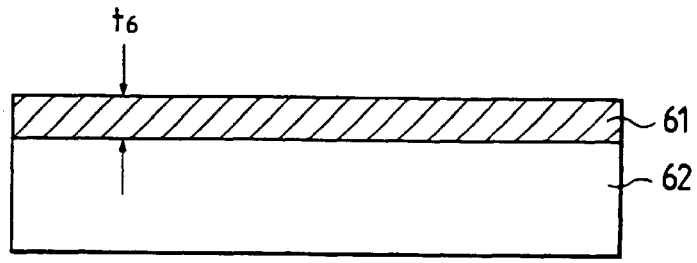
FIGS. 5A to 5D are schematic views explaining an etching step using an etching solution of this invention.

A porous Si layer 61 was formed to a thickness of 50 μm ($t_6$=50 μm) on the entirety of one of the major surfaces of a monocrystalline Si substrate 62 by anodization (FIG. 5A).

Anodization was performed under the following conditions:

Applied voltage: 2.6 (V)

Current density: 30 (mA·cm$^{-2}$)

Anodizing solution: $HF:H_2O:C_2H_5OH$=1:1:1

Time: 0.4 (hour)

Thickness of porous Si: 50 (μm)

Porosity: 56 (%)

Figure 5B:
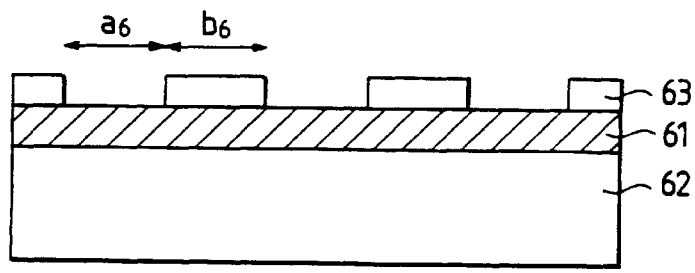

As shown in FIG. 5B, a resist 63 was patterned in stripes spaced apart from each other by a distance ($b_6$=100 μm) of 100 μm, each stripe having a width ($a_6$=100 μm) of 100 μm.

Figure 5C:
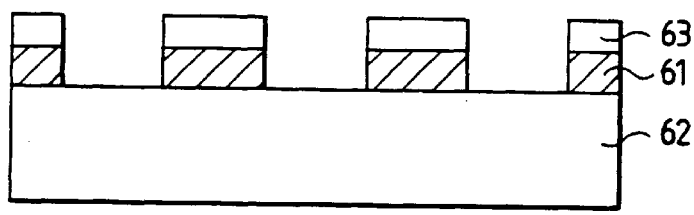

Thereafter, the porous Si/monocrystalline Si substrate was subjected to selective etching using a 49% HF solution. In thirty-three minutes, the porous Si was selectively removed, only the monocrystalline Si being left behind, as shown in FIG. 5C. Finally, the resist was removed (FIG. SD).

EXAMPLE 6

Etching was performed in the same manner as that of Example 1 with the exception that a mixture solution (10:1)

of 49% hydrofluoric acid and ethyl alcohol was used as an etchant. In twenty-nine minutes after initialization of etching, the porous Si was selectively removed with the monocrystalline Si acting as an etch stopper.

EXAMPLE 7

Etching was performed in the same manner as that of Example 2 with the exception that a mixture solution (10:1) of 49% hydrofluoric acid and ethyl alcohol was used as an etchant. In one point seven minutes after initialization of etching, the porous Si was selectively removed, only the monocrystalline Si being left behind.

EXAMPLE 8

Etching was performed in the same manner as that of Example 3 with the exception that a mixture solution (10:1) of 49% hydrofluoric acid and ethyl alcohol was used as an etchant. In three point four minutes after initialization of etching, the porous Si was selectively removed with the polycrystalline Si acting as an etch stopper, only the polycrystalline Si and the monocrystalline Si being left behind, as shown in FIG. 3C.

EXAMPLE 9

Etching was performed in the same manner as that of Example 4 with the exception that a mixture solution (10:1) of 49% hydrofluoric acid and ethyl alcohol was used as an etchant. In one point seven minutes after initialization of etching, the porous Si was selectively removed, only the polycrystalline Si and monocrystalline Si being left behind, as shown in FIG. 4B.

EXAMPLE 10

Figure 5D:
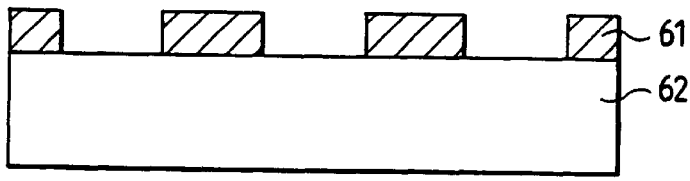

Etching was performed in the same manner as that of Example 5 with the exception that a mixture solution (10:1) of 49% hydrofluoric acid and ethyl alcohol was used as an etchant. In twenty-nine minutes after initialization of etching, the porous Si was selectively removed, only the monocrystalline Si being left behind, as shown in FIG. 5C. Finally,. the resist was removed (FIG. 5D).

EXAMPLE 11

Etching was performed in the same manner as that of Example 1 with the exception that a mixture solution (1:5) of 49% hydrofluoric acid and hydrogen peroxide was used as an etchant. In twenty-one minutes after initialization of etching, the porous Si was selectively removed with the monocrystalline Si acting as an etch stopper, only the monocrystalline Si being left behind, as shown in FIG. 1B.

EXAMPLE 12

Etching was performed in the same manner as that of Example 2 with the exception that a mixture solution (1:5) of 49% hydrofluoric acid and hydrogen peroxide was used as an etchant. In one point three minutes after initialization of etching, the porous Si was selectively removed, only the monocrystalline Si being left behind, as shown in FIG. 2B.

EXAMPLE 13

Etching was performed in the same manner as that of Example 3 with the exception that a mixture solution (1:5) of 49% hydrofluoric acid and hydrogen peroxide was used as an etchant. In two point six minutes after initialization of etching, the porous Si was selectively removed with the polycrystalline Si acting as an etch stopper, only the polycrystalline Si and the monocrystalline Si being left behind, as shown in FIG. 3C.

EXAMPLE 14

Etching was performed in the same manner as that of Example 4 with the exception that a mixture solution (1:5) of 49% hydrofluoric acid and hydrogen peroxide was used as an etchant. In one point three minutes after initialization of etching, only the porous Si was selectively removed, only the polycrystalline Si and monocrystalline Si being left behind, as shown in FIG. 4B.

EXAMPLE 15

Etching was performed in the same manner as that of Example 5 with the exception that a mixture solution (1:5) of 49% hydrofluoric acid and hydrogen peroxide was used as an etchant. In this etching, only the porous Si was selectively removed, leaving the monocrystalline Si behind, as shown in FIG. 5C. Finally, the resist was removed (FIG. 5D).

EXAMPLE 16

Etching was performed in the same manner as that of Example 1 with the exception that a mixture solution (10:6:50) of 49% hydrofluoric acid, ethyl alcohol and hydrogen peroxide was used as an etchant. In twenty-six minutes after initialization of etching, the porous Si was selectively removed with the remaining monocrystalline Si acting as an etch stopper, as shown in FIG. 1B.

EXAMPLE 17

Etching was performed in the same manner as that of Example 2 with the exception that a mixture solution (10:6:50) of 49% hydrofluoric acid, ethyl alcohol and hydrogen peroxide was used as an etchant. In one point four minutes after initialization of etching, the porous Si was selectively removed, only the monocrystalline Si being left behind, as shown in FIG. 2B.

EXAMPLE 18

Etching was performed in the same manner as that of Example 3 with the exception that a mixture solution (10:6:50) of 49% hydrofluoric acid, ethyl alcohol and hydrogen peroxide was used as an etchant. In two point eight minutes after initialization of etching, the porous Si was selectively removed with the polycrystalline Si acting as an etch stopper, only the polycrystalline Si and the monocrystalline Si being left behind, as shown in FIG. 3C.

EXAMPLE 19

Etching was performed in the same manner as that of Example 4 with the exception that a mixture solution (10:6:50) of 49% hydrofluoric acid, ethyl alcohol and hydrogen peroxide was used as an etchant. In one point four minutes after initialization of etching, the porous Si was selectively removed, only the polycrystalline Si and monocrystalline Si being left behind, as shown in FIG. 4B.

EXAMPLE 20

Etching was performed in the same manner as that of Example 5 with the exception that a mixture solution (10:6:50) of 49% hydrofluoric acid, ethyl alcohol and hydrogen peroxide was used as an etchant. In twenty-eight minutes after initialization of etching, the porous Si was selectively removed, only the monocrystalline Si being left behind, as shown in FIG. 5C. Finally, the resist was removed (FIG. 5D).

EXAMPLE 21

Etching was performed in the same manner as that of Example 1 with the exception that a buffered hydrofluoric acid ($NH_4F$: 36.2%, HF: 4.5%) was used as an etchant. In nineteen minutes after initialization of etching, the porous Si was selectively removed with the monocrystalline Si acting as an etch stopper, as shown in FIG. 1B.

EXAMPLE 22

Etching was performed in the same manner as that of Example 2 with the exception that a buffered hydrofluoric acid ($NH_4F$: 36.2%, HF: 4.5%) was used as an etchant. In seven seconds after initialization of etching, only the porous Si was selectively removed, leaving the monocrystalline Si behind, as shown in FIG. 2B.

EXAMPLE 23

Etching was performed in the same manner as that of Example 3 with the exception that a buffered hydrofluoric acid ($NH_4F$: 36.2%, HF: 4.5%) was used as an etchant. In fourteen seconds after initialization of etching, the porous Si was selectively removed with the polycrystalline Si acting as an etch stopper, only the polycrystalline Si and the monocrystalline Si being left behind, as shown in FIG. 3C.

EXAMPLE 24

Etching was performed in the same manner as that of Example 4 with the exception that a buffered hydrofluoric acid ($NH_4F$: 36.2%, HF: 4.5%) was used as an etchant. In seven seconds after initialization of etching, only the porous Si was selectively removed, leaving the polycrystalline Si and monocrystalline Si behind, as shown in FIG. 4B.

EXAMPLE 25

Etching was performed in the same manner as that of Example 5 with the exception that a buffered hydrofluoric acid ($NH_4F$: 36.2%, HF: 4.5%) was used as an etchant. In nineteen minutes after initialization of etching, the porous Si was selectively removed, only the monocrystalline Si being left behind, as shown in FIG. 5C. Finally, the resist was removed (FIG. 5D).

EXAMPLE 26

Etching was performed in the same manner as that of Example 1 with the exception that a mixture solution (10:1) of buffered hydrofluoric acid and ethyl alcohol was used as an etchant. In twenty-one minutes after initialization of etching, the porous Si was selectively removed with the monocrystalline Si acting as an etch stopper, only the monocrystalline Si being left behind, as shown in FIG. 1B.

EXAMPLE 27

Etching was performed in the same manner as that of Example 2 with the exception that a mixture solution (10:1) of buffered hydrofluoric acid and ethyl alcohol was used as an etchant. In seven seconds after initialization of etching, only the porous Si was selectively removed, leaving the monocrystalline Si behind, as shown in FIG. 2B.

EXAMPLE 28

Etching was performed in the same manner as that of Example 3 with the exception that a mixture solution (10:1) of buffered hydrofluoric acid and ethyl alcohol was used as an etchant. In fourteen seconds after initialization of etching, the porous Si was selectively removed with the polycrystalline Si acting as an etch stopper, only the polycrystalline Si and the monocrystalline Si being left behind, as shown in FIG. 3C.

EXAMPLE 29

Etching was performed in the same manner as that of Example 4 with the exception that a mixture solution (10:1) of buffered hydrofluoric acid and ethyl alcohol was used as an etchant. In seven seconds after initialization of etching, only the porous Si was selectively removed, leaving the polycrystalline Si and monocrystalline Si behind, as shown in FIG. 4B.

EXAMPLE 30

Etching was performed in the same manner as that of Example 5 with the exception that a mixture solution (10:1) of buffered hydrofluoric acid and ethyl alcohol was used as an etchant. In twenty-one minutes after initialization of etching, the porous Si was selectively removed, only the monocrystalline Si being left behind, as shown in FIG. 5C. Finally, the resist was removed (FIG. 5D).

EXAMPLE 31

Etching was performed in the same manner as that of Example 1 with the exception that a mixture solution (1:5) of buffered hydrofluoric acid and hydrogen peroxide was used as an etchant. In nine minutes after initialization of etching, the porous Si was selectively removed with the monocrystalline Si acting as an etch stopper, only the monocrystalline Si being left behind, as shown in FIG. 1B.

EXAMPLE 32

Etching was performed in the same manner as that of Example 2 with the exception that a mixture solution (1:5) of buffered hydrofluoric acid and hydrogen peroxide was used as an etchant. In five seconds after initialization of etching, only the porous Si was selectively removed, leaving the monocrystalline Si behind, as shown in FIG. 2B.

EXAMPLE 33

Etching was performed in the same manner as that of Example 3 with the exception that a mixture solution (1:5) of buffered hydrofluoric acid and hydrogen peroxide was used as an etchant. In ten seconds after initialization of etching, the porous Si was selectively removed with the polycrystalline Si acting as an etch stopper, only the polycrystalline Si and the monocrystalline Si being left behind, as shown in FIG. 3C.

EXAMPLE 34

Etching was performed in the same manner as that of Example 4 with the exception that a mixture solution (1:5) of buffered hydrofluoric acid and hydrogen peroxide was used as an etchant. In five seconds after initialization of etching, only the porous Si was selectively removed, leaving the polycrystalline Si and monocrystalline Si behind, as shown in FIG. 4B.

EXAMPLE 35

Etching was performed in the same manner as that of Example 5 with the exception that a mixture solution (1:5)

of buffered hydrofluoric acid and hydrogen peroxide was used as an etchant. In nine minutes, the porous Si was selectively removed, only the monocrystalline Si being left behind, as shown in FIG. 5C. Finally, the resist was removed (FIG. 5D).

EXAMPLE 36

Etching was performed in the same manner as that of Example 1 with the exception that a mixture solution (10:6:50) of buffered hydrofluoric acid ($NH_4F$: 36.2%, HF: 4.5%), ethyl alcohol and hydrogen peroxide was used as an etchant. In ten minutes after initialization of etching, the porous Si was selectively removed with the monocrystalline Si acting as an etch stopper, only the monocrystalline Si being left, as shown in FIG. 1B.

EXAMPLE 37

Etching was performed in the same manner as that of Example 2 with the exception that a mixture solution (10:6:50) of buffered hydrofluoric acid ($NH_4F$: 36.2%, HF: 4.5%), ethyl alcohol and hydrogen peroxide was used as an etchant. In six seconds after initialization of etching, only the porous Si was selectively removed, leaving the monocrystalline Si behind, as shown in FIG. 2B.

EXAMPLE 38

Etching was performed in the same manner as that of Example 3 with the exception that a mixture solution (10:6:50) of buffered hydrofluoric acid ($NH_4F$: 36.2%, HF: 4.5%), ethyl alcohol and hydrogen peroxide was used as an etchant. In twelve seconds after initialization of etching, the porous Si was selectively removed with the polycrystalline Si acting as an etch stopper, only the polycrystalline Si and the monocrystalline Si being left behind, as shown in FIG. 3C.

EXAMPLE 39

Etching was performed in the same manner as that of Example 4 with the exception that a mixture solution (10:6:50) of buffered hydrofluoric acid ($NH_4F$: 36.2%, HF: 4.5%), ethyl alcohol and hydrogen peroxide was used as an etchant. In six seconds after initialization of etching, only the porous Si was selectively removed, leaving the polycrystalline Si and monocrystalline Si behind, as shown in FIG. 4B.

EXAMPLE 40

Etching was performed in the same manner as that of Example 5 with the exception that a mixture solution (10:6:50) of buffered hydrofluoric acid ($NH_4F$: 36.2%, HF: 4.5%), ethyl alcohol and hydrogen peroxide was used as an etchant. In ten minutes after initialization of etching, the porous Si was selectively removed, only the monocrystalline Si being left behind, as shown in FIG. 5C. Finally, the resist was removed (FIG. 5D).

EXAMPLE 41

Anodization was conducted on a P-type (100) monocrystalline Si substrate having a thickness of 200 μm in a 50% HF solution at a current density of 100 mA/cm². The porous structure formation rate was 8.4 μm/min and hence it took twenty four minutes for the 200 μm-thick P-type (100) Si substrate to be made entirely porous.

A Si epitaxial layer with a thickness of of 0.5 μm was grown on the P-type (100) porous Si substrate at a low temperature by molecular beam epitaxy (MBE). Deposition was conducted under the following conditions:

Temperature: 700° C.

Pressure: $1 \times 10^{-9}$ Torr

Growth rate: 0.1 nm/sec.

Next, an optically polished fused silica glass substrate was placed on the surface of the epitaxial layer. The whole structure was then heated at 800° C. in an oxygen atmosphere for 0.5 hours to firmly join the two substrates to each other.

$Si_3N_4$ was deposited to a thickness of 0.1 μm by plasma CVD method to cover the bonded substrates, and then only the nitride film on the porous substrate was removed by reactive ion etching. Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$ or more, the amount of non-porous layer which is etched (several. tens angstroms) can be ignored in a practical operation. That is, the 200 μm-thick porous Si substrate was removed, and subsequently the $Si_3N_4$ layer was removed with a result that the 0.5 μm-thick monocrystalline Si layer formed on the glass substrate remained.

The cross-section of the monocrystalline Si layer was observed with a transmission type electron microscope. It was found that no crystal defect was newly introduced in the Si layer and hence the Si layer had excellent crystalline structure.

EXAMPLE 42

Anodization was conducted on a P type (100) monocrystalline Si substrate having a thickness of 200 μm in a 50% HF solution at a current density of 100 mA/cm². The porous structure formation rate was 8.4 μm/min and hence it took twenty four minutes for the 200 μm-thick P type (100) Si substrate to be made entirely porous. A Si epitaxial layer with a thickness of 5.0 μm was grown on the P type (100) porous Si substrate at a low temperature by plasma CVD. Deposition was conducted under the following conditions:

Gas: $SiH_4$

High-frequency power: 100 W

Temperature: 800° C.

Pressure: $1 \times 10^{-2}$ Torr

Growth rate: 2.5 nm/sec.

Next, an optically polished glass substrate having a softening point of about 500° C. was placed on the surface of the epitaxial layer. The whole structure was heated at 450° C. in an oxygen atmosphere for 0.5 hours to firmly join the two substrates to each other.

$Si_3N_4$ was deposited to a thickness of 0.1 μm by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$ or more, the amount of non-porous layer which is etched (several tens angstroms) can be ignored in a practical operation. That is, the 200 $\mu$m-thick porous Si substrate was removed, and subsequently the $Si_3N_4$ layer was removed with a result that the 5.0 $\mu$m-thick monocrystalline Si layer formed on the glass substrate having a low softening point remained.

EXAMPLE 43

Anodization was conducted on a P type (100) monocrystalline Si substrate having a thickness of 200 $\mu$m in a 50% HF solution at a current density of 100 mA/cm$^2$. The porous structure formation rate was 8.4 $\mu$m/min and hence it took twenty four minutes for the 200 $\mu$m-thick P type (100) Si substrate to be made entirely porous. A Si epitaxial layer with a thickness of 1.0 $\mu$m was grown on the P type (100) porous Si substrate at a low temperature by bias sputtering. Deposition was conducted under the following conditions:

RF frequency: 100 MHz

High-frequency power: 600 W

Temperature: 300° C.

Ar gas pressure: $8\times10^{-3}$ Torr

Growth rate: 120 minutes

Target d.c. bias: −200 V

Substrate d.c. bias: +5 V

Next, an optically polished glass substrate having a softening point of about 500° C. was placed on the surface of the epitaxial layer. The whole structure was heated at 450° C. in an oxygen atmosphere for 0.5 of an hour firmly join the two substrates to each other.

$Si_3N_4$ was deposited to a thickness of 0.1 $\mu$m by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$ or more, the amount of non-porous layer which is etched (several tens angstroms) can be ignored in a practical operation. That is, the 200 $\mu$m-thick porous Si substrate was removed, and subsequently the $Si_3N_4$ layer was removed with a result that the 1.0 $\mu$m-thick monocrystalline Si layer on the glass substrate having a low softening point remained.

In case of coating of Apiexon Wax or Electron Wax in place of the $Si_3N_4$ layer, the same effect was obtained and only the Si substrate made porous was completely removed.

EXAMPLE 44

Anodization was conducted on a N type (100) monocrystalline Si substrate having a thickness of 200 $\mu$m in a 50% HF solution at a current density of 100 mA/cm$^2$. The porous structure formation rate was 8.4 $\mu$m/min and hence it took twenty four minutes for the 200 $\mu$m-thick N type (100) Si substrate to be made entirely porous. A Si epitaxial layer with a thickness of 10 $\mu$m was grown on the N type (100) porous Si substrate at a low temperature by liquid phase growth method under the following conditions:

Solvent: Sn,

Solute: Si

Growth temperature: 900° C.

Growth atmosphere: $H_2$

Growth time: 20 minutes

Next, an optically polished glass substrate having a softening point of about 800° C. was placed on the surface of the epitaxial layer. The whole structure was heated at 750° C. in an oxygen atmosphere for 0.5 hours to firmly join the two substrates to each other.

$Si_3N_4$ was deposited to a thickness of 0.1 $\mu$m by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$ or more, the amount of non-porous layer which is etched (several tens angstroms) can be ignored in a practical operation. That is, the 200 $\mu$m-thick porous Si substrate was removed, and subsequently the $Si_3N_4$ layer was removed with a result that the 10 $\mu$m-thick monocrystalline Si layer on the glass substrate remained.

Coating of Apiezon Wax in place of the $Si_3N_4$ layer was also effective and assured complete removal of only the porous Si substrate.

EXAMPLE 45

Anodization was conducted on a P type (100) monocrystalline Si substrate having a thickness of 200 $\mu$m in a 50% HF solution at a current density of 100 mA/cm$^2$.

The porous structure formation rate was 8.4 $\mu$m/min and hence it took twenty four minutes for the 200 $\mu$m-thick P type (100) Si substrate to be made entirely porous. A Si epitaxial layer with a thickness of 1.0 $\mu$m was grown on the P type (100) porous Si substrate at a low temperature by low-pressure CVD. Deposition was conducted under the following conditions:

Source gas: $SiH_4$ 800 SCCM

Carrier gas: $H_2$ 150 liter/min

Temperature: 850° C.

Pressure: $1\times10^{-2}$ Torr

Growth rate: 3.3 nm/sec

Next, an optically polished fuzed silica glass substrate was placed on the surface of the epitaxial layer. The whole structure was heated at 800° C. in an oxygen atmosphere for 0.5 hours to firmly join the two substrates to each other.

$Si_3N_4$ was deposited to a thickness of 0.1 $\mu$m by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$ or more, the amount of non-porous layer which is etched (several tens angstroms) can be ignored in a practical operation. That is, the 200 μm-thick porous Si substrate was removed, and subsequently the $Si_3N_4$ layer was removed with a result that the 1.0-thick μm monocrystalline Si layer on the silica glass substrate remained.

When $SiH_2Cl_2$ was used as the source gas, the growth temperature had to be higher by several tens of degrees. However, high-speed etching characteristics to the porous substrate did not deteriorate.

EXAMPLE 46

A Si epitaxial layer with a thickness of 1.0 μm was grown on a P type (100) Si substrate having a thickness of 200 μm by CVD. Deposition was conducted under the following conditions:

Reactive gas flow rate:
   $SiH_4$ 1000 SCCM
   $H_2$ 230 liter/min
Temperature: 1080° C.
Pressure: 760 Torr
Time: 2 min Anodization was conducted on the substrate in a 50% HF solution at a current density of 100 mA/cm². The porous structure formation rate was 8.4 μm/min and hence it took twenty four minutes for the 200 μm-thick P type (100) Si substrate to be made entirely porous. At that time, there was no change in the Si epitaxial layer.

Next, an optically polished fuzed silica glass substrate was placed on the surface of the epitaxial layer. The whole structure was heated at 800° C. in an oxygen atmosphere for 0.5 hours to firmly join the two substrates to each other.

$Si_3N_4$ was deposited to a thickness of 0.1 μm by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely removed with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed, and subsequently the $Si_3N_4$ layer was removed with a result that the 1.0 μm monocrystalline Si layer on the silica glass substrate remained.

The cross-section of the monocrystalline Si layer was observed with a transmission type electron microscope. It was found that no crystal defect was newly introduced in the Si layer and hence the Si layer had excellent crystalline structure.

EXAMPLE 47

A Si epitaxial layer with a thickness of 0.5 μm was grown on a P type (100) Si substrate having a thickness of 200 μm by CVD. Deposition was conducted under the following conditions:

Reactive gas flow rate:
   $SiH_2Cl_2$ 1000 SCCM
   $H_2$ 230 liter/min
Temperature: 1080° C.
Pressure: 80 Torr
Time: 1 min Anodization was conducted on the substrate in a 50% HF solution at a current density of 100 mA/cm². The porous structure formation rate was 8.4 μm/min and hence it took twenty four minutes for the 200 μm-thick P type (100) Si substrate to be made entirely porous. As mentioned above, anodization made only the P type (100) Si substrate porous, and there was no change in the Si epitaxial layer.

Next, an optically polished fuzed silica glass substrate was placed on the surface of the epitaxial layer. The whole structure was heated at 800° C. in an oxygen atmosphere for 0.5 hours to firmly join the two substrates to each other.

$Si_3N_4$ was deposited to a thickness of 0.1 μm by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed, and subsequently the $Si_3N_4$ layer was removed with a result that the 0.5 μm-thick monocrystalline Si layer on the silica glass substrate remained.

The cross-section of the monocrystalline Si layer was observed by a transmission type electron microscope. It was found that no crystal defect was newly introduced in the Si layer and hence the Si layer had excellent crystalline structure.

EXAMPLE 48

A N type Si layer with a thickness of 1 μm was formed on a P type (100) Si substrate having a thickness of 200 μm by proton implantation. Implantation rate of $H^+$ was $5\times10^{15}$ (ions/cm²).

Anodization was conducted on the substrate in a 50% HF solution at a current density of 100 mA/cm². The porous structure formation rate was 8.4 μm/min and hence it took twenty four minutes for the 200 μm-thick P type (100) Si substrate to be made entirely porous. As mentioned above, anodization made only the P type (100) Si substrate porous, and there was no change in the N type Si layer.

Next, an optically polished fuzed silica glass substrate was placed on the surface of the N type Si layer. The whole structure was heated at 800° C. in an oxygen atmosphere for 0.5 hours to firmly join the two substrates to each other.

Si₃N₄ was deposited to a thickness of 0.1 $\mu$m by plasma CVD to cover the two bonded substrates, and then only the nitride film on the porous substrate was removed by reactive ion etching.

Thereafter, selective etching was conducted on the bonded substrates in a 49% hydrofluoric acid solution while the solution was being stirred. In seventy eight minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in seventy eight minutes. Since the ratio of the etching rate of the non-porous monocrystalline Si to that of the porous layer is $1:10^5$, the amount of non-porous layer which is etched (several tens angstroms) can be ignored in a practical operation. That is, the 200 $\mu$m-thick porous Si substrate was removed, and subsequently the Si₃N₄ layer was removed with a result that the 1 $\mu$m-thick monocrystalline Si layer on the silica glass substrate remained.

The cross-section of the monocrystalline Si layer was observed by a transmission type electron microscope. It was found that no crystal defect was newly introduced in the Si layer and hence the Si layer had excellent crystalline structure.

EXAMPLE 49

Anodization was conducted on a P type (100) monocrystalline Si substrate having a thickness of 200 $\mu$m in a HF solution under the following conditions:

Applied voltage: 2.6 (V)
Current density: 30 (mA·cm⁻²)
Anodizing solution: HF:H₂O:C₂H₅OH=1:1:1
Time: 1.6 (hour)
Thickness of porous Si: 200 ($\mu$m)
Porosity: 56 (%)

A Si epitaxial layer with a thickness of 0.5 $\mu$m was grown on the P type (100) porous Si substrate at a low temperature by molecular beam epitaxy (MBE). Deposition was conducted under the following conditions:

Temperature: 700° C.
Pressure: $1\times10^{-9}$ Torr
Growth rate: 0.1 nm/sec.

Next, a second Si substrate with a 5000 Å thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in sixty-two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 $\mu$m-thick porous Si substrate was removed with a result that the 0.5 $\mu$m-thick monocrystalline Si layer formed on the SiO₂ layer remained.

The cross-section of the monocrystalline Si layer was observed by a transmission type electron microscope. It was found that no crystal defect was newly introduced in the Si layer and hence the Si layer had excellent crystalline structure.

EXAMPLE 50

Anodization was conducted on a P type (100) monocrystalline Si substrate having a thickness of 200 $\mu$m in a HF solution in the same manner as that of Example 49.

A Si epitaxial layer with a thickness of 0.5 $\mu$m was grown on the P type (100) porous Si substrate at a low temperature by plasma CVD. Deposition was conducted under the following conditions:

Gas: SiH₄
High-frequency power: 100 W
Temperature: 800° C.
Pressure: $1\times10^{-2}$ Torr
Growth rate: 2.5 nm/sec.

Next, a second Si substrate with a 5000 Å thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates. in a 49% hydrofluoric acid solution while the solution was being stirred. In sixty two minutes, the porous Si substrate was completely etched with the monocrystalline Si layer acting as an etch stopper, only the monocrystalline Si layer being left behind.

The etching rate of the non-porous monocrystalline Si was so low that only a maximum of 50 Å of non-porous monocrystalline Si was removed in sixty-two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 $\mu$m-thick porous Si substrate was removed with a result that the 0.5 $\mu$m thick monocrystalline Si layer on the SiO₂ layer remained.

EXAMPLE 51

Anodization was conducted on a P type (100) monocrystalline Si substrate having a thickness of 200 $\mu$m in a HF solution in the same manner as that of Example 49.

A Si epitaxial layer with a thickness of 0.5 $\mu$m was grown on the P type (100) porous Si substrate at a low temperature by bias sputtering. Deposition was conducted under the following conditions:

RF frequency: 100 MHz
High-frequency power: 600 W
Temperature: 300° C.
Ar gas pressure: $8\times10^{-3}$ Torr
Growth time: 60 minutes
Target d.c. bias: −200 V
Substrate d.c. bias: +5 V Next, a second Si substrate with a 5000 Å thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in sixty-two minutes. Since the ratio of the etching rate of the non-porous monocrystalline Si to that of the porous layer is $1:10^5$ the amount of non-porous layer which is etched (several tens angstroms) can be ignored in a practical operation. That is, the 200 μm-thick porous Si substrate was removed with a result that the 0.5 μm thick monocrystalline Si layer on the $SiO_2$ layer remained.

EXAMPLE 52

Anodization was conducted on a N type (100) monocrystalline Si substrate having a thickness of 200 μm in a HF solution in the same manner as that of Example 49.

A Si epitaxial layer with a thickness of 5 μm was grown on the N type (100) porous Si substrate at a low temperature by liquid phase growth under the following conditions:

Solvent: Sn,

Solute: Si

Growth temperature: 900° C.

Growth atmosphere: $H_2$

Growth rate: 10 minutes

Next, a second Si substrate with a 5000 Å thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in sixty-two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed with a result that the 5 μm thick monocrystalline Si layer on the $SiO_2$ layer remained.

EXAMPLE 53

Anodization was conducted on a P type (100) monocrystalline Si substrate having a thickness of 200 μm in a HF solution in the same manner as that of Example 49.

A Si epitaxial layer with a thickness of 1.0 μm was grown on the P type (100) porous Si substrate at a low temperature by low-pressure CVD. Deposition was conducted under the following conditions:

Source gas: $SiH_4$

Carrier gas: $H_2$

Temperature: 850° C.

Pressure: $.1 \times 10^{-2}$ Torr

Growth rate: 3.3 nm/sec

Next, a second Si substrate with a 5000 Å thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in sixty-two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μ-thick porous Si substrate was removed with a result that the 1.0 μm thick monocrystalline Si layer on the $SiO_2$ layer remained.

When $SiH_2Cl_2$ was used as the source gas, the growth temperature had to be higher by several tens of degrees. However, high-speed etching characteristics to the porous substrate did not deteriorate.

EXAMPLE 54

A Si epitaxial layer with a thickness of 1 μm was grown on a P type (100) Si substrate having a thickness of 200 μm by low-pressure CVD. Deposition was conducted under the following conditions:

Reactive gas flow rate:

$SiH_2Cl_2$ 1000 SCCM $H_2$ 230 liter/min

Temperature: 1080° C.

Pressure: 80 Torr

Time: 2 min

Anodization was conducted on the substrate in a 50% HF solution at a current density of 100 $mA/cm^2$. The porous structure formation rate was 8.4 μm/min and hence it took twenty four minutes for the 200 μm-thick P type (100) Si substrate to be made entirely porous. As mentioned above, anodization made only the P type (100) Si substrate porous, and did not affect the Si epitaxial layer at all.

Next, a second Si substrate with a 5000 Å-thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, while the monocrystalline Si layer remained.

The etching rate of the non-porous monocrystalline Si was so low that only a maximum of 50 Å of non-porous monocrystalline Si was removed in sixty two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed with a result that the 1.0 μm thick monocrystalline Si layer on the $SiO_2$ layer remained.

The cross-section of the monocrystalline Si layer was observed by a transmission type electron microscope. It was found that no crystal defect was newly introduced in the Si layer and hence the Si layer had excellent crystalline structure.

EXAMPLE 55

A Si epitaxial layer with a thickness of 5 μm was grown on a P type (100) Si substrate having a thickness of 200 μm by atmospheric CVD. Deposition was conducted under the following conditions:

Reactive gas flow rate:
  $SiH_2Cl_2$ 1000 SCCM
  $H_2$ 230 liter/min
Temperature: 1080° C.
Pressure: 760 Torr
Time: 1 min Anodization was conducted on the substrate in a HF solution in the same manner as that of Example 49. As mentioned above, anodization made only the P type (100) Si substrate porous, and did not affect the Si epitaxial layer at all.

Next, a second Si substrate with a 5000 Å-thick oxidized layer formed on the surface thereof was placed on the surface of the epitaxial layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in sixty two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed with a result that the 5.0 μm thick monocrystalline Si layer on the $SiO_2$ layer remained.

The cross-section of the monocrystalline Si layer was observed by a transmission type electron microscope. It was found that no crystal defect was newly introduced in the Si layer and hence the Si layer had excellent crystalline structure.

EXAMPLE 56

A N type Si layer with a thickness of 1 μm was formed on a P type (100) Si substrate having a thickness of 200 μm by proton implantation. Implantation rate of $H^+$ was $5 \times 10^{15}$ (ions/$cm^2$).

Anodization was conducted on the substrate in a 50% HF solution at a current density of 100 mA/$cm^2$. The porous structure formation rate was 8.4 μm/min and hence it took twenty four minutes for the 200 μm-thick P type (100) Si substrate to be made entirely porous. As mentioned above, anodization made only the P type (100) Si substrate porous, and did not change the N type Si layer.

Next, a second Si substrate with a 5000 Å-thick oxidized layer formed on the surface thereof was placed on the surface of the N type Si layer. The whole structure was heated at 800° C. in an oxygen atmosphere for 0.5 hours to firmly join the two substrates to each other.

Thereafter, selective etching was conducted on the bonded substrates in a 49% hydrofluoric acid solution while the solution was being stirred. In sixty two minutes, the porous Si substrate was completely etched with the monocrystalline Si layer acting as an etch stopper, the monocrystalline Si layer being left behind.

The etching rate of the non-porous monocrystalline Si was so low that only a maximum of 50 Å of non-porous monocrystalline Si was removed in sixty two minutes. Since the ratio of the etching rate of the non-porous monocrystalline Si to that of the porous layer is $1:10^5$, the amount of non-porous layer which is etched (several tens angstroms) can be ignored in a practical operation. That is, the 200 μm-thick porous Si substrate was removed with a result that the 1.0 μm thick monocrystalline Si layer on the $SiO_2$ layer remained.

The cross-section of the monocrystalline Si layer was observed by a transmission type electron microscope. It was found that no crystal defect was newly introduced in the Si layer and hence the Si layer had excellent crystalline structure.

EXAMPLE 57

A P-type (100) single-crystals (monocrystal) Si substrate of a thickness of 200 μ was anodized in 50% HF solution. The current density then was 100 mA/$cm^2$. The porous structure formation rate then was about 8.4 μm/min., and the P-type (100) Si substrate of a thickness of 200 μ was rendered porous in its entirety for 24 minutes.

According to MBE (molecular beam epitaxy) method, an Si epitaxial layer of 0.5 μ was grown at a lower temperature on the P-type (100) porous Si substrate. The conditions for deposition are as follows;

temperature: 700° C.
pressure: $1 \times 10^{-9}$ Torr
growth rate: 0.1 nm/sec.

Subsequently, the surface of the epitaxial layer was thermally oxidized in a depth of 50 nm. A substrate of fused silica glass processed with optical polishing was bonded onto the thermally oxidized membrane (i.e., film), and both of the substrates were strongly bonded together by heating at 800° C. for 0.5 hour in oxygen atmosphere.

According to low pressure CVD, $Si_3N_4$ was deposited to 0.1 μm, thereby coating the bonded two substrates. Thereafter, only the nitride membrane (film) on the porous substrate was removed by reactive ion etching.

Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal (monocrystal) with the etching. solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and after the removal of the $Si_3N_4$ layer, a single-crystal Si layer of a thickness of 0.5 μm was formed on the substrate of the silica glass.

As a result of observation of the section under a transmission-type electron microscope, it was confirmed that no new crystal defect was introduced in the Si layer and that excellent crystallinity was maintained.

EXAMPLE 58

A P-type (100) single-crystal Si substrate of a thickness of 200 μ was anodized in 50% HF solution. The current density then was 100 mA/$cm^2$. The porous structure formation rate then was about 8.4 μm/min., and the P-type (100) Si substrate of a thickness of 200 μ was rendered porous in its entirety for 24 minutes. According to plasma CVD method, an Si epitaxial layer of 5 μ was grown at a lower temperature on the P-type (100) porous Si substrate. The conditions for deposition are as follows;
gas: $SiH_4$
high-frequency power: 100 W
temperature 800° C.
pressure: $1 \times 10^{-2}$ Torr
growth rate: 2.5 nm/sec.

Subsequently, the surface of the epitaxial layer was thermally oxidized in a depth of 50 nm. A glass substrate, having being processed with optical polishing and having a softening point around 500° C., was bonded onto the thermally oxidized membrane, and both of the substrates were strongly bonded together by heating at 450° C. for 0.5 hour in oxygen atmosphere.

According to plasma CVD method, $Si_3N_4$ was deposited to 0.1 μm, thereby coating the bonded two substrates. Thereafter, only the nitride membrane on the porous substrate was removed by reactive ion etching.

Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the ethcing rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and after the removal of the $Si_3N_4$ layer, a single-crystal Si layer of a thickness of 5 μm was formed on the glass substrate of a lower softening point.

EXAMPLE 59

A P-type (100) single-crystal Si substrate of a thickness of 200 μ was anodized in 50% HF solution. The current density then was 100 mA/cm². The porous structure formation rate then was about 8.4 μm/min., and the P-type (100) Si substrate of a thickness of 200 μ was rendered porous in its entirety for 24 minutes. According to thermal CVD method, an Si epitaxial layer of 5 μ was grown at a lower temperature on the P-type (100) porous Si substrate. The conditions for deposition are as follows;
gas: $SiH_4$(0.6 l/min), $H_2$ (100 l/min)
temperature: 850° C.
pressure: 50 Torr
growth rate: 0.1 μm/min.

Subsequently, the surface of the epitaxial layer was thermally oxidized in a depth of 50 nm. A glass substrate, having being processed with optical polishing and having a softening point around 500° C., was bonded onto the thermally oxidized membrane, and both of the substrates were strongly bonded together by heating at 450° C. for 0.5 hour in oxygen atmosphere.

According to plasma CVD method, $Si_3N_4$ was deposited to 0.1 μm, thereby coating the bonded two substrates. Thereafter, only the nitride membrane on the porous substrate was removed by reactive ion etching.

Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and after the removal of the $Si_3N_4$ layer, a single-crystal Si layer of a thickness of 5 μm was formed on the glass substrate of a lower softening point.

A similar effect could be obtained by using Apiezon wax or electron wax, instead of $Si_3N_4$, so that only the Si substrate rendered porous could be removed completely.

EXAMPLE 60

A P-type (100) single-crystal Si substrate of a thickness of 200 μ was anodized in 50% HF solution. The current density then was 100 mA/cm². The porous structure formation rate then was about 8.4 μm/min., and the P-type (100) Si substrate of a thickness of 200 μ was rendered porous in its entirety for 24 minutes. According to bias sputter method, an Si epitaxial layer of 1.0 μ was grown at a lower temperature on the P-type (100) porous Si substrate. The conditions for deposition are as follows;
RF frequency: 100 MHz
high-frequency power: 600 W
temperature: 300° C.
Ar gas pressure: $8 \times 10^3$ Torr
growth time: 120 minutes
target direct current bias: −200 V substrate direct current bias: +5 V.

Subsequently, the surface of the epitaxial layer was thermally oxidized in a depth of 50 nm. A glass substrate, having being processed with optical polishing and having a softening point around 500° C., was bonded onto the thermally oxidized membrane, and both of the substrate were strongly bonded together by heating at 450° C. for 0.5 hour in oxygen atmosphere.

According to plasma CVD method, $Si_3N_4$ was deposited to 0.1 μm, thereby coating the bonded two substrates. Thereafter, only the nitride membrane on the porous substrate was removed by reactive ion etching.

Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of thickness of 200 μ, rendered porous, was removed, and after the removal of the $Si_3N_4$ layer, a single-crystal Si layer of a thickness of 1.0 μm was formed on the glass substrate of a lower melting point.

A similar effect could be obtained by using Apiezon wax or electron wax, instead of $Si_3N_4$, so that only the Si substrate rendered porous could be removed completely.

EXAMPLE 61

A N-type (100 single-crystal Si substrate of a thickness of 200 μ was anodized in 50% HF solution. The current density then was 100 mA/cm$^2$. The porous structure formation rate then was about 8.4 µm/min., and the N-type (100) Si substrate of a thickness of 200 µ was rendered porous in its entirety for 24 minutes. According to liquid phase growth method, an Si epitaxial layer of 10 µ was grown at a lower temperature on the N-type (100) porous Si substrate. The conditions for deposition are as follows;
solvent: Sn,
Solute: Si
growth temperature: 900° C.
growth atmosphere: H$_2$
growth time: 20 minutes.

Subsequently, the surface of the epitaxial layer was thermally oxidized in a depth of 50 nm. A glass substrate, having being processed with optical polishing and having a softening point around 800° C., was bonded onto the thermally oxidized membrane, and both of the substrates were strongly bonded together by heating at 750° C. for 0.5 hour in oxygen atmosphere.

According to low pressure CVD method, Si$_3$N$_4$ was deposited to 0.1 µm, thereby coating the bonded two substrates. Thereafter, only the nitride membrane on the porous substrate was removed by reactive ion etching.

Then, the bonded substrates were selectively etched with 49% hydrofluoric acid. In 78 minutes, only the single-crystal Si layer remained without etching in 78 minutes, while the porous Si substrate was selectively etched with the single-crystal Si as a material for etching stopper and then completely removed.

The etching rate of the non-porous Si-single crystal with the etching solution was extremely low, such as 50 angstroms or less even 78 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate, rendered porous, of a thickness of 200 µ was removed, and after the removal of the Si$_3$N$_4$ layer, a single-crystal Si layer of a thickness of 10 µm was formed on the glass substrate of a lower softening point.

A similar effect could be obtained by using Apiezon wax or electron wax, instead of Si$_3$N$_4$, so that only the Si substrate rendered porous could be removed completely.

EXAMPLE 62

According to CVD method, an Si epitaxial layer of 0.5 µ was grown at a lower temperature on a P-type (100) Si substrate of a thickness of 200 µ. The conditions for deposition are as follows;
reactive gas flow rate:
  SiH$_2$Cl$_2$ 1000 SCCM
  H$_2$ 230 l/min.
temperature: 1080° C.
pressure: 80 Torr
time: 1 minute.

The present substrate was anodized in 50% HF solution. The current density then was 100 mA/cm$^2$. The porous structure formation rate then was about 8.4 µm/min., and the P-type (100) Si substrate of a thickness of 200 µ was rendered porous in its entirety for 24 minutes. As has been described above, the present anodization rendered only the P-type (100) Si substrate porous, but no change was observed in the Si epitaxial layer.

Subsequently, the surface of the epitaxial layer was thermally oxidized in a depth of 50 nm. A substrate of fused silica glass, processed with optical polishing, was bonded onto the thermally oxidized membrane, and both of the substrates were strongly bonded together by heating at 800° C. for 0.5 hour in oxygen atmosphere.

According to low pressure CVD method, Si$_3$N$_4$ was deposited to 0.1 µm, thereby coating the bonded two substrates. Thereafter, only the nitride membrane on the porous substrate was removed by reactive ion etching. Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 µ, rendered porous, was removed, and after the removal of the Si$_3$N$_4$ layer, a single-crystal Si layer of a thickness of 0.5 µm was formed on the glass substrate.

A similar effect could be obtained by using Apiezon wax or electron wax, instead of Si$_3$N$_4$, so that only the Si substrate rendered porous could be removed completely.

As a result of observation of the section under a transmission-type electron microscope, it was confirmed that no new crystal defect was introduced in the Si layer and that excellent crystallinity was maintained.

EXAMPLE 63

A N-type Si layer 1 µ was formed on the surface of a P-type (100) Si substrate of a thickness of 200 µ, by ion implantation of proton. The implanted amount of H$^+$ was 5×10$^{15}$ ions/cm$^2$. The substrate was anodized in 50% HF solution. The current density then was 100 mA/cm$^2$. The porous structure formation rate then was about 8.4 µm/min., and the P-type (100) Si substrate of a thickness of 200 µ was rendered porous in its entirety for 24 minutes. According to the present anodization as has been described above, only the P-type (100) Si substrate was rendered porous, but no change was observed in the N-type Si layer. Subsequently, the surface of the N-type single-crystal layer was thermally oxidized in a depth of 50 nm. A substrate of fused silica glass processed with optical polishing was bonded onto the thermally oxidized membrane, and both of the substrates were strongly bonded together by heating at 800° C. for 0.5 hour in oxygen atmosphere.

According to low pressure CVD method, Si$_3$N$_4$ was deposited to 0.1 µm, thereby coating the bonded two substrates. Thereafter, only the nitride membrane on the porous substrate was removed by reactive ion etching. Then, the bonded substrates were selectively etched with 49% hydrofluoric acid. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as 10$^5$ or more. The etched amount in non-porous layer (several tens angstroms) is a practically negligible decrease in membrane thickness. That is, the Si substrate of a thickness of 200 µ, rendered porous, was removed, and after the removal of the Si$_3$N$_4$ layer, a single-crystal Si layer of a thickness of 1.0 µm was formed on the glass substrate.

A similar effect could be obtained by using Apiezon wax or electron wax, instead of $Si_3N_4$, so that only the Si substrate rendered porous could be removed completely.

As a result of observation of the section under a transmission-type electron microscope, it was confirmed that no new crystal defect was introduced in the Si layer and that excellent crystallinity was maintained.

EXAMPLE 64

A P-type (100) single-crystal Si substrate of a thickness of 200 µ was anodized in 50% HF solution.

The conditions for deposition are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 µm
porosity: 56%.

According to MBE method, an Si epitaxial layer of 0.5 µ was grown at a lower temperature on the P-type (100) porous Si substrate. The conditions for deposition are as follows;
temperature: 700° C.
pressure: 1×10$^{-9}$
growth rate: 0.1 nm/sec.

Subsequently, an oxidized layer of 1000 angstroms was formed on the surface of the epitaxial layer, and another Si substrate on the surface of which was formed an oxidized layer of 5000 angstroms, was bonded to the oxidized surface. By heating in oxygen atmosphere at 800° C. for 0.5 hour, both of the Si substrates were strongly bonded together.

Then, the bonded substrates were selectively etched with 49 hydrofluoric acid while under stirring. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 µ, rendered porous, was removed, and after the removal of the $Si_3N_4$ layer, a single-crystal Si layer of a thickness of 0.5 µm was formed on the $SiO_2$. As a result of observation of the section under a transmission-type electron microscope, it was confirmed that no new crystal defect was introduced in the Si layer and that excellent crystallinity was maintained.

EXAMPLE 65

A P-type (100) single-crystal Si substrate of a thickness of 200 µ was anodized in HF solution.

The conditions for anodization are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 µm
porosity: 56%.

According to plasma CVD method, and Si epitaxial layer of 0.5 µ was grown at a lower temperature on the P-type (100) porous Si substrate. The conditions for deposition are as follows;
gas: $SiH_4$
high-frequency power: 100 W
temperature: 800° C.
pressure: 1×10$^{-2}$ Torr
growth rate: 2.5 nm/sec.

Subsequently, an oxidized layer of 1000 angstroms was formed on the surface of the epitaxial layer, and another Si substrate on the surface of which was formed as oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acid while under stirring. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so. that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 µ, rendered porous, was removed, and a single-crystal Si layer of a thickness of 0.5 µm was formed on the $SiO_2$.

EXAMPLE 66

A P-type (100) single-crystal Si substrate of a thickness of 200 µ was anodized in HF solution.

The conditions for anodization are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 µm
porosity: 56%.

According to bias sputter method, an Si epitaxial layer of 0.5 µ was grown at a lower temperature on the P-type (100) porous Si substrate. The conditions for deposition are as follows;
RF frequency: 100 MHz
high-frequency power: 600 W
temperature: 300° C.
Ar gas pressure: 8×10$^{-3}$ Torr
growth time: 60 minutes
target direct current bias: −200 V
substrate direct current bias: +5 V.

Subsequently, an oxidized layer of 1000 angstroms was formed on the surface of the epitaxial layer, and another Si substrate on the surface of which was formed an oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acis while under stirring. In 78 minutes, only the single-crystal Si layer remained without etching, while the porous Si substrate was selectively etched with the single-crystal Si as a material for etching stopper and then completely removed. The etching rate of the non-porous Si single-crystal with the etching solution was extremely low, such as 50 angstroms or less even 78 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 $\mu$, rendered porous, was removed, and a single-crystal Si layer of a thickness of –0.5 $\mu$m was formed on the $SiO_2$.

EXAMPLE 67

A N-type (100) single-crystal Si substrate of a thickness of 200 $\mu$ was anodized in HF solution.

The conditions for anodization are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 $\mu$m
porosity: 56%.

According to liquid phase growth method, an Si epitaxial layer of 5 $\mu$ was grown at a lower temperature on the N-type (100) porous Si substrate. The conditions for growth are as follows;
solvent: Sn,
Solute: Si
growth temperature: 900° C.
growth atmosphere: $H_2$
growth period: 10 minutes Subsequently, an oxidized layer of 1000 angstroms was formed on the surface of the epitaxial layer, and another Si substrate on the surface of which was formed an oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acid while under stirring. Only the single-crystal Si layer remained without etching in 78 minutes, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and a single-crystal Si layer of a thickness of 0.5 $\mu$m was formed on the $SiO_2$.

EXAMPLE 68

A P-type (100) single-crystal Si substrate of a thickness of 200 $\mu$ was anodized in HF solution.

The conditions for anodization are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 $\mu$m
porosity: 56%.

According to low pressure CVD method, an Si epitaxial layer of 1.0 $\mu$ was grown at a lower temperature on the P-type (100) porous Si substrate. The conditions for deposition are as follows;
source gas: $SiH_4$
carrier gas: $H_2$
temperature: 850° C.
pressure: $1\times10^{-2}$ Torr
growth rate: 3.3 nm/sec.

Subsequently, an oxidized layer of 1000 angstroms was formed on the surface of the epitaxial layer, and another Si substrate on the surface of which was formed an oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acid while under stirring. In 78 minutes, only the single-crystal Si layer remained without etching in 78 minutes, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate, rendered porous, of a thickness of 200 $\mu$ was removed, and a single-crystal Si layer of a thickness of 1.0 $\mu$m was formed on the $SiO_2$. When $SiH_2Cl_2$ was used as a source gas, it was required to raise the growth temperature by several tens of degrees. Nevertheless, the accelerating etching characteristics to porous substrates was maintained.

EXAMPLE 69

According to low pressure CVD method, an Si epitaxial layer of 1 $\mu$ was grown at a lower temperature on a P-type (100) porous Si substrate. The conditions for deposition are as follows;
reactive gas flow rate:
  $SiH_2Cl_2$ 1000 SCCM
  $H_2$ 230 1/min
temperature: 1080° C.
pressure: 80 Torr
time: 2 min.

The substrate was anodized in 50% HF solution. The current density then was 100 mA/cm$^2$. The porous structure formation rate then was 8.4 $\mu$m/min., and the P-type (100) Si substrate of a thickness of 200 $\mu$ was rendered porous in its entirety for 24 minutes. According to the present anodization, as has been described above, only the P-type (100) Si substrate was rendered porous, but no change was observed in the Si epitaxial layer.

Subsequently, an oxidized layer of 1000 angstroms was formed on the surface of the epitaxial layer, and another Si substrate on the surface of which was formed an oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acid while under stirring. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is the Si substrate of a thickness of 200 $\mu$, rendered porous, was removed, and a single-crystal Si layer of a thickness of 1.0 $\mu$m was formed on the $SiO_2$.

As a result of observation of the section under a transmission-type electron microscope, it was confirmed that no new crystal defect was introduced in the Si layer and that excellent crystallinity was maintained.

EXAMPLE 70

According to atmospheric pressure CVD method, an Si epitaxial layer of 5 $\mu$ was grown at a lower temperature on a P-type (100) Si substrate. The conditions for deposition are as follows;
reactive gas flow rate:
  $SiH_2Cl_2$ 1000 SCCM
  $H_2$ 230 1/min
temperature: 1080° C.
pressure: 760 Torr
time: 1 min.

The Si substrate was anodized in HF solution.
The conditions for anodization are as follows;
applied voltage: 2.6 V
current density: 30 mA·cm$^{-2}$
solution for anodization: $HF:H_2O:C_2H_5OH=1:1:1$
time: 1.6 hours
thickness of porous Si: 200 $\mu$m
porosity: 56%.

According to the present anodization as has been described above, only the P-type (100) Si substrate was rendered porous, but no change was observed in the Si epitaxial layer.

Subsequently, an oxidized layer of 1000 angstroms was formed on the surface of the epitaxial layer, and another Si substrate on the surface of which was formed an oxidized layer of 5000 angstroms was bonded to the oxidized surface. By heating in oxygen atmosphere at 800 ° C. for 0.5 hour, both of the Si substrates were strongly bonded together.

Then, the bonded substrates were selectively etched with 49% hydrofluoric acid while under stirring. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate, rendered porous, of a thickness of 200 $\mu$ was removed, and a. single-crystal Si layer of a thickness of 5 $\mu$m was formed on the $SiO_2$. As a result of observation of the section under a transmission-type electron microscope, it was confirmed that no new crystal defect was introduced in the Si layer and that excellent crystallinity was maintained.

EXAMPLE 71

A N-type Si layer of 1 $\mu$ was formed on the surface of a P-type (100) Si substrate of a thickness of 200 $\mu$, by ion implantation of proton. The implanted amount of H$^+$ was $5\times10^{15}$ ions/cm$^2$. The substrate was anodized in 50% HF solution. The current density then was 100 mA/cm$^2$ The porous structure formation rate then was 8.4 $\mu$m/min., and the P-type (100) Si substrate of a thickness of 200 $\mu$ was rendered porous in its entirety for 24 minutes. According to the present anodization as has been described above, only the P-type (100) Si substrate was rendered porous, but no change was observed in the N-type Si layer.

Subsequently, an oxidized layer of 1000 angstroms was formed on the surface of the N-type Si layer, and another Si substrate on the surface of which was formed an oxidized layer of 5000 angstroms was bonded to the oxidized surface. By heating in oxygen atmosphere at 800° C. for 0.5 hour, both of the Si substrates were strongly bonded together.

Then, the bonded substrates were selectively etched with 49% hydrofluoric acid with stirring. In 78 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 78 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate, rendered porous, of a thickness of 200 $\mu$ was removed, and a single-crystal Si layer of a thickness of 1.0 $\mu$m was formed on $SiO_2$.

As a result of observation of the section under a transmission-type electron microscope, it was confirmed that no new crystal defect was introduced in the Si layer and that excellent crystallinity was maintained.

EXAMPLE 72

A P-type (100) single-crystal Si substrate of a thickness of 200 $\mu$ was anodized in 50% HF solution. The current density then was 100 mA/cm$^2$. The porous structure formation rate then was about 8.4 $\mu$m/min., and the P-type (100) Si substrate of a thickness of 200 $\mu$ was rendered porous in its entirety for 24 minutes.

According to MBE (monocular beam epitaxy) method, an Si epitaxial layer was grown at a lower temperature on the P-type (100) porous Si substrate. The conditions for deposition are as follows;
temperature: 700° C.
pressure: $1\times10^{-9}$ Torr
growth rate: 0.1 nm/sec.

Subsequently, a substrate of fused silica glass processed with optical polishing was bonded onto the the surface of the epitaxial layer, and both of the substrates were strongly bonded together by heating at 800° C. for 0.5 hour in oxygen atmosphere.

According to plasma CVD method, $Si_3N_4$ was deposited to 0.1 $\mu$m, thereby coating the bonded two substrates. Thereafter, only the nitride membrane on the porous substrate was removed by reactive ion etching. Then, the bonded substrates were selectively etching with a mixed solution of 49% hydrofluoric acid and alcohol (10:1), without stirring. In 82 minutes, only the single-crystal Si layer remained without etching, while the porous Si substrate was selectively etched with the single-crystal Si as a material for etching stopper, and completely removed.

The etching rate of the non-porous Si single-crystal with the etching solution was extremely low, such as 50 angstroms or less even 82 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the glass.

As a result of observation of the section under a transmission-type electron microscope, it was confirmed that no new crystal defect was introduced in the Si layer and that excellent crystallinity was maintained.

EXAMPLES 73 TO 86

The same procedure as in Examples 42 to 55 was effected, replacing the etching solution used in Examples 42 to 55 with that in Example 72. In any of the present. Examples, consequently, a single-crystal Si layer was formed with extremely less crystal defect on insulating materials.

EXAMPLE 87

A N-type. Si layer of 1 $\mu$ was formed on the surface of a P-type (100) Si substrate of a thickness of 200 $\mu$, by ion implantation of proton. The implanted amount of $H^+$ was $5 \times 10^{15}$ ions/cm The substrate was anodized in 50% HF solution. The current density then was 100 mA/cm². The porous structure formation rate then was 8.4 $\mu$m/min., and the P-type (100) Si substrate of a thickness of 200 $\mu$ was rendered porous in its entirety for 24 minutes. According to the present anodization as has been described above, only the P-type (100) Si substrate was rendered porous, but no change was observed in the N-type Si layer.

Subsequently, a second Si substrate on the surface of which was formed an oxidized layer of 5000 angstroms, was bonded to the surface of the N-type Si layer. By heating in oxygen atmosphere at 800° C. for 0.5 hour, both of the Si substrates were strongly bonded together.

Then, the bonded substrates were selectively etched with a mixed solution of 49% hydrofluoric acid and alcohol (10:1) without stirring. In 82 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 50 angstroms or less even 82 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and a single-crystal Si layer of a thickness of 1.0 $\mu$m was formed on the $SiO_2$ layer.

As a result of observation of the section under a transmission-type electron microscope, it was confirmed that no new crystal defect was introduced in the Si layer and that excellent crystallinity was maintained.

EXAMPLES 88 TO 102

The same procedure as in Examples 57 to 71 was effected, replacing the etching solution in Examples 57 to 71 with that in Example 72. In any of the present Examples, consequently, a single-crystal Si layer was formed with extremely less crystal defect on insulating materials.

EXAMPLE 103

A P-type (100) single-crystal Si substrate of a thickness of 200 $\mu$ was anodized in 50% HF solution.

The current density then was 100 mA/cm². The porous structure formation rate then was about 8.4 $\mu$m/min., and the P-type (100) Si substrate of a thickness of 200 $\mu$ was rendered porous in its entirety for 24 minutes.

According to MBE (molecular beam epitaxy) method, an Si epitaxial layer of 0.5 $\mu$ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

Subsequently, a substrate of fused silica glass processed with optical polishing was bonded onto the surface of the epitaxial layer, and both of the substrates were strongly bonded together by heating at 800° C. for 0.5 hour in oxygen atmosphere.

According to plasma CVD method, $Si_3N_4$ was deposited at 0.1 $\mu$m, thereby coating the bonded two substrates. Thereafter, only the nitride membrane on the porous substrate was removed by reactive ion etching. Then, the bonded substrates were selectively etched with a mixed solution of 49% hydrofluoric acid and aqueous hydrogen peroxide solution (1:5), while under stirring. In 62 minutes, only the single-crystal Si layer remained without etching, while the porous Si substrate was selectively etched with the single-crystal Si as a material for etching stopper and completely removed.

The etching rate of the non-porous Si single-crystal with the etching solution was extremely low, such as 50 angstroms or less even 62 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the glass.

As a result of observation of the section under a transmission-type electron microscope, it was confirmed that no new crystal defect was introduced in the Si layer and that excellent crystallinity was maintained.

EXAMPLES 104 TO 118

The same procedure as in Examples 42 to 56 was effected, replacing the etching solution in Examples 42 to 56 with that in Example 103. In any of the present Examples, consequently, a single-crystal Si layer was formed with extremely less crystal defect on insulating materials.

EXAMPLE 119

A P-type (100.) single-crystal Si substrate of a thickness of 200 $\mu$ was anodized in 50% HF solution. The current density then was 100 mA/cm² The porous structure formation rate then was about 8.4 $\mu$m/min., and the P-type (100) Si substrate of a thickness of 200 $\mu$ was rendered porous in its entirety for 24 minutes.

According to MBE (molecular beam epitaxy) method, an Si epitaxial layer of 0.5 $\mu$ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

Subsequently, the surface of the epitaxial layer was thermally oxidized in a depth of 50 nm. A substrate of fused silica glass processed with optical polishing was bonded onto the thermally oxidized membrane, and both of the substrates were strongly bonded together by heating at 800° C. for 0.5 hour in oxygen atmosphere.

According to low pressure CVD method, $Si_3N_4$ was deposited to 0.1 $\mu$m, thereby coating the bonded two substrates. Thereafter, only the nitride membrane on the porous substrate was removed by reactive ion etching.

Then, the bonded substrates were selectively etched with a mixed solution of 49% hydrofluoric acid and aqueous hydrogen peroxide solution (1:5). In 62 minutes, only the single-crystal Si layer remained without etching, while the porous Si substrate was selectively etched with the single-crystal Si as a material for etching stopper and completely removed.

The etching rate of the non-porous Si single-crystal with the etching solution was extremely low, such as SO angstroms or less even 62 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the silica glass.

As a result of observation of the section under a transmission-type electron microscope, it was confirmed that no new crystal defect was introduced in the Si layer and that excellent crystallinity was maintained.

EXAMPLES 120 TO 133

The same procedure as in Examples 58 to 71 was effected, replacing the etching solution in Examples 58 to 71 with that in Example 103. In any of the present Examples, consequently, a single-crystal Si layer was formed with extremely less crystal defect on insulating materials.

EXAMPLE 134

A P-type (100) single-crystal Si substrate of a thickness of 200 $\mu$ was anodized in 50% HF solution. The current density then was 100 mA/cm². The porous structure formation rate then was 8.4 $\mu$m/min., and the P-type (100) Si substrate of a thickness of 200 $\mu$ was rendered porous in its entirety for 24 minutes.

According to MBE (molecular beam epitaxy) method, an Si epitaxial layer of 0.5 $\mu$ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

Subsequently, a substrate of fused silica glass processed with optical polishing was bonded onto the surface of the epitaxial layer, and both of the substrates were strongly bonded together by heating at 800° C. for 0.5 hour in oxygen atmosphere.

According to plasma CVD method, $Si_3N_4$ was deposited to 0.1 $\mu$m, thereby coating the bonded two substrates. Thereafter, only the nitride membrane on the porous substrate was removed by reactive ion etching. Then, the bonded substrates were selectively etched with a mixed solution of 49% hydrofluoric acid, alcohol and aqueous hydrogen peroxide solution (10:6:50), without stirring. In 65 minutes, only the single-crystal Si layer remained without etching, while the porous Si substrate was selectively etched with the single-crystal Si as a material for etching stopper and completely removed.

The etching rate of the non-porous Si single crystal with the etching solution was extremely low, such as approximately slightly less than 40 angstroms even 65 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the silica glass.

As a result of observation of the section under a transmission-type electron microscope, it was confirmed that no new crystal defect was introduced in the Si layer and that excellent crystallinity was maintained.

EXAMPLES 135 TO 148

The same procedure as in Examples 42 to 55 was effected, replacing the etching solution in Examples 42 to 55 with that in Example 134. In any of the present Examples, consequently, a single-crystal Si layer was formed with extremely less crystal defect on insulating materials.

EXAMPLE 149

A N-type Si layer of 1 $\mu$ was formed on the surface of a P-type (100) Si substrate of a thickness of 200 $\mu$, by ion implantation of proton. The implanted amount of H⁺ was $5 \times 10^{15}$ ions/cm The substrate was anodized in 50% HF solution. The current density then was 100 mA/cm². The porous structure formation rate then was 8.4 $\mu$m/min., and the P-type (100) Si substrate of a thickness of 200 $\mu$ was rendered porous in its entirety for 24 minutes. According to the present anodization as has been described above, only the P-type (100) Si substrate was rendered porous, but no change was observed in the N-type Si layer.

Subsequently, a second Si substrate on the surface of which was formed an oxidized layer of 5000 angstroms was bonded to the surface of the N-type Si layer. By heating in oxygen atmosphere at 800° C. for 0.5 hour, both of the substrates were strongly bonded together.

Then, the bonded substrates were selectively etched with a mixed solution of 49% hydrofluoric acid, alcohol and aqueous 30% hydrogen peroxide solution (10:6:50) without stirring. In 65 minutes, only the single-crystal Si layer remained without etching, while the porous Si substrate was selectively etched with the single-crystal Si as a material for etching stopper, and then completely removed.

The etching rate of the non-porous Si single-crystal with the etching solution was extremely low, such as 50 angstroms or less even 65 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and a single-crystal Si layer of a thickness of 1.0 $\mu$m was formed on the $SiO_2$ layer.

As a result of observation of the section under a transmission-type electron microscope, it was confirmed that no new crystal defect was introduced in the Si layer and that excellent crystallinity was maintained.

EXAMPLES 150 TO 164

The same procedure as in Examples 57 to 71 was effected, replacing the etching solution in Examples 57 to 71 with that in Example 134. In any of the present Examples, consequently, a single-crystal Si layer was formed with extremely less crystal defect on insulating materials.

EXAMPLE 165

A P-type (100) single-crystal Si substrate of a thickness of 200 μ was anodized in 50% HF solution. The current density then was 100 mA/cm$^2$. The porous structure formation rate then was 6.4 μm/min., and the P-type (100) Si substrate of a thickness of 200 μ was rendered porous in its entirety for 24 minutes.

According to MBE (molecular beam epitaxy) method, an Si epitaxial layer of 0.5 μ was grown at a lower temperature on the P-type (100) porous Si substrate. The conditions for deposition are as follows;
temperature: 700° C.
pressure: 1×10$^{-9}$ Torr
growth rate: 0.1 nm/sec.

Subsequently, a substrate of fused silica glass processed with optical polishing was bonded onto the surface of the epitaxial layer, and both of the substrates were strongly bonded together by heating at 800° C. for 0.5 hour in oxygen atmosphere.

According to plasma CVD method, Si$_3$N$_4$ was deposited to 0.1 μm, thereby coating the bonded two substrates. Thereafter, only the nitride membrane on the porous substrate was removed by reactive ion etching. Then, the bonded substrates were selectively etched, under stirring, with buffered hydrofluoric acid. In 258 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 100 angstroms or less even 258 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 μ, rendered porous, was removed, and after the removal of the Si N layer, a single-crystal Si layer of a thickness of 0.5 μm was formed on the substrate of the glass.

As a result of observation of the section under a transmission-type electron microscope, it was confirmed that no new crystal defect was introduced in the Si layer and that excellent crystallinity was maintained.

EXAMPLES 166 TO 180

The same procedure as in Examples 42 to 56 was effected, replacing the etching solution in Examples 42 to 56 with that in Example 165. In any of the present Examples, consequently, a single-crystal Si layer was formed with extremely less crystal defect on insulating materials.

EXAMPLE 181

A P-type (100) single-crystal Si substrate of a thickness of 200 μ was anodized in 50% HF solution. The current density then was 100 mA/cm$^3$. The porous structure formation rate then was about 8.4 μm/min., and the P-type (100) Si substrate of a thickness of 200 μ was rendered porous in its entirety for 24 minutes.

According to MBE (molecular beam epitaxy) method, an Si epitaxial layer of 0.5 μ was grown at a lower temperature on the P-type (100) porous Si substrate. The conditions for deposition are as follows;
temperature: 700° C.
pressure: 1×10$^{-9}$ Torr
growth rate: 0.1 nm/sec.

Subsequently, the surface of the epitaxial layer was thermally oxidized in a depth of 50 nm. A substrate of fused silica glass processed with optical polishing was bonded onto the thermally oxidized membrane, and both of the substrates were strongly bonded together by heating at 800° C. for 0.5 hour in oxygen atmosphere.

According to low pressure CVD method, Si$_3$N$_4$ was deposited to 0.1 μm, thereby coating the bonded two substrates. Thereafter, only the nitride membrane on the porous substrate was removed by reactive ion etching.

Then, the bonded substrates were immersed in buffered hydrofluoric acid, and stirred. In 258 minutes, only the single-crystal Si layer remained without etching, while the porous Si substrates was selectively etched with the single-crystal Si as a material for etching stopper and then completely removed.

The etching rate of the non-porous Si single-crystal with the etching solution was extremely low, such as 100 angstroms or less even 258 minutes later, so that the selective ratio of the etching rate of the porous layer to that of the non-porous Si single-crystal was as large as 10$^5$ or more. The etched amount in the non-porous layer (several tens angstroms) is a practically negligible decrease in membrane thickness. That is, the Si substrate of a thickness of 200 μ, rendered porous, was removed, and after the removal of the Si$_3$N$_4$ layer, a single-crystal Si layer of a thickness of 0.5 μm on the substrate of the silica glass was formed.

As a result of observation of the section under a transmission-type electron microscope, it was confirmed that no new crystal defect was introduced in the Si layer and that excellent crystallinity was maintained.

EXAMPLES 182 TO 195

The same procedure as in Examples 58 to 71 was effected, replacing the etching solution in Examples 58 to 71 with that in Example 165. In any of the present Examples, consequently, a single-crystal Si layer was formed with extremely less crystal defect on insulating materials.

EXAMPLE 196

A P-type (100) single-crystal Si substrate of a thickness of 200 μ was anodized in 50% HF solution. The current density then was 100 mA/cm$^2$. The porous structure formation rate then was 8.4 μm/min., and the P-type (100) Si substrate of a thickness of 200 μ was rendered porous in its entirety for 24 minutes.

According to MBE (molecular beam epitaxy) method, an Si epitaxial layer of 0.5 μ was grown at a lower temperature on the P-type (100) porous Si substrate. The conditions for deposition are as follows;
temperature: 700° C.
pressure: 1×10$^{-9}$ Torr
growth rate: 0.1 nm/sec.

Subsequently, a substrate of fused silica glass processed with optical polishing was bonded onto the surface of the epitaxial layer, and both of the substrates were strongly bonded together by heating at 800° C. for 0.5 hour in oxygen atmosphere.

According to plasma CVD method, Si$_3$N$_4$ was deposited to 0.1 μm, thereby coating the bonded two substrates. Thereafter, only the nitride membrane on the porous substrate was removed by reactive ion etching. Then, the bonded substrates were selectively etched in a mixed solution of buffered hydrofluoric acid and alcohol (10:1) without stirring. In 275 minutes, only the single-crystal Si layer remained without etching, while the porous Si substrate was selectively etched with the single-crystal Si as a material for etching stopper and completely removed.

The etching rate of the non-porous Si single-crystal with the etching solution was extremely low, such as 100 angstroms or less even 275 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the glass.

As a result of observation of the section under a transmission-type electron microscope, it was confirmed that no new crystal defect was introduced in the Si layer and that excellent crystallinity was maintained.

EXAMPLES 197 TO 210

The same procedure as in Examples 42 to 55 was effected, replacing the etching solution in Examples 42 to 55 with that in Example 196. In any of the present Examples, consequently, a single-crystal Si layer was formed with extremely less crystal defect on insulating materials.

EXAMPLE 211

A N-type Si layer of thickness of 1 $\mu$ was formed on the surface of a P-type Si layer of 200 $\mu$ in thickness, by ion implantation of proton. The implanted amount of $H^+$ was $5 \times 10^{15}$ ions/cm².

The substrate was anodized in 50% HF solution. The current density then was 100 mA/cm². The porous structure formation rate then was 8.4 $\mu$m/min., and the N-type (100) Si substrate of a thickness of 200 $\mu$ was rendered porous in its entirety for 24 minutes. According to the present anodization as has been described above, only the P-type (100) Si substrate was rendered porous, but no change was observed in the N-type Si layer.

Subsequently, a second Si substrate on the surface of which was formed an oxidized layer of 5000 angstroms was bonded to the surface of the N-type Si layer. By heating in oxygen atmosphere at 800° C. for 0.5 hour, both of the substrates were strongly bonded together.

Then, the bonded substrates were selectively etched with a mixed solution of buffered hydrofluoric acid (HF:4.46%, $NH_4F$:36.2%) and ethyl alcohol (10:1), without stirring. In 275 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as approximately slightly less than 40 angstroms even 275 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and a single-crystal Si layer of a thickness of 1.0 $\mu$m was formed on the $SiO_2$ layer.

As a result of observation of the section under a transmission-type electron microscope, it was confirmed that no new crystal defect was introduced in the Si layer and that excellent crystallinity was maintained.

EXAMPLES 212 TO 226

The same procedure as in Examples 57 to 71 was effected, replacing the etching solution in Examples 57 to 71 with that in Example 196. In any of the present Examples, consequently, a single-crystal Si layer was formed with extremely less crystal defect on insulating materials.

EXAMPLE 227

A P-type (100) single-crystal Si substrate of a thickness of 200 $\mu$ was anodized in 50% HF solution. The current density then was 100 mA/cm². The porous structure formation rate then was 8.4 $\mu$m/min., and the P-type (100) Si substrate of a thickness of 200 $\mu$ was rendered porous in its entirety for 24 minutes.

According to MBE (molecular beam epitaxy) method, an Si epitaxial layer of 0.5 $\mu$ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

Subsequently, a substrate of fused silica glass processed with optical polishing was bonded onto the surface of the epitaxial layer, and both of the substrates were strongly bonded together by heating at 800° C. for 0.5 hour in oxygen atmosphere.

According to plasma CVD method, $Si_3N_4$ was deposited to 0.1 $\mu$m, thereby coating the bonded two substrates. Thereafter, only the nitride membrane on the porous substrate was removed by reactive ion etching. Then, the bonded substrates were selectively etched in a mixed solution of buffered hydrofluoric acid and aqueous hydrogen peroxide solution (1:5) with stirring. In 190 minutes, only the single-crystal Si layer remained without etching, while the porous Si substrate was selectively etched with the single-crystal Si as a material for etching stopper, and completely removed.

The etching rate of the non-porous Si single-crystal with the etching solution was extremely low, such as 50 angstroms or less even 190 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 $\mu$, rendered porous, was removed, and after the removal of the $Si_3N_4$ layer, a single-crystal Si layer of a thickness of 0.5 $\mu$m was formed on the substrate of the silica glass.

As a result of observation of the section under a transmission-type electron microscope, it was confirmed that no new crystal defect was introduced in the Si layer and that excellent crystallinity was maintained.

EXAMPLES 228 TO 242

The same procedure as in Examples 42 to 56 was effected, replacing the etching solution in Examples 42 to 56 with that in Example 227. In any of the present Examples, consequently, a single-crystal Si layer was formed with extremely less crystal defect on insulating materials.

EXAMPLE 243

A P-type (100) single-crystal Si substrate of a thickness of 200 $\mu$ was anodized in 50% HF solution.

The current density then was 100 mA/cm². The porous structure formation rate then was about 8.4 $\mu$m/min., and the P-type (100) Si substrate of a thickness of 200 $\mu$ was rendered porous in its entirety for 24 minutes.

According to MBE (molecular beam epitaxy) method, an Si epitaxial layer of 0.5 $\mu$ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

subsequently, the surface of the epitaxial layer was thermally oxidized in a depth of 50 nm. A substrate of fused silica glass processed with optical polishing was bonded onto the thermally oxidized membrane, and both of the substrates were strongly bonded together by heating at 800° C. for 0.5 hour in oxygen atmosphere.

According to low pressure CVD method, $Si_3N_4$ as deposited to 0.1 μm, thereby coating the bonded two substrates. Thereafter, only the nitride membrane on the porous substrate was removed by reactive ion etching.

Then, the bonded substrates were immersed in a mixed solution of buffered hydrofluoric acid and aqueous hydrogen peroxide solution (1:5), and stirred. In 190 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as 70 angstroms or less even 190 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and after the removal of the $Si_3N_4$ layer, a single-crystal Si layer of a thickness of 0.5 μm was formed on the substrate of the silica glass.

As a result of observation of the section under a transmission-type electron microscope, it was confirmed that no new crystal defect was introduced in the Si layer and that excellent crystallinity was maintained.

EXAMPLES 244 TO 257

The same procedure as in Examples 58 to 71 was effected, replacing the etching solution in Examples 58 to 71 with that in Example 243. In any of the present Examples, consequently, a single-crystal Si layer was formed with extremely less crystal defect on insulating materials.

EXAMPLE 258

A P-type (100) single-crystal Si substrate of a thickness of 200 μ was anodized in 50% HF solution. The current density then was 100 mA/cm². The porous structure formation rate then was 8.4 μm/min., and the P-type (100) Si substrate of a thickness of 200 μ was rendered porous in its entirety for 24 minutes.

According to MBE (molecular beam epitaxy) method, an Si epitaxial layer of 0.5 μ was grown at a lower temperature on the P-type (100) porous Si substrate. The conditions for deposition are as follows;
temperature: 700° C.
pressure: $1 \times 10^{-9}$ Torr
growth rate: 0.1 nm/sec.

Subsequently, a substrate of fused silica lass processed with optical polishing was bonded onto he surface of the epitaxial layer, and both of the substrates were strongly bonded together by heating at 800° C. for 0.5 hour in oxygen atmosphere.

According to plasma CVD method, $Si_3N_4$ was deposited to 0.1 μm, thereby coating the bonded two substrates. Thereafter, only the nitride membrane on the porous substrate was removed by reactive ion etching. Then, the bonded substrates were selectively etched in a mixed solution of buffered hydrofluoric acid, alcohol and aqueous hydrogen peroxide solution (10:6:50) without stirring. In 205 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as approximately slightly less than 40 angstroms even 205 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and after the removal of the $Si_3N_4$ layer, a single-crystal Si layer of a thickness of 0.5 μm was formed on the substrate of the silica glass.

As a result of observation of the section under a transmission-type electron microscope, it was confirmed that no new crystal defect was introduced in the Si layer and that excellent crystallinity was maintained.

EXAMPLES 259 TO 272

The same procedure as in Examples 42 to 55 was effected, replacing the etching solution in Examples 42 to 55 with that in Example 258. In any of the present Examples, consequently, a single-crystal Si layer was formed with extremely less crystal defect on insulating materials.

EXAMPLE 273

A N-type Si layer of thickness of 1 μ was formed on the surface of a P-type (100) Si substrate of thickness of 200 μ, by ion implantation of proton. The implanted amount of $H^+$ was $5 \times 10^{-15}$ ions/cm².

The substrate was anodized in 50% HF solution. The current density then was 100 mA/cm². The porous structure formation rate then was 8.4 μm/min., and the P-type (100) Si substrate of a thickness of 200 μ was rendered porous in its entirety for 24 minutes. According to the present anodization as has been described above, only the P-type (100) Si substrate was rendered porous, but no change was observed in the N-type Si layer.

Subsequently, a second Si substrate on the surface of which was formed an oxidized layer of 5000 angstroms was bonded to the surface of the N-type Si layer. By heating in oxygen atmosphere at 800° C. for 0.5 hour, both of the substrates were strongly bonded together.

Then, the bonded substrates were selectively etched with a mixed solution of buffered hydrofluoric acid (HF:4.46%, $NH_4F$:36.2%), ethyl alcohol and 30% aqueous hydrogen peroxide solution (10:6:50), without stirring. In 180 minutes, only the single-crystal Si layer remained without etching, while the porous Si substrate was selectively etched with the single-crystal Si as a material for etching stopper and then completely removed.

The etching rate of the non-porous Si single-crystal with the etching solution was extremely low, such as approximately slightly less than 40 angstroms even 180 minutes later, so that the selective ratio of the etching rate of the porous layer to that of the non-porous Si single-crystal was as large as $10^5$ or more. The etched amount in the non-porous layer (several tens angstroms) is a practically negligible decrease in membrane thickness. That is, the Si substrate of a thickness of 200 μ, rendered porous, was removed, and a single-crystal Si layer of a thickness of 1.0 μm was formed on the SiO$_2$ layer.

As a result of observation of the section under a transmission-type electron microscope, it was confirmed that no new crystal defect was introduced in the Si layer and that excellent crystallinity was maintained.

EXAMPLES 274 TO 288

The same procedure as in Examples 57 to 71 was effected, replacing the etching solution in Examples 57 to 71 with that in Example 273. In any of the present Examples, consequently, a single-crystal Si layer was formed with extremely less crystal defect on insulating materials.

What is claimed is:

1. An etching method comprising the steps of:
   providing a substrate having a porous silicon layer and a non-porous silicon layer; and
   selectively etching the porous silicon layer from the substrate with an etching liquid comprising hydrogen fluoride, hydrogen peroxide and alcohol to leave the non-porous silicon layer.

2. The etching method according to claim 1, wherein the etching liquid comprises a solution comprising 1% to 95% of hydrogen peroxide and up to 40% of an alcohol.

3. The etching method according to claim 1, wherein said step of selectively etching the porous silicon layer is carried out at a temperature in the range of 0° C. to 100° C.

4. The etching method according to claim 3, wherein said step of selectively etching the porous silicon layer is carried out at a temperature in the range of 5° C. to 80° C.

5. The etching method according to claim 4, wherein said step of selectively etching the porous silicon layer is carried out at a temperature in the range of 5° C. to 60° C.

6. A method for preparing a semiconductor member comprising the steps of:
   providing a first substrate having a porous monocrystalline silicon layer and a non-porous monocrystalline silicon layer;
   bonding the first substrate to a second substrate with an insulating layer therebetween such that the non-porous monocrystalline silicon layer forms an interior layer of a multi-layer structure; and
   selectively etching and removing the porous monocrystalline silicon layer from the multi-layer structure with an etching liquid comprising hydrogen fluoride, hydrogen peroxide and alcohol, to leave the non-porous silicon layer.

7. A method for preparing a semiconductor member comprising the steps of:
   providing a first substrate having a porous monocrystalline silicon layer and a non-porous monocrystalline silicon layer;
   bonding the first substrate to a second light transmissive substrate such that the non-porous monocrystalline silicon layer forms an interior layer of a multi-layer structure; and
   selectively etching and removing the porous monocrystalline silicon layer from the multi-layer structure with an etching liquid comprising hydrogen fluoride, hydrogen peroxide and alcohol, to leave the non-porous silicon layer.

8. The method according to claim 6 or 7, wherein the etching liquid comprises 1% to 95% of hydrogen peroxide and at most 40% of alcohol.

9. The method according to claim 6 or 7, wherein said step of selectively etching the porous monocrystalline silicon layer is carried out at a temperature in the range of 0° C. to 100° C.

10. The method according to claim 9, wherein said step of selectively etching the porous monocrystalline silicon layer is carried out at a temperature in the range of 5° C. to 80° C.

11. The method according to claim 10, wherein said step of selectively etching the porous monocrystalline silicon layer is carried out at a temperature in the range of 5° C. to 60° C.

12. The method according to claim 6 or 7, wherein said step of providing a first substrate comprises making a silicon substrate porous to form a porous monocrystalline silicon layer and epitaxially growing a non-porous monocrystalline silicon layer on the porous monocrystalline silicon layer.

13. The method according to claim 12, wherein the step of making the silicon substrate porous comprises anodizing the silicon substrate.

14. The method according to claim 12, wherein the step of epitaxially growing the non-porous monocrystalline silicon layer comprises molecular beam epitaxy, plasma chemical vapor deposition, low pressure chemical vapor deposition, atmospheric pressure chemical vapor deposition, liquid phase growth or bias sputtering.

15. The method according to claim 6 or 7, wherein said step of providing a first substrate comprises treating a surface of a silicon substrate to form a porous monocrystalline silicon layer, wherein an untreated portion of said silicon substrate forms the non-porous monocrystalline silicon layer.

16. The method according to claim 14, wherein said step of providing a first substrate comprises irradiating p-type silicon with protons to form a n-type silicon layer and anodizing a portion of said p-type silicon to form said porous layer.

17. The method according to claim 14, wherein said step of providing a first substrate comprises epitaxially growing an intrinsic monocrystalline silicon layer on a p-type silicon substrate and selectively making portions of said p-type silicon substrate porous to form said porous layer.

18. The method according to claim 6, wherein the second substrate comprises silicon.

19. The method according to claim 6, wherein the second substrate and the insulating layer are formed by oxidizing a surface of a silicon substrate.

20. The method according to claim 6, wherein the first substrate and the insulating layer are formed by oxidizing a surface of the non-porous monocrystalline silicon layer of the first substrate.

21. The method according to claim 6, wherein the insulating layer comprises a first insulating layer and a second insulating layer, and wherein the first substrate and the first insulating layer are formed by oxidizing a surface of the non-porous monocrystalline silicon layer of the first substrate, and wherein the second substrate and the second insulating layer are formed by oxidizing a surface of a silicon substrate.

22. The method according to claim 7, wherein the second substrate comprises glass.

23. The method according to claim 7, wherein the second substrate comprises quartz.

24. An etching method comprising the steps of:
   providing a substrate having a porous silicon layer and a non-porous silicon layer; and
   selectively etching the porous silicon layer from the substrate with an etching solution comprising hydrofluoric acid, hydrogen peroxide and alcohol, to leave the non-porous silicon layer.

25. A method for preparing a semiconductor member which comprises the steps of:

providing a first substrate having a porous monocrystalline silicon layer and a non-porous monocrystalline silicon layer;

bonding the first substrate to a second substrate such that the non-porous monocrystalline silicon layer forms an interior layer of a multi-layer structure; and selectively etching and removing the porous monocrystalline silicon layer from the multi-layer structure with an etching solution comprising hydrofluoric acid, hydrogen peroxide and alcohol, to leave the non-porous silicon layer.

* * * * *

UNITED STATES PATENT AND TRADEMARK OFFICE
CERTIFICATE OF CORRECTION

PATENT NO. : 6,254,794 B1
DATED : July 3, 2001
INVENTOR(S) : Kiyofumi Sakaguchi et al.

It is certified that error appears in the above-identified patent and that said Letters Patent is hereby corrected as shown below:

Title page,
Item [56], References Cited, FPD, "WO 91/09420 9/1981 (JP)." should be deleted; "9-120197  11/1991 (JP)." should read -- 19910120197  6/1992 (EP). --; and "WOA9109420" should read -- WO91/09420 --.

Column 4,
Line 7, "Of" should read -- of --.

Column 5,
Line 47, "a" should read -- an --.

Column 8,
Line 60, "hydro hydro" should read -- hydrofluoric --.

Column 9,
Line 4, "i" should read -- in --.

Column 10,
Line 42, "Si" should read -- Si. --.

Column 12,
Line 11, "(10 1)" should read -- (10:1) --.

Column 13,
Line 60, Close up right margin; and
Lines 61-65, Close up left margin.

Column 14,
Line 34, "30 (mA·cm$^{-2}$" should read -- (mA·cm$^{-2}$) --.

Column 16,
Line 56, "30 (mA·cm$^{-2}$" should read -- (mA·cm$^{-2}$) --.

Column 22,
Line 26, "the." should read -- the --.

Column 23,
Line 4, "40 t" should read -- 40% --; and
Line 55, "with." should read -- with --.

UNITED STATES PATENT AND TRADEMARK OFFICE
CERTIFICATE OF CORRECTION

PATENT NO. : 6,254,794 B1
DATED : July 3, 2001
INVENTOR(S) : Kiyofumi Sakaguchi et al.

It is certified that error appears in the above-identified patent and that said Letters Patent is hereby corrected as shown below:

Column 28,
Line 12, "substrate" should read -- substrates --.

Column 29,
Line 31, "49%." should read -- 49% --.

Column 31,
Line 41, "Finally,." should read -- Finally, --.

Column 37,
Line 34, "firmly" should read -- to firmly --; and
Line 57, "Apiexon" should read -- Apiezon --.

Column 38,
Line 53, "$H_{2\ 150}$ liter/min" should read -- $H_2$ 150 liter/min --.

Column 42,
Line 27, "substrates." should read -- substrates --.

Column 43,
Line 62, ".1x10$^{-2}$ Torr" should read -- 1x10$^{-2}$ Torr --.

Column 46,
Line 28, "as follows;" should read -- as follows: --; and
Line 47, "etching." should read -- etching --.

Column 47,
Line 5, "as follows;" should read -- as follows: --.

Column 48,
Line 26, "as follows;" should read -- as follows: --; and
Line 31, "-200 V substrate" should read -- -200 V ¶substrate --.

Column 49,
Line 7, "as follows;" should read -- as follows: --; and
Line 49, "as follows;" should read -- as follows: --.

Column 51,
Line 59, "as follows;" should read -- as follows: --.

UNITED STATES PATENT AND TRADEMARK OFFICE
CERTIFICATE OF CORRECTION

PATENT NO. : 6,254,794 B1
DATED : July 3, 2001
INVENTOR(S) : Kiyofumi Sakaguchi et al.

It is certified that error appears in the above-identified patent and that said Letters Patent is hereby corrected as shown below:

Column 52,
Line 22, "so." should read -- so --;
Line 34, "as follows;" should read -- as follows: --; and
Line 59, "acis" should read -- acid --.

Column 53,
Line 5, "-0.5 $\mu$m" should read -- 0.5 $\mu$m --;
Line 10, "as follows;" should read -- as follows: --; and
Line 50, "as follows;" should read -- as follows: --.

Column 54,
Line 29, "as follows;" should read -- as follows: --.

Column 55,
Line 8, "as follows;" should read -- as follows: --;
Line 47, "a." should read -- a --; and
Line 58, "100 mA/cm$^2$" should read -- 100 mA/cm$^2$. --.

Column 56,
Line 36, "as follows;" should read -- as follows: --.

Column 57,
Line 7, "present." should read -- present --;
Line 13, "N-type." should read -- N-type --;
Line 16, "5x10$^{15}$ ions/cm The" should read -- 5x10$^{15}$ ions/cm$^2$.¶The --;
Line 60, close up right margin; and
Line 61, close up left margin.

Column 58,
Line 2, "as follows;" should read -- as follows: --;
Line 46, "(100.)" should read -- (100) --;
Line 48, "100 mA/cm$^2$" should read -- 100 mA/cm$^2$. --; and
Line 56, "as follows;" should read -- as follows: --;

Column 59,
Line 11, "SO" should read -- 50 --; and
Line 44, "as follows;" should read -- as follows: --.

UNITED STATES PATENT AND TRADEMARK OFFICE
CERTIFICATE OF CORRECTION

PATENT NO.   : 6,254,794 B1
DATED        : July 3, 2001
INVENTOR(S)  : Kiyofumi Sakaguchi et al.

It is certified that error appears in the above-identified patent and that said Letters Patent is hereby corrected as shown below:

Column 60,
Line 26, "5x10$^{15}$ ions/cm The" should read -- 5x10$^{15}$ ions/cm$^2$. ¶The --;
Line 27, "100 mA/cm$^{2.}$" should read -- 100 mA/cm$^2$. --;
Line 50, "T" should read -- The --; and
Line 51, "he" should be deleted.

Column 61,
Line 11, "as follows;" should read -- as follows: --; and
Line 38, "Si N layer," should read -- Si$_3$N$_4$ layer, --.

Column 62,
Line 49, "as follows;" should read -- as follows: --.

Column 64,
Line 15, "as follow;" should read -- as follows: --;
Line 60, close up right margin; and
Line 61, close up left margin.

Column 65,
Line 2, "as follows;" should read -- as follows: --;
Line 57, "as follows;" should read -- as follows: --;
Line 61, "lass" should read -- glass --; and
Line 62, "he" should read -- the --.

Signed and Sealed this

Twenty-third Day of July, 2002

Attest:

JAMES E. ROGAN
Attesting Officer    Director of the United States Patent and Trademark Office